(12) United States Patent
Zhao et al.

(10) Patent No.: US 12,706,044 B2
(45) **Date of Patent: *Aug. 11, 2026**

(54) PIXEL CIRCUIT, DRIVING METHOD AND DISPLAY DEVICE

(71) Applicant: BOE TECHNOLOGY GROUP CO., LTD., Beijing (CN)

(72) Inventors: Xiyu Zhao, Beijing (CN); Libin Liu, Beijing (CN); Yu Feng, Beijing (CN); Li Wang, Beijing (CN); Yao Huang, Beijing (CN); Benlian Wang, Beijing (CN); Weiyun Huang, Beijing (CN); Rui Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/030,630

(22) Filed: Jan. 17, 2025

(65) Prior Publication Data

US 2025/0166567 A1 May 22, 2025

Related U.S. Application Data

(63) Continuation of application No. 17/788,727, filed as application No. PCT/CN2021/109890 on Jul. 30, 2021, now Pat. No. 12,236,866.

(51) Int. Cl.

*G09G 3/3233* (2016.01)
*G09G 3/3225* (2016.01)

(Continued)

(52) U.S. Cl.

CPC ......... *G09G 3/3233* (2013.01); *G09G 3/3225* (2013.01); *G09G 3/3266* (2013.01);

(Continued)

(58) Field of Classification Search

CPC .. G09G 3/3233; G09G 3/3225; G09G 3/3266; G09G 3/3275; G09G 3/3291;

(Continued)

(56) References Cited

U.S. PATENT DOCUMENTS

2020/0394961 A1 12/2020 Kim et al.
2021/0028313 A1* 1/2021 Yamazaki .......... H10D 30/6755

(Continued)

OTHER PUBLICATIONS

Non-Final Office Action for U.S. Appl. No. 18/270,094 dated Jun. 17, 2025. 24 pages.

*Primary Examiner* — Premal R Patel
(74) *Attorney, Agent, or Firm* — BROOKS KUSHMAN P.C.

(57) ABSTRACT

A pixel circuit, a driving method and a display device. The pixel circuit includes a driving circuit, a first initialization circuit and a reset circuit; the first initialization circuit configured to write a first initial voltage into the first end of the driving circuit under the control of an initialization control signal; the reset circuit is configured to write a reset voltage into the second end of the driving circuit or the first end of the driving circuit under the control of a second scan signal; the driving circuit is configured to control to connect the first end of the driving circuit and the second end of the driving circuit under the control of a potential of a control end of the driving circuit.

19 Claims, 50 Drawing Sheets

(51) Int. Cl.

| | |
|---|---|
| ***G09G 3/3266*** | (2016.01) |
| ***G09G 3/3275*** | (2016.01) |
| ***G09G 3/3291*** | (2016.01) |
| ***H10K 59/121*** | (2023.01) |
| *H10K 59/126* | (2023.01) |

(52) U.S. Cl.

CPC ......... *G09G 3/3275* (2013.01); *G09G 3/3291* (2013.01); *H10K 59/1213* (2023.02); *G09G 2300/0426* (2013.01); *G09G 2300/0452* (2013.01); *G09G 2300/0819* (2013.01); *G09G 2300/0842* (2013.01); *G09G 2300/0852* (2013.01); *G09G 2300/0861* (2013.01); *G09G 2310/0251* (2013.01); *G09G 2310/061* (2013.01); *G09G 2310/08* (2013.01); *G09G 2320/0233* (2013.01); *G09G 2320/0247* (2013.01); *G09G 2320/045* (2013.01); *G09G 2330/021* (2013.01); *H10K 59/1216* (2023.02); *H10K 59/126* (2023.02)

(58) Field of Classification Search

CPC ... G09G 2300/0426; G09G 2300/0452; G09G 2300/0819; G09G 2300/0842; G09G 2300/0852; G09G 2300/0861; G09G 2310/0251; G09G 2310/061; G09G 2310/08; G09G 2320/0233; G09G 2320/0247; G09G 2320/045; G09G 2330/021; G09G 3/3208; G09G 2310/0264; H10K 59/1213; H10K 59/1216; H10K 59/126

See application file for complete search history.

(56) References Cited

U.S. PATENT DOCUMENTS

| | | | | |
|---|---|---|---|---|
| 2021/0043138 | A1 | 2/2021 | Lin et al. | |
| 2021/0225282 | A1* | 7/2021 | Cho | G09G 3/3233 |
| 2021/0366397 | A1* | 11/2021 | Na | G09G 3/3291 |
| 2023/0360600 | A1 | 11/2023 | Wang et al. | |

* cited by examiner

PIXEL CIRCUIT, DRIVING METHOD AND DISPLAY DEVICE

CROSS-REFERENCE TO RELATED APPLICATIONS

This application is a continuation of U.S. patent application Ser. No. 17/788,727 filed on Jun. 23, 2022, which is a U.S. National Phase of International Application No. PCT/CN2021/109890 filed on Jul. 30, 2021, which are incorporated herein by reference in their entireties.

TECHNICAL FIELD

The present disclosure relates to the field of display technology, and more particularly to a pixel circuit, a driving method and a display device.

BACKGROUND

When the related display panel is working, the hysteresis of the driving transistor in the driving circuit included in the pixel circuit will cause the characteristic response of the driving transistor to be slow, thereby affecting the display.

SUMMARY

A first aspect of the present disclosure provides a pixel circuit, including: a driving circuit, a first initialization circuit and a reset circuit, wherein the first initialization circuit is respectively electrically connected to an initialization control line, a first end of the driving circuit and a first initial voltage terminal, and is configured to write a first initial voltage provided by the first initial voltage terminal into the first end of the driving circuit under the control of an initialization control signal provided by the initialization control line; the reset circuit is electrically connected to a second scan line and a reset voltage terminal respectively, and the reset circuit is also electrically connected to a second end of the driving circuit or the first end of the driving circuit, and is configured to write a reset voltage provided by the reset voltage terminal into the second end of the driving circuit or the first end of the driving circuit under the control of a second scan signal provided by the second scan line; the driving circuit is configured to control to connect the first end of the driving circuit and the second end of the driving circuit under the control of a potential of a control end of the driving circuit.

Optionally, the first initial voltage is a low potential constant voltage, and a voltage value of the first initial voltage is greater than or equal to −6V and less than or equal to −2V.

Optionally, the reset voltage is a high potential constant voltage, and a voltage value of the reset voltage is greater than or equal to 4V and less than or equal to 10V; or, the reset voltage is a low potential constant voltage, and the voltage value of the reset voltage is greater than or equal to −6V and less than or equal to −2V.

Optionally, the reset voltage is the low potential constant voltage, and an absolute value of a difference between the voltage value of the reset voltage and the voltage value of the first initial voltage is less than a predetermined voltage difference value.

Optionally, the driving circuit comprises a driving transistor, and an absolute value of a voltage value of the reset voltage is greater than 1.5 times of an absolute value of a threshold voltage, the threshold voltage is the threshold voltage of the driving transistor.

Optionally, the first initialization circuit comprises a second transistor; a control electrode of the second transistor is electrically connected to the initialization control line, a first electrode of the second transistor is electrically connected to the first initial voltage terminal, and a second electrode of the second transistor is electrically connected to the first end of the driving circuit.

Optionally, the reset circuit comprises a third transistor; a control electrode of the third transistor is electrically connected to the second scan line, a first electrode of the third transistor is electrically connected to the reset voltage terminal, and a second electrode of the third transistor is electrically connected to the second end of the driving circuit or the first end of the driving circuit.

Optionally, the pixel circuit further includes a compensation control circuit; wherein the compensation control circuit is respectively electrically connected to the first scan line, the control end of the driving circuit and the first end of the driving circuit, and is configured to connect the control end of the driving circuit and the first end of the driving circuit under the control of the first scan signal provided by the first scan line.

Optionally, the compensation control circuit comprises a first transistor; a control electrode of the first transistor is electrically connected to the first scan line, a first electrode of the first transistor is electrically connected to the control end of the driving circuit, and a second electrode of the first transistor is electrically connected to the first end of the driving circuit; the first transistor is an oxide thin film transistor.

Optionally, the pixel circuit further includes a light emitting element, an energy storage circuit, a second initialization circuit, a data writing-in circuit, and a light emitting control circuit, wherein the energy storage circuit is electrically connected to the control end of the driving circuit and configured to store electrical energy; the second initialization circuit is respectively electrically connected to a third scan line, a second initial voltage terminal and a first electrode of the light emitting element, and is configured to write a second initial voltage provided by the second initial voltage terminal into the first electrode of the light emitting element under the control of a third scan signal provided by the third scan line; the data writing-in circuit is electrically connected to a fourth scan line, a data line and the second end of the driving circuit, respectively, and is configured to write a data voltage provided by the data line into the second end of the driving circuit under the control of a fourth scan signal provided by the fourth scan line; the light emitting control circuit is respectively electrically connected to a light emitting control line, the first voltage terminal, the second end of the driving circuit, the first end of the driving circuit and the first electrode of the light emitting element, and is configured to, under the control of a light emitting control signal provided by the light emitting control line, connect the first voltage terminal and the second end of the driving circuit, and connect the first end of the driving circuit and the first electrode of the light emitting element; a second electrode of the light emitting element is electrically connected to the second voltage terminal.

Optionally, the second initial voltage is a low potential constant voltage, and a voltage value of the second initial voltage is greater than or equal to −6V and less than or equal to −2V.

Optionally, the data writing-in circuit includes a fourth transistor; a control electrode of the fourth transistor is electrically connected to a fourth scan line, a first electrode of the fourth transistor is electrically connected to the data line, and a second electrode of the fourth transistor is electrically connected to the second end of the driving circuit; the light emitting control circuit includes a fifth transistor and a sixth transistor; a control electrode of the fifth transistor is electrically connected to the light emitting control line, a first electrode of the fifth transistor is electrically connected to the first voltage terminal, and a second electrode of the fifth transistor is electrically connected to the second end of the driving circuit; a control electrode of the sixth transistor is electrically connected to the light emitting control line, a first electrode of the sixth transistor is electrically connected to the first end of the driving circuit, and a second electrode of the sixth transistor is electrically connected to the first electrode of the light emitting element; the second initialization circuit includes a seventh transistor; a control electrode of the seventh transistor is electrically connected to the third scan line, a first electrode of the seventh transistor is electrically connected to the second initial voltage terminal, and a second electrode of the seventh transistor is electrically connected to the first electrode of the light emitting element; the driving circuit includes a driving transistor; a control electrode of the driving transistor is electrically connected to the control end of the driving circuit, a first electrode of the driving transistor is electrically connected to the first end of the driving circuit, and a second electrode of the driving transistor is electrically connected to the second end of the driving circuit; the energy storage circuit includes a storage capacitor; a first end of the storage capacitor is electrically connected to the control end of the driving circuit, and a second end of the storage capacitor is connected to the first voltage terminal.

A second aspect of the present disclosure provides a driving method, applied to the pixel circuit, wherein a display period includes an initialization phase and a reset phase; the driving method includes: in the initialization phase, writing, by the first initialization circuit, the first initial voltage to the first end of the driving circuit under the control of the initialization control signal; in the reset phase, writing, by the reset circuit, the reset voltage to the second end of the driving circuit or the first end of the driving circuit under the control of the second scan signal.

Optionally, in the reset phase, when the reset circuit writes the reset voltage into the second end of the driving circuit under the control of the second scan signal, the reset voltage is a high potential constant voltage, the first initial voltage is a low potential constant voltage, and the initialization phase and the reset phase are different phases; or, the reset voltage and the first initial voltage are the low potential constant voltage, and the initialization phase and the reset phase are a same phase or different phases.

Optionally, in the reset phase, when the reset circuit writes the reset voltage into the first end of the driving circuit under the control of the second scan signal, the reset phase and the initialization phase are different phases.

Optionally, the pixel circuit further comprises a compensation control circuit, a data writing-in circuit and an energy storage circuit; the display period further comprises a data writing-in phase after the initialization phase and the reset phase; the driving method further includes: in the initialization phase, controlling, by the compensation control circuit, to connect the control end of the driving circuit and the first end of the driving circuit under the control of the first scan signal, so as to write the first initial voltage into the control end of the driving circuit; in the data writing-in phase, writing, by the data writing-in circuit, the data voltage Vdata provided by the data line into the second end of the driving circuit under the control of the fourth scan signal; controlling, by the compensation control circuit, to connect the control end of the driving circuit and the first end of the driving circuit under the control of the first scan signal; at the beginning of the data writing-in phase, controlling, by the driving circuit, to connect the first end of the driving circuit and the second end of the driving circuit under the control of the control end of the driving circuit, to charge the energy storage circuit through the data voltage Vdata, so as to change a potential of the control end of the driving circuit until the potential of the control end of the driving circuit becomes Vdata+Vth, wherein Vth is the threshold voltage of the driving transistor included in the driving circuit.

Optionally, a time interval between the initialization phase and the data writing-in phase is greater than a predetermined time interval.

Optionally, the pixel circuit further comprises a light emitting control circuit, and the display period further comprises a light emitting phase set after the data writing-in phase; the driving method includes: in the light emitting phase, controlling, by the light emitting control circuit, to connect the first voltage terminal and the second end of the driving circuit under the control of the light emitting control signal, and control to connect the first end of the driving circuit and the first electrode of the light emitting element; and driving, by the driving circuit, the light emitting element to emit light.

A third aspect of the present disclosure provides a display device comprising the pixel circuit.

Optionally, the pixel circuit comprises a reset circuit and a second initialization circuit; the display device further comprises a second scan signal generation module and a third scan signal generation module; the reset circuit is electrically connected to the second scan line, and the second initialization circuit is electrically connected to the third scan line; the second scan signal generation module is electrically connected to the second scan line, and configured to provide the second scan signal to the second scan line; the third scan signal generation module is electrically connected to the third scan line and configured to provide the third scan signal to the third scan line.

Optionally, the second scan signal and the third scan signal are a same control signal; the second scan signal generation module and the third scan signal generation module are a same module.

BRIEF DESCRIPTION OF THE DRAWINGS

The accompanying drawings, which are incorporated in and constitute a part of the present disclosure, illustrate embodiments of the present disclosure and explains, together with the description, the principles of the present disclosure. Obviously, the drawings in the following description are only some embodiments of the present disclosure, and for those of ordinary skill in the art, other drawings can also be obtained from these drawings without creative work.

Figure 37A:
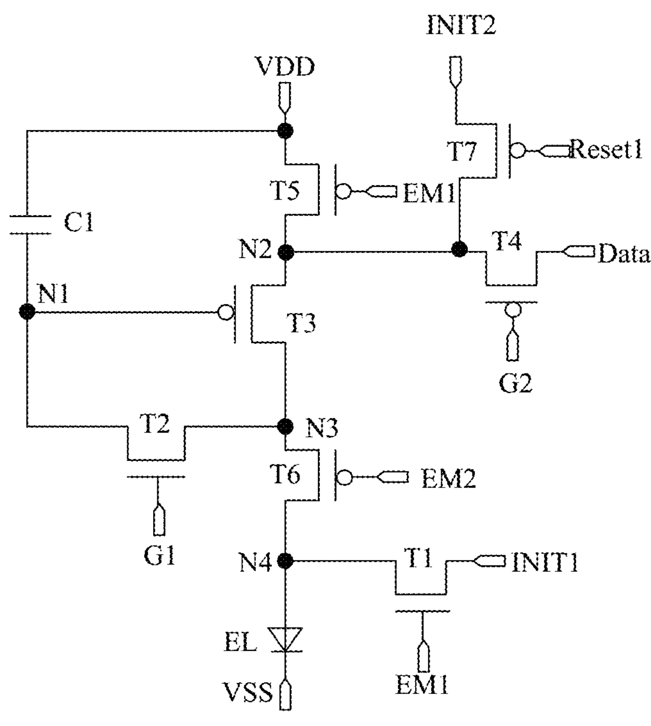
Figure 37B:
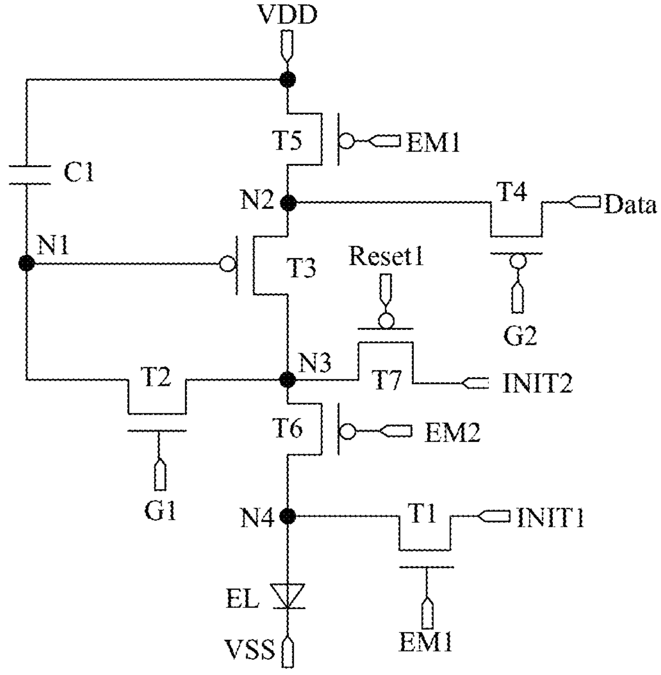
Figure 39:
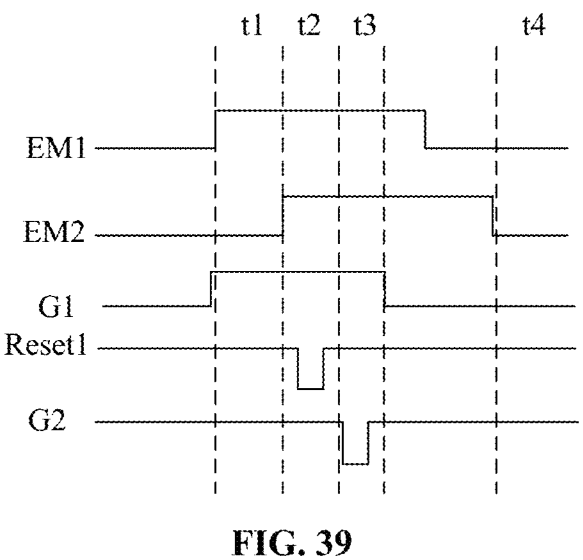
Figure 40:
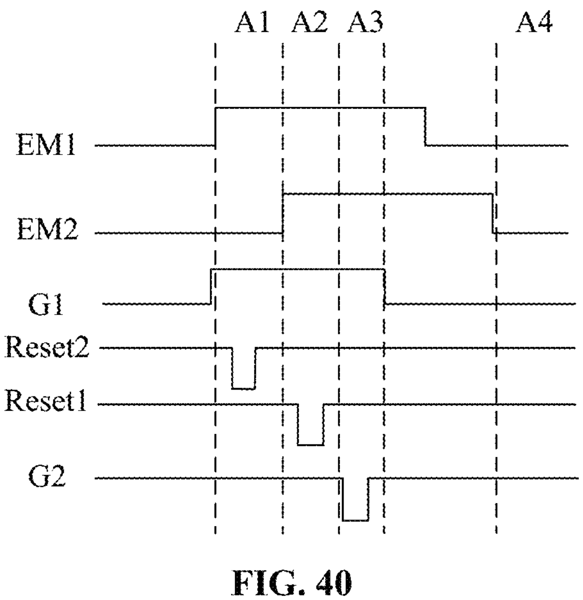
Figure 41:
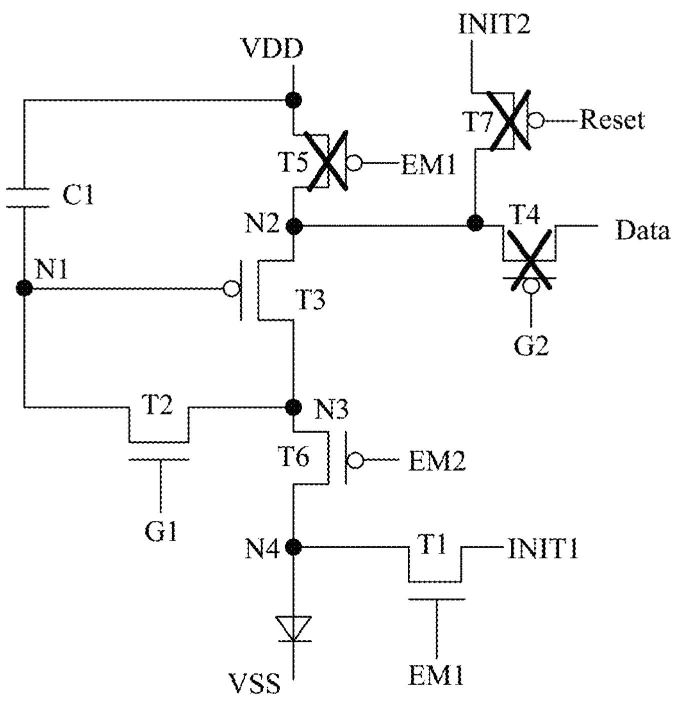
Figure 42:
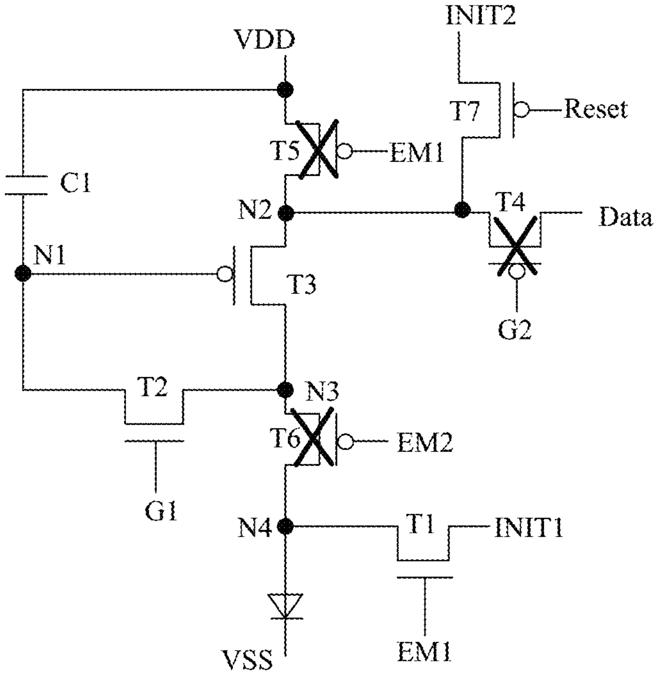
Figure 43:
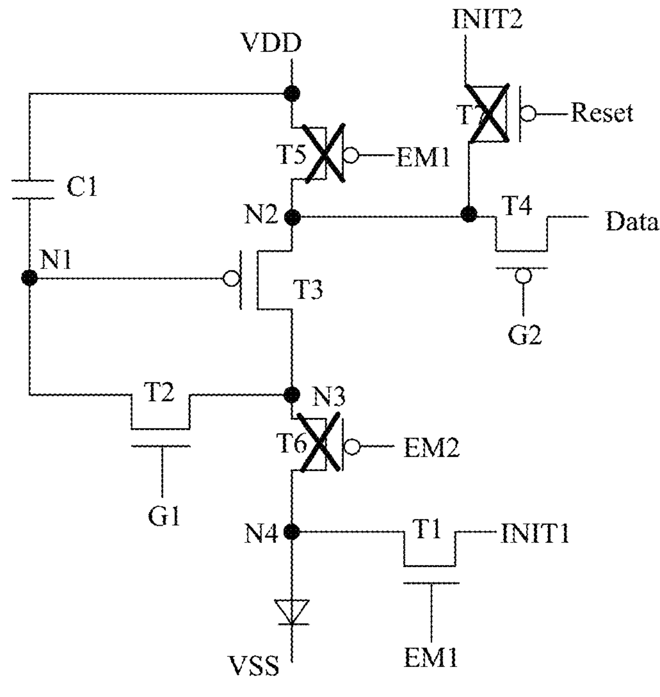
Figure 44:
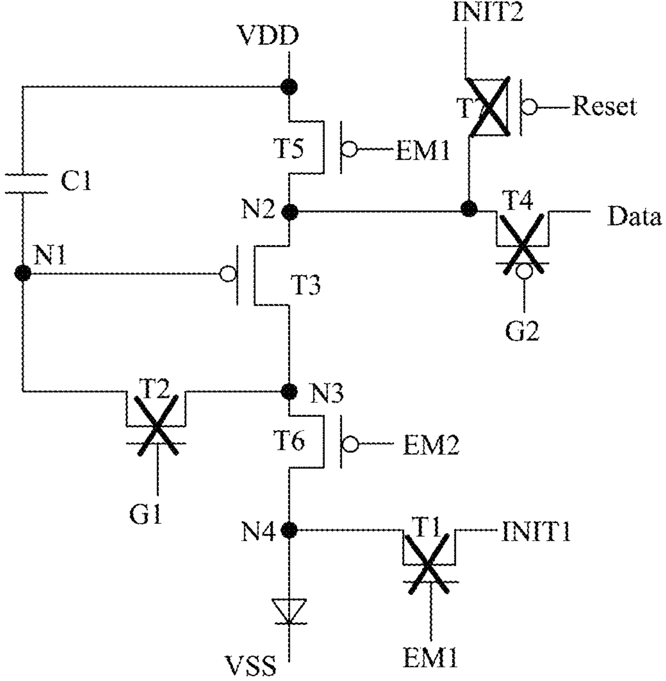
Figure 45:
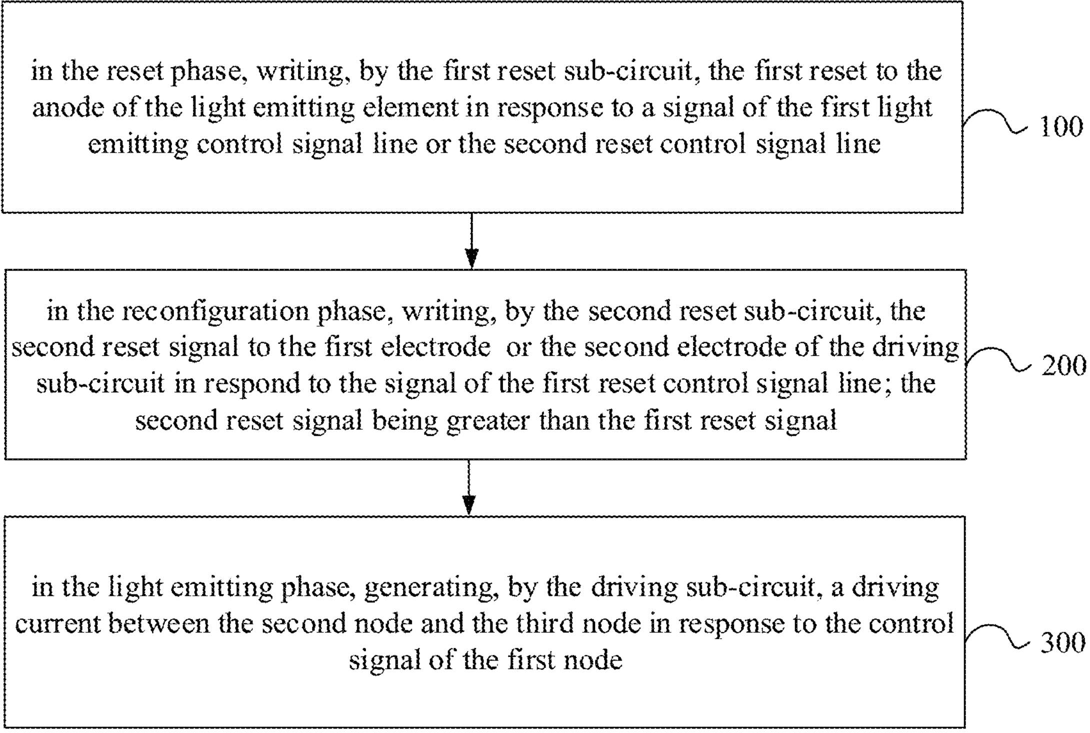
Figure 46:
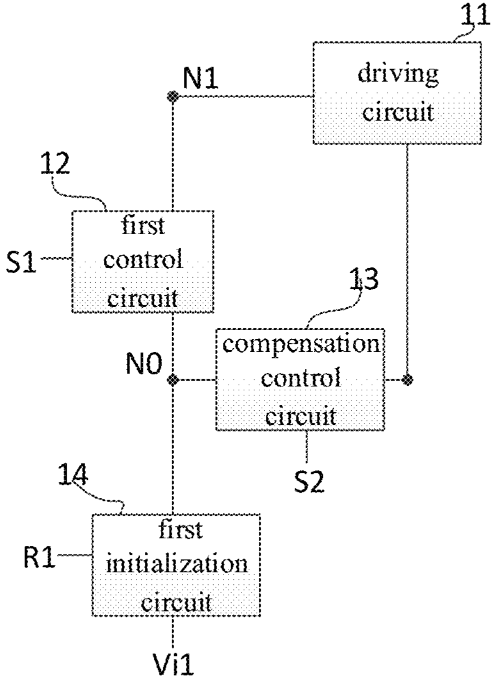
Figure 47:
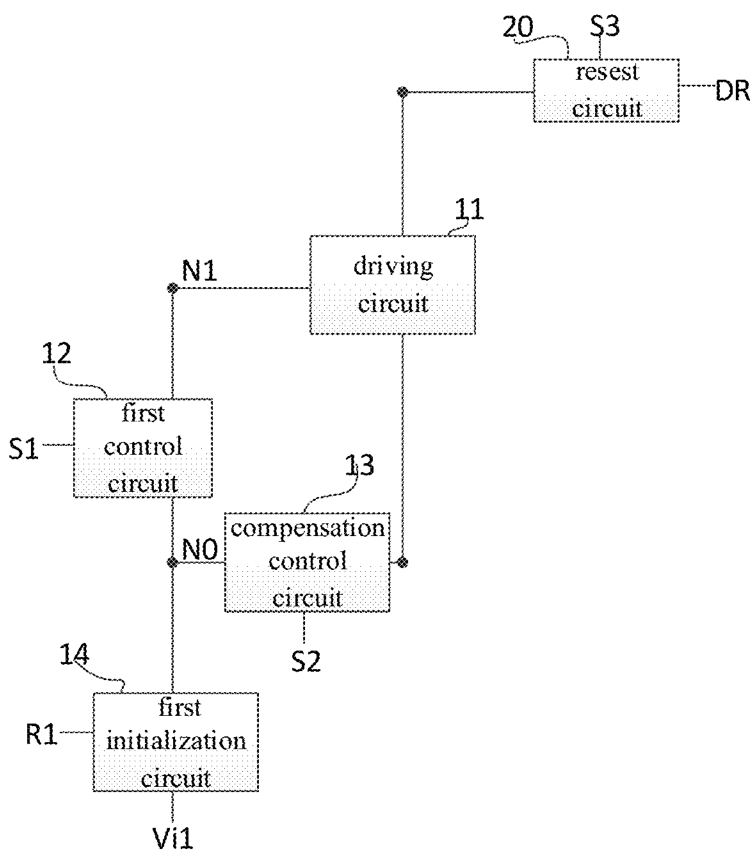
Figure 48:
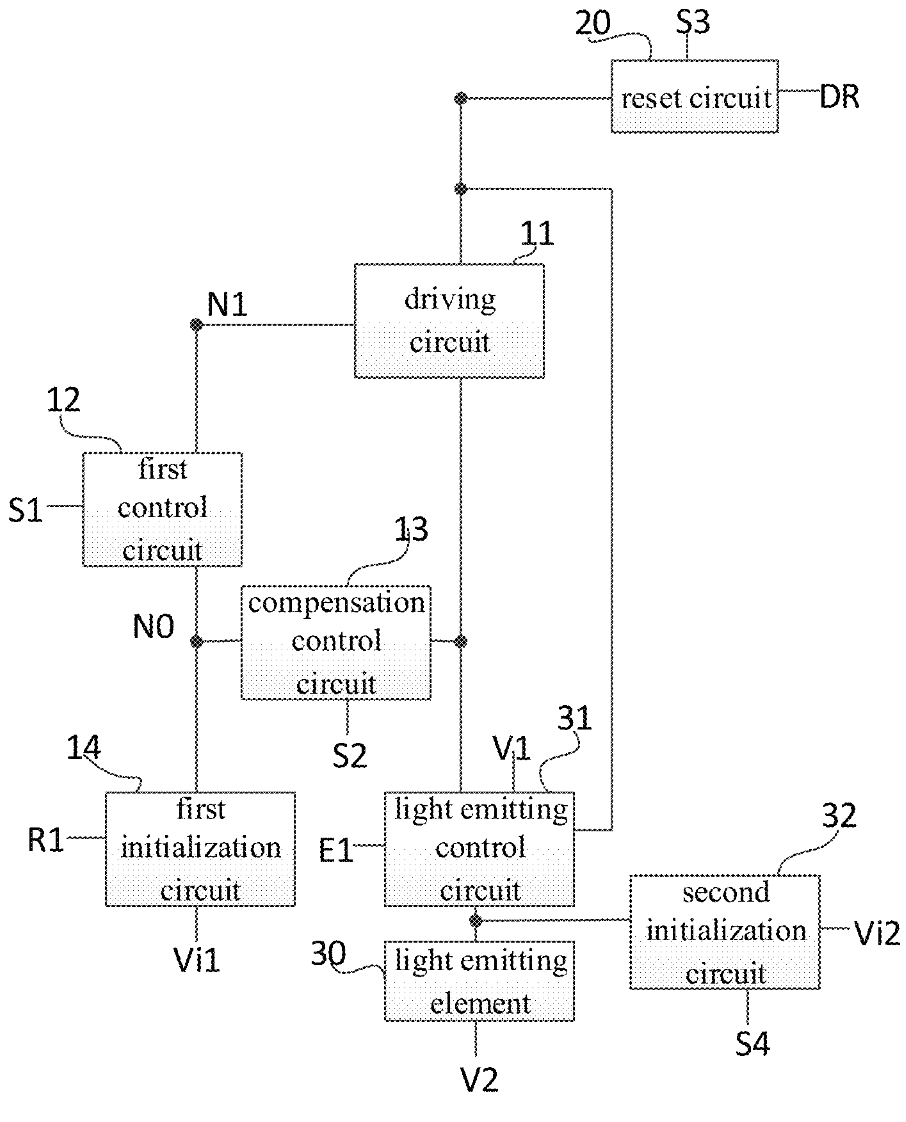
Figure 49:
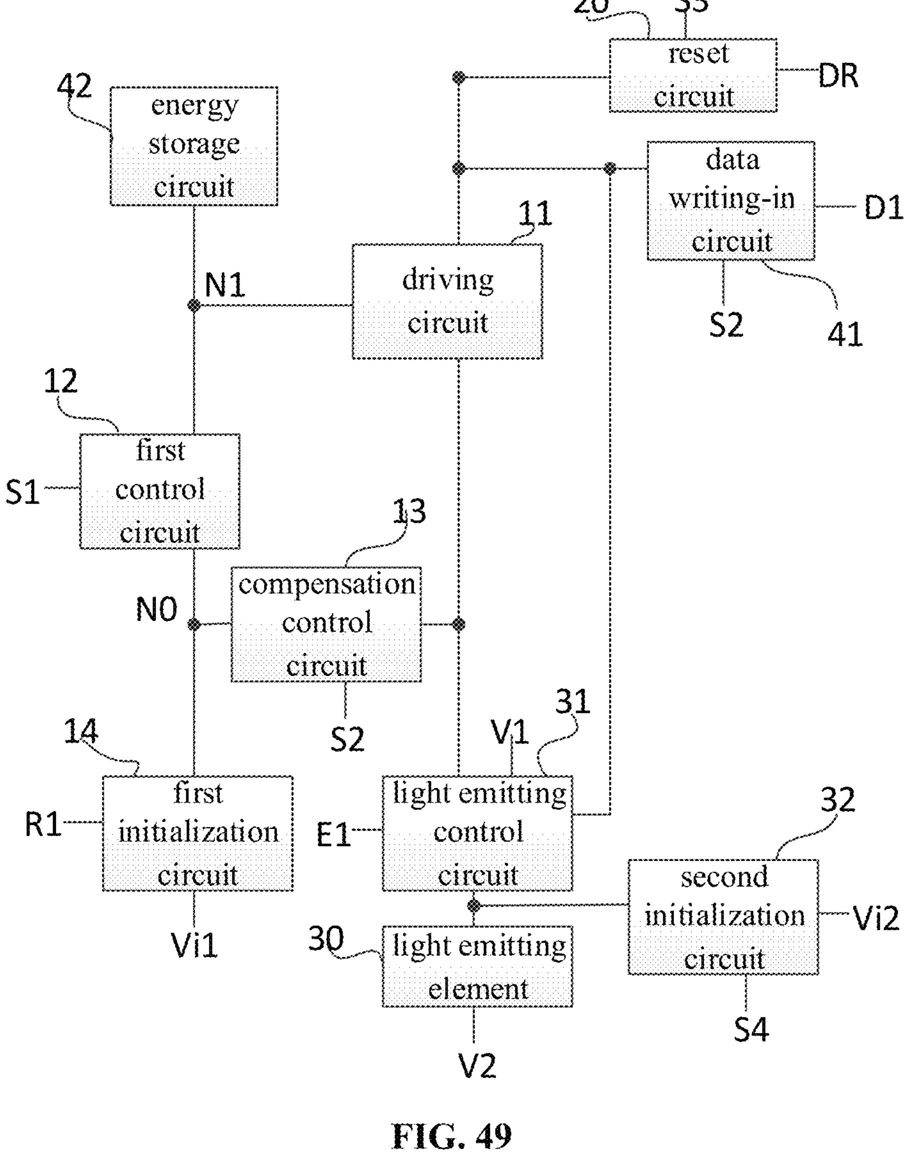
Figure 50:
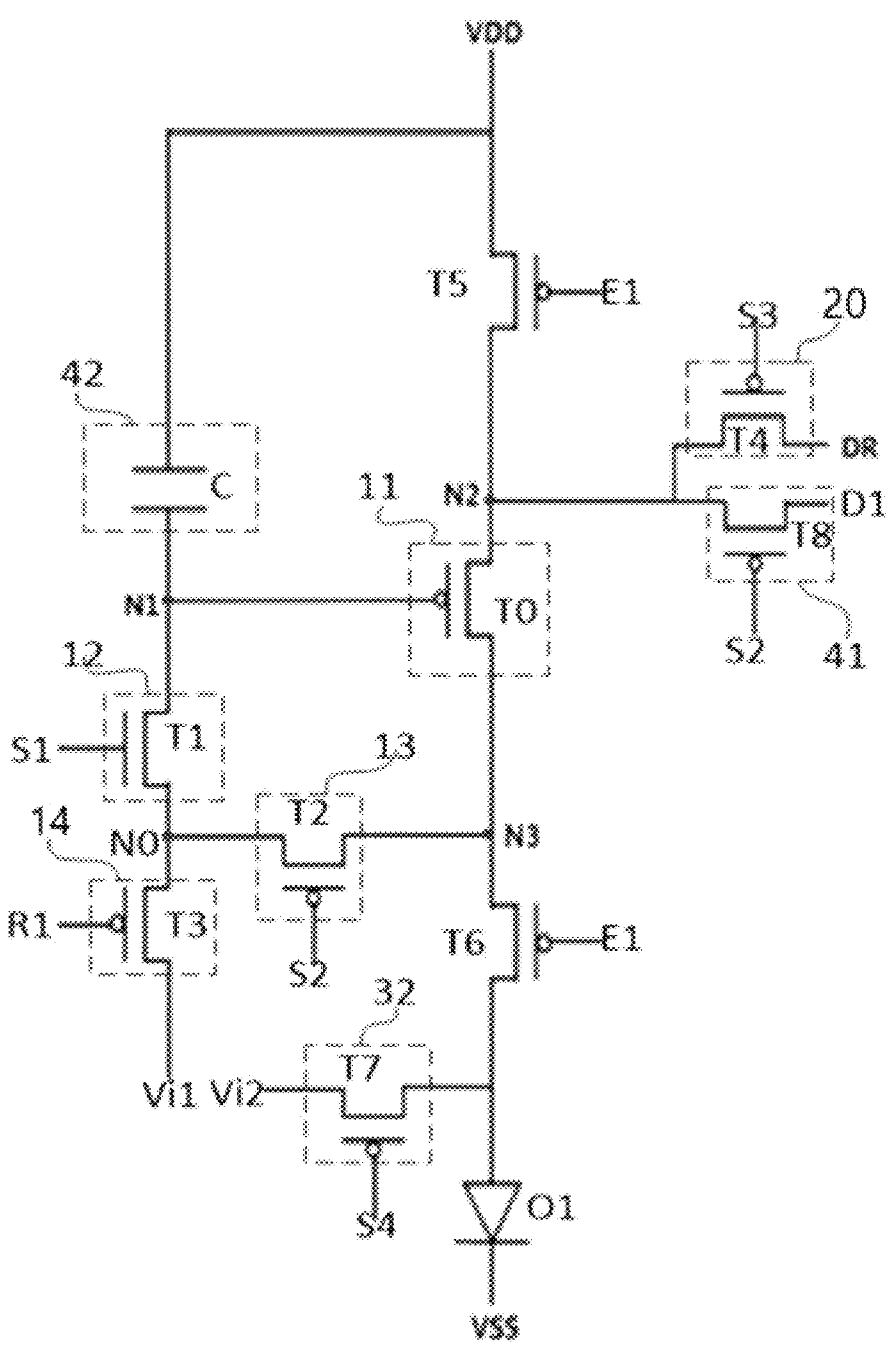
Figure 51:
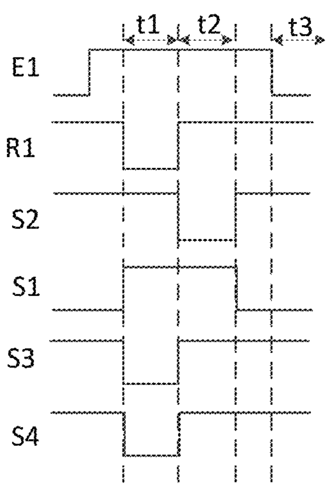
Figure 52:
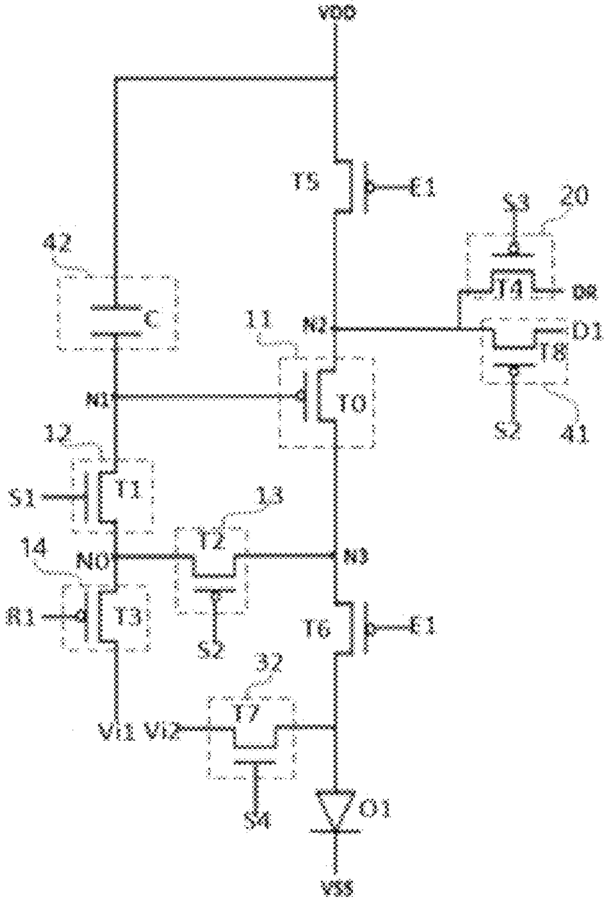
Figure 53:
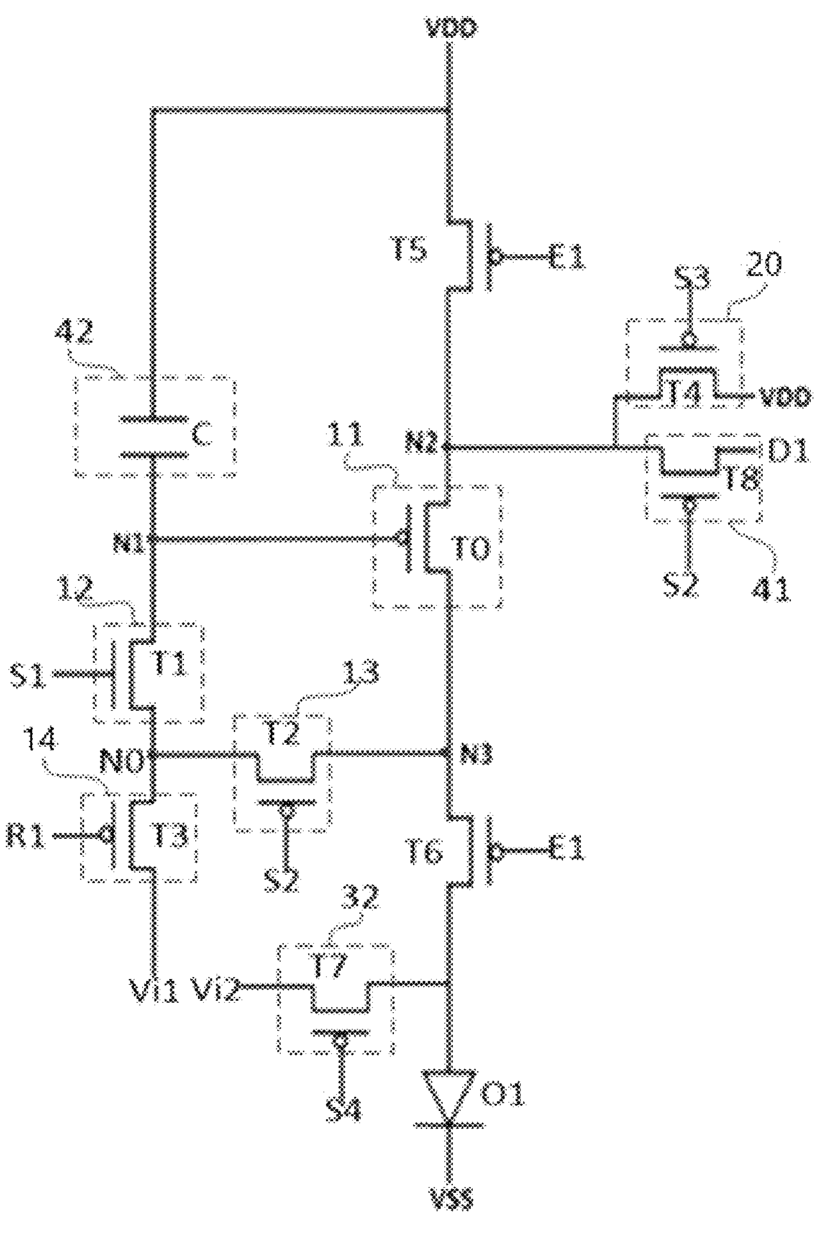
Figure 54:
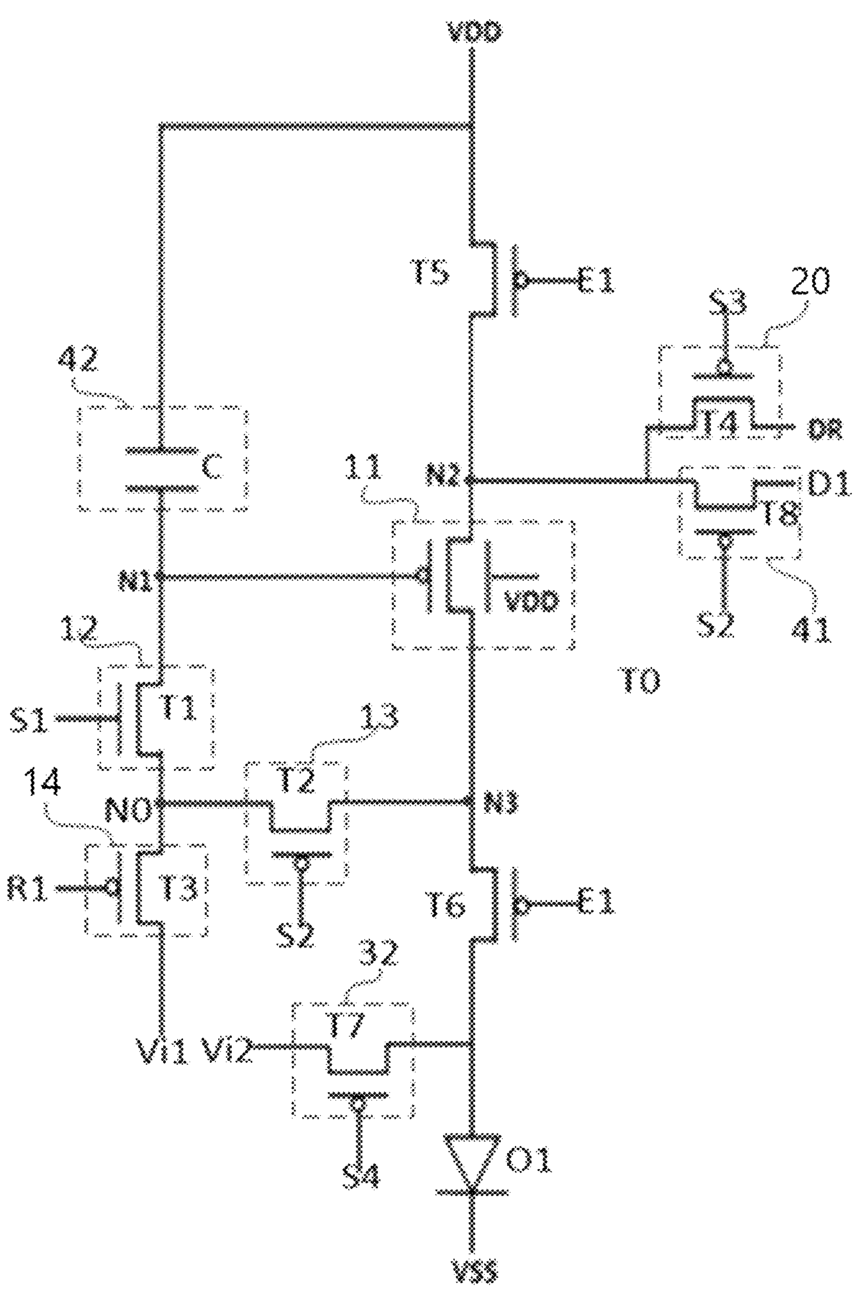
Figure 55:
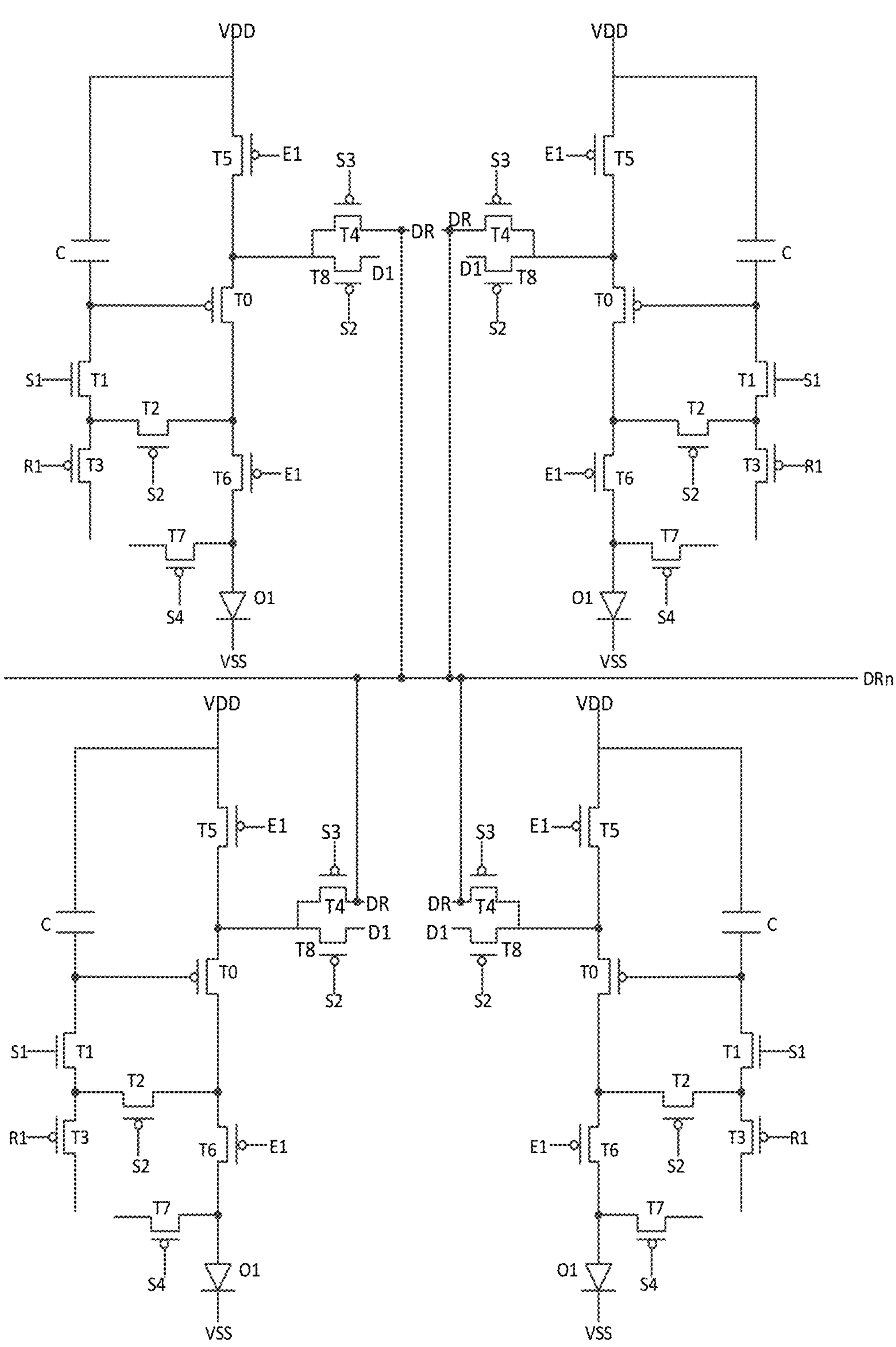
Figure 56:
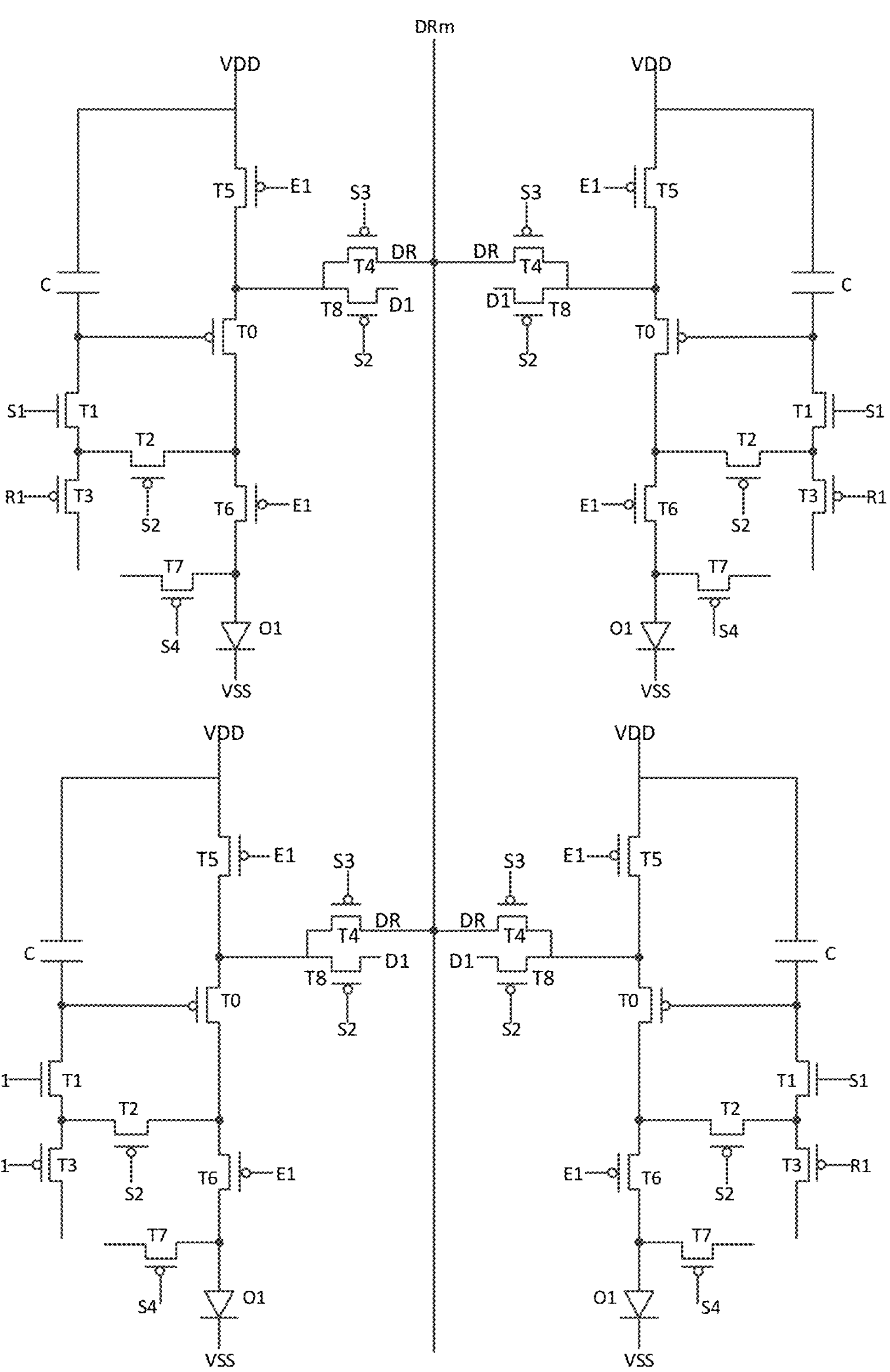
Figure 57:
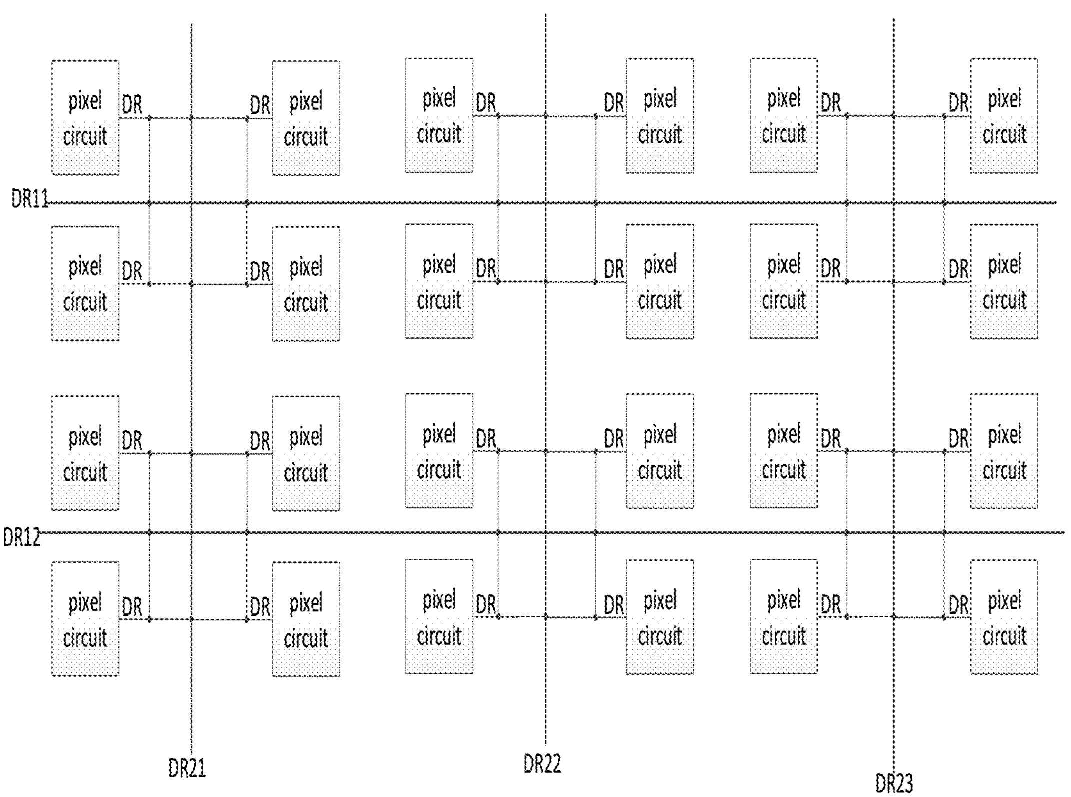
Figure 58:
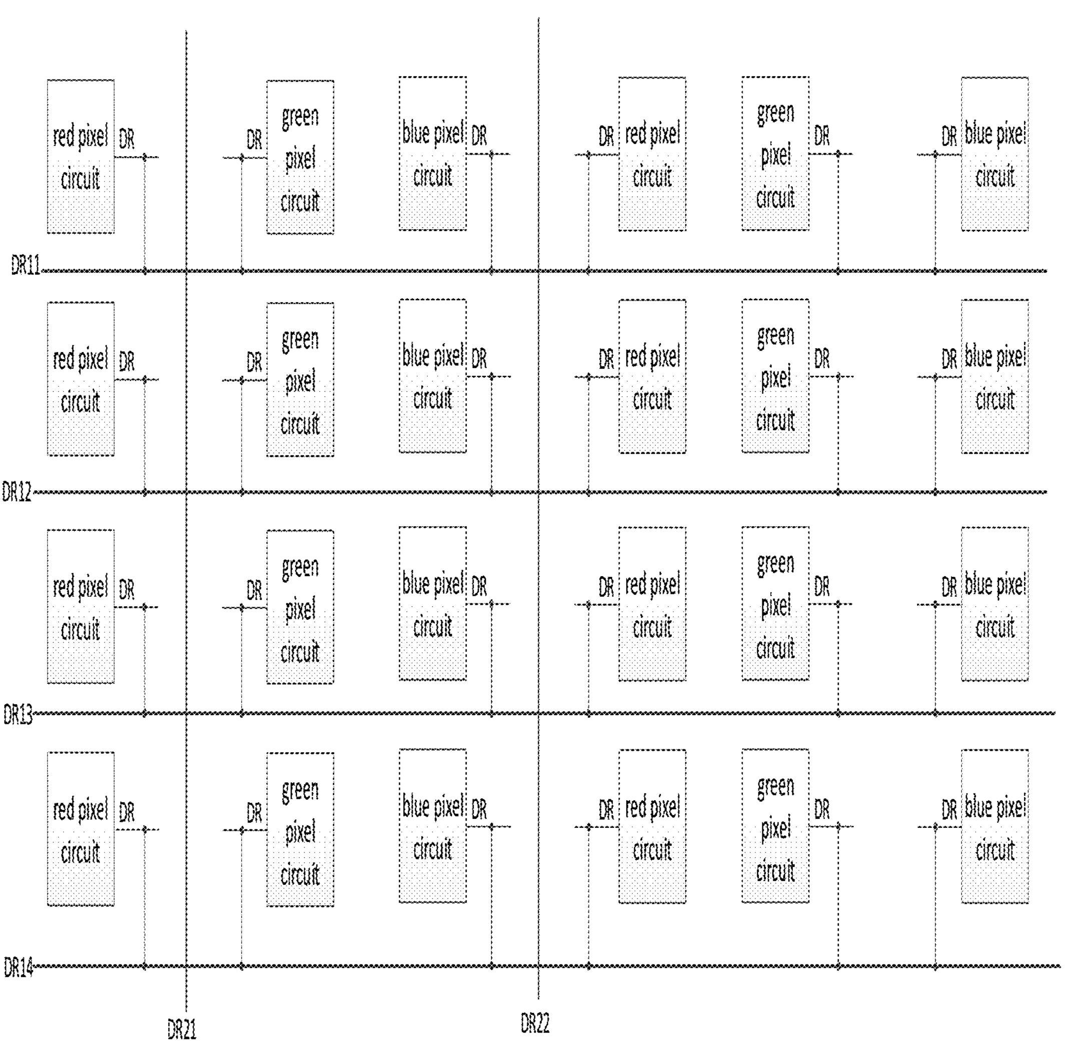
Figure 59:
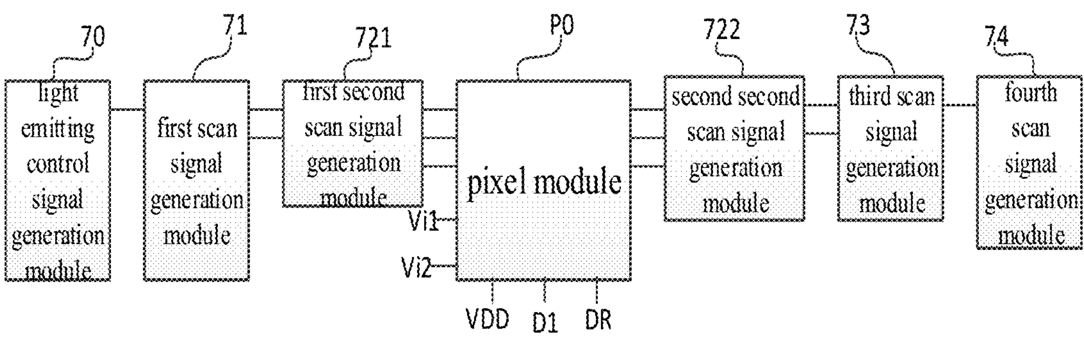
Figure 60:
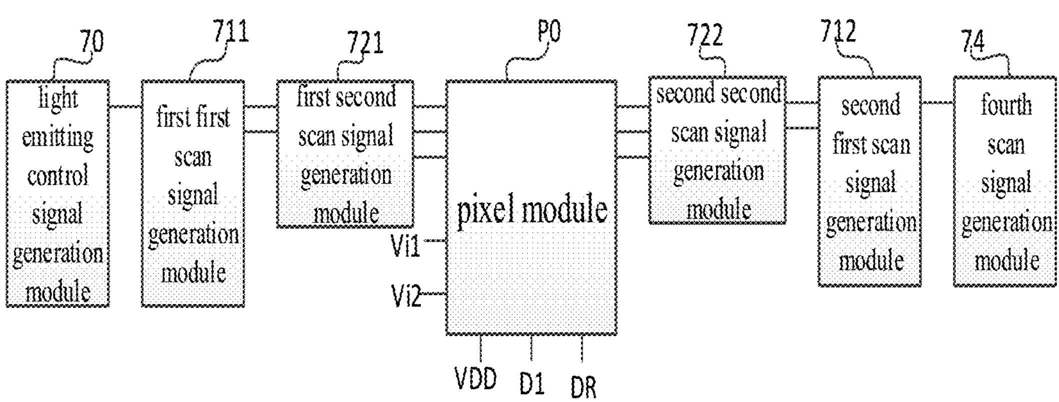
Figure 61:
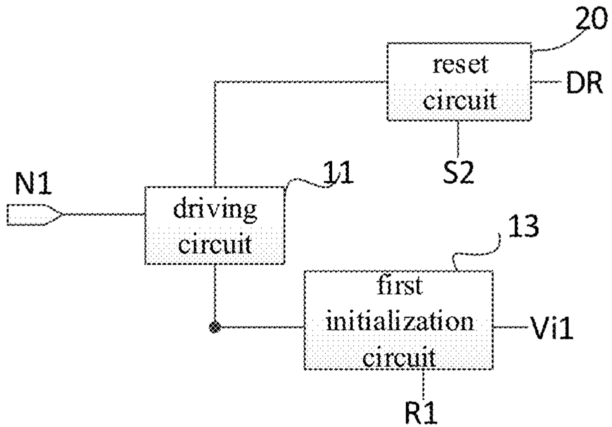
Figure 62:
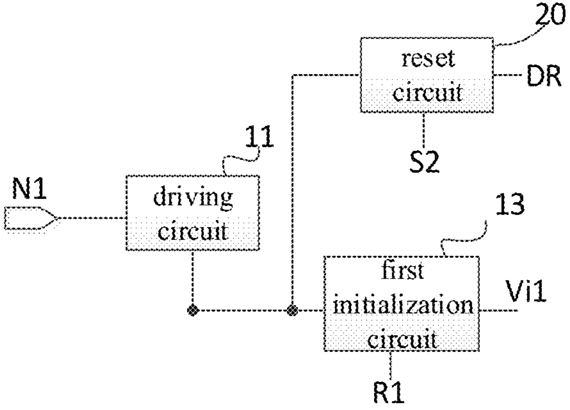
Figure 63:
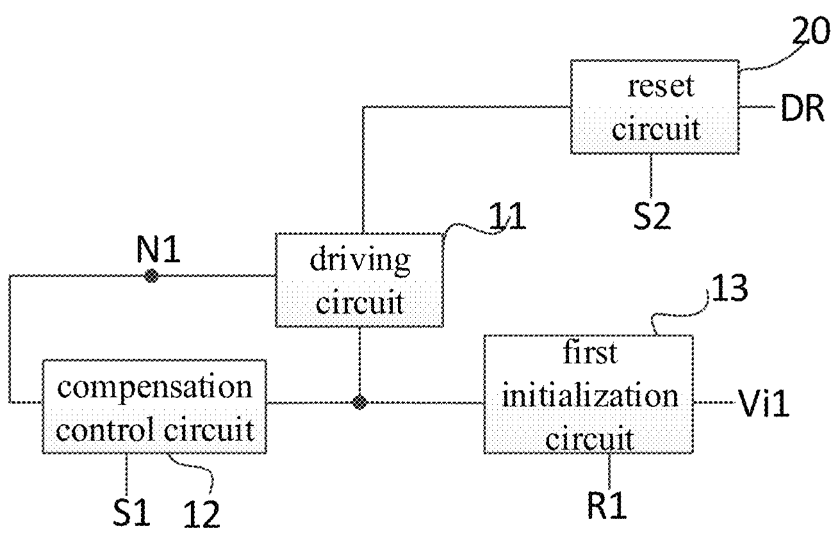
Figure 64:
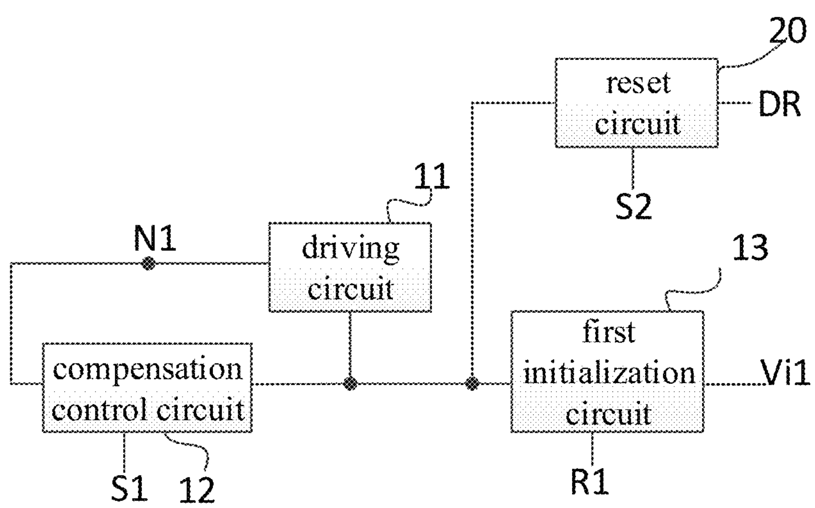
Figure 65:
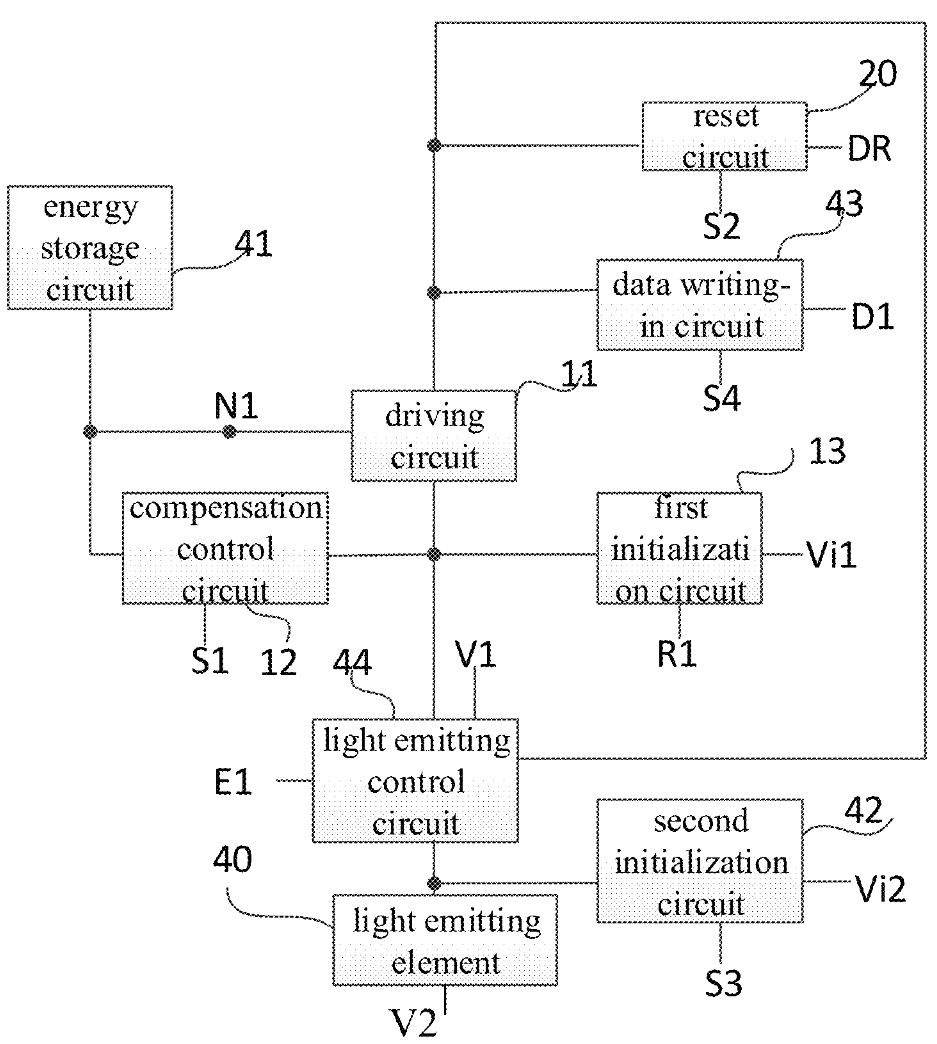
Figure 66:
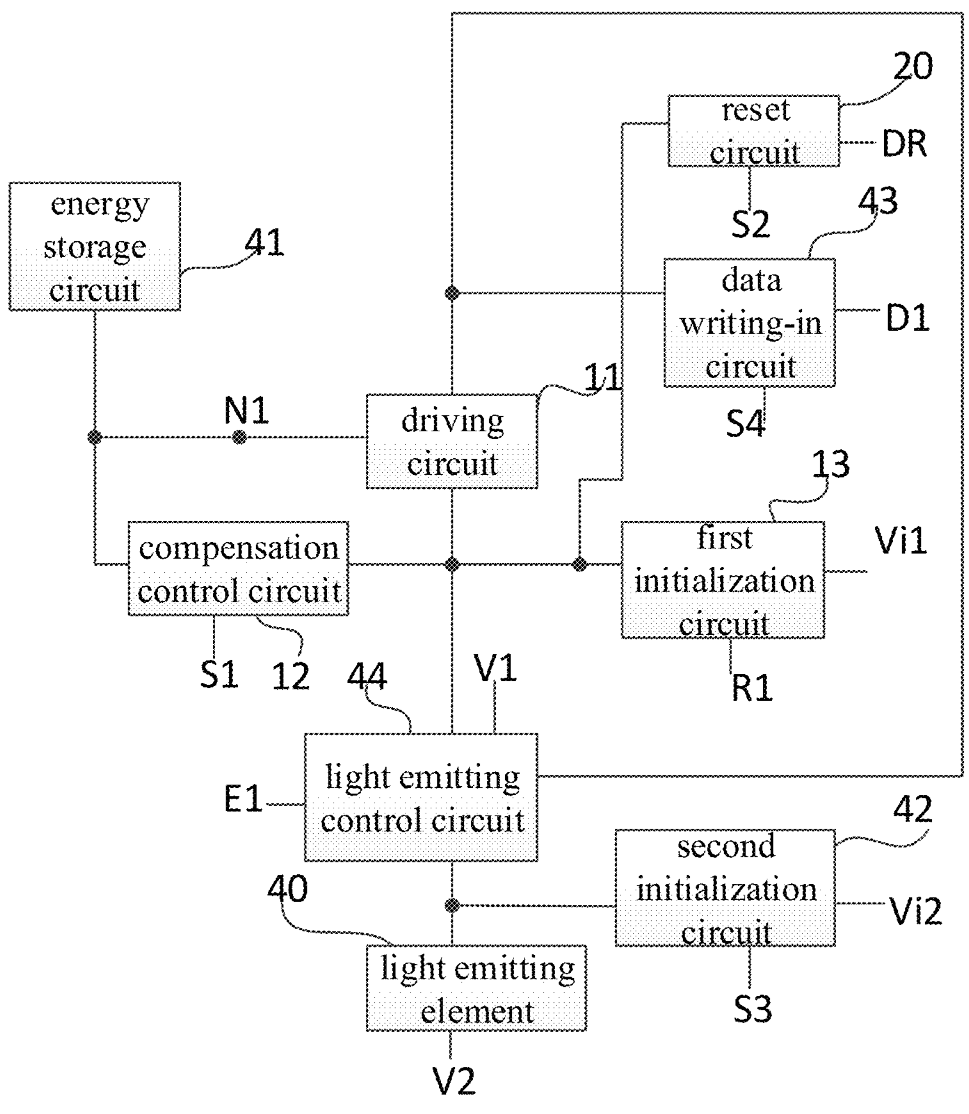
Figure 67:
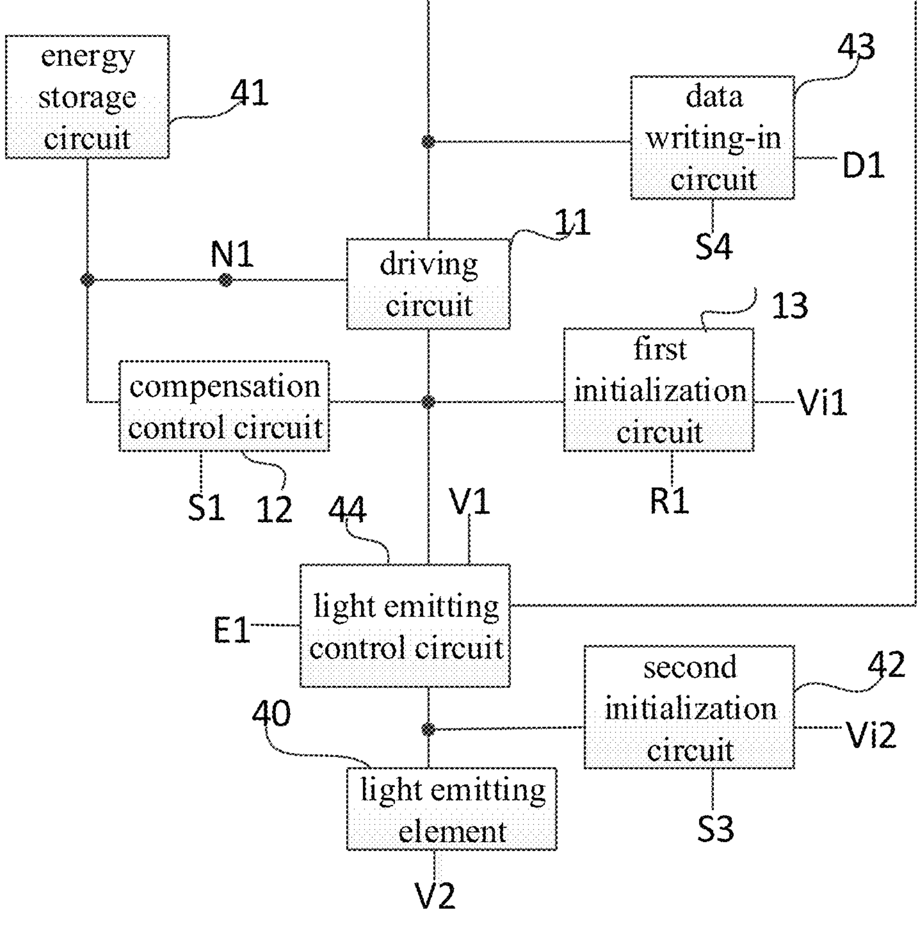
Figure 68:
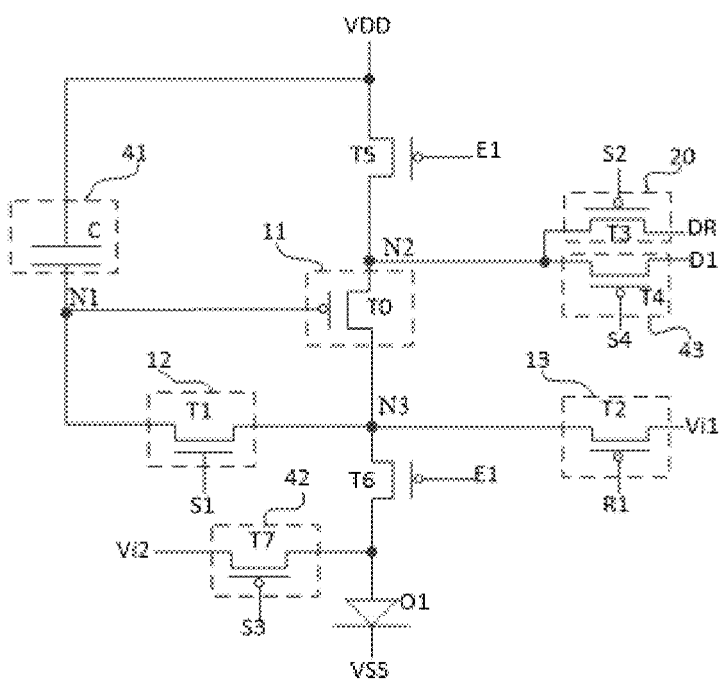
Figure 69:
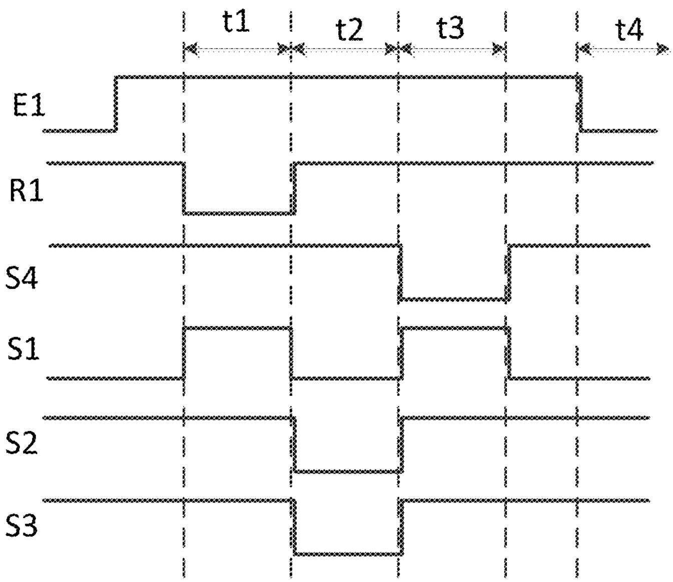
Figure 70:
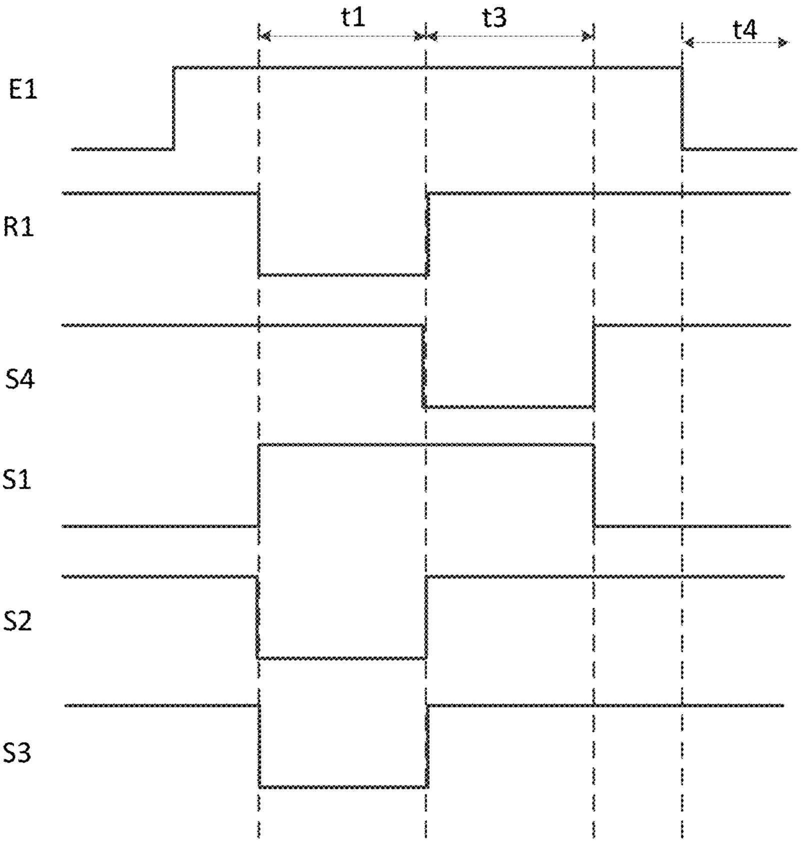
Figure 71:
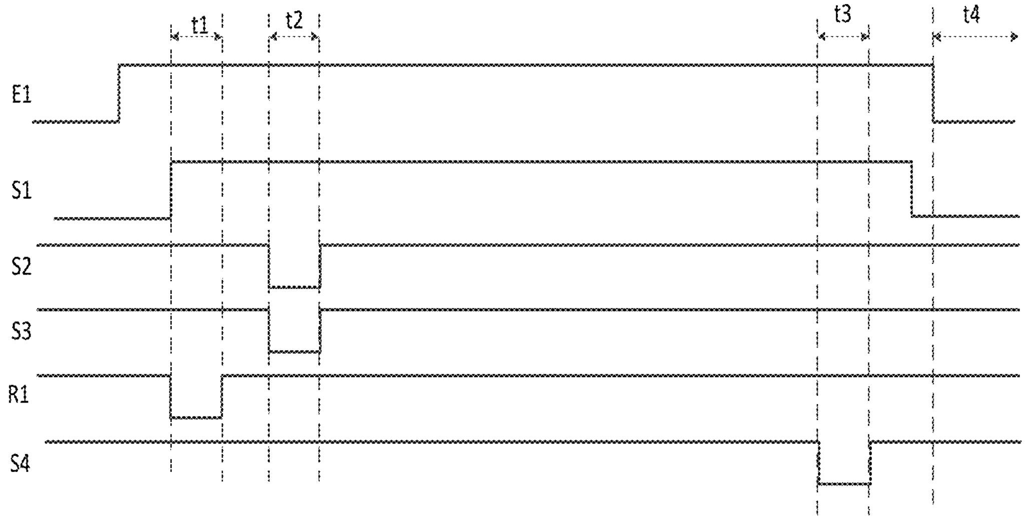
Figure 72:
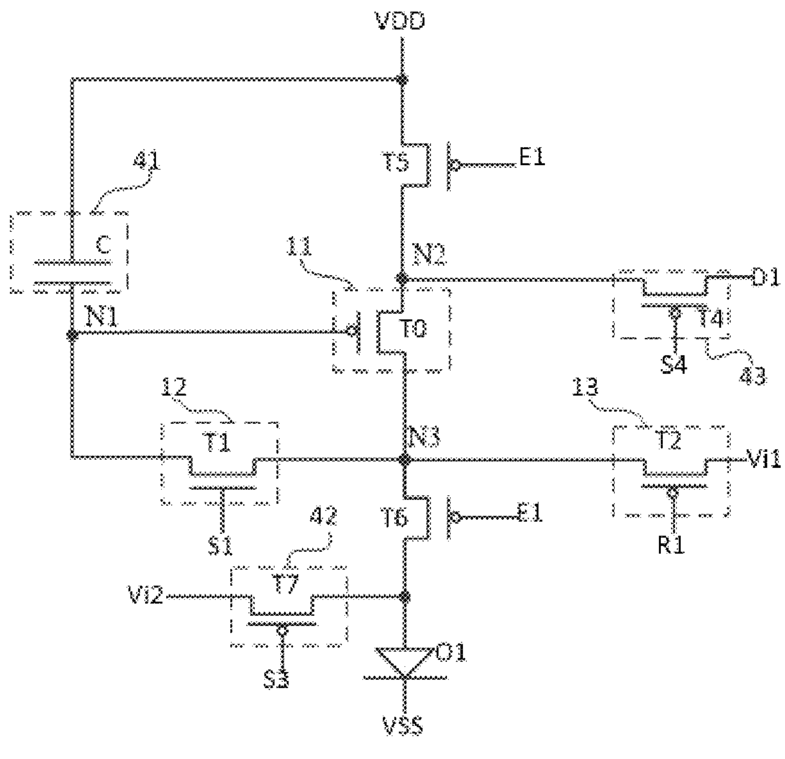
Figure 73:
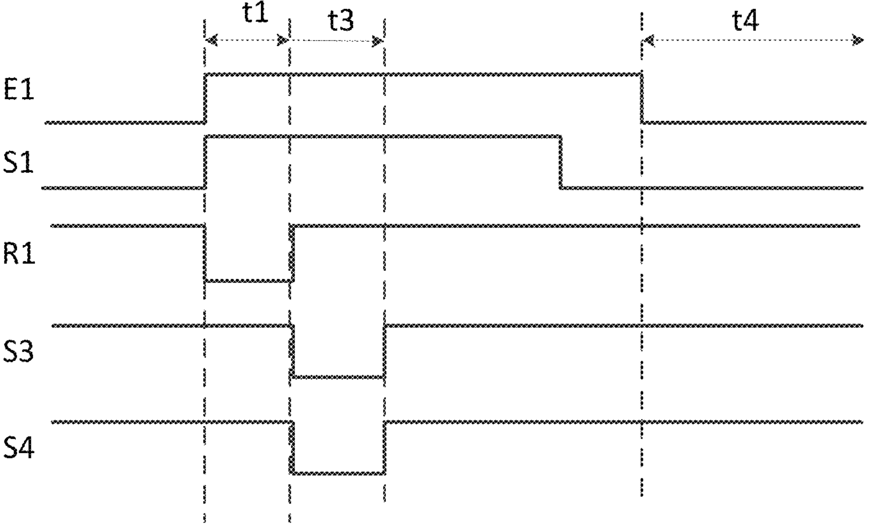
Figure 74:
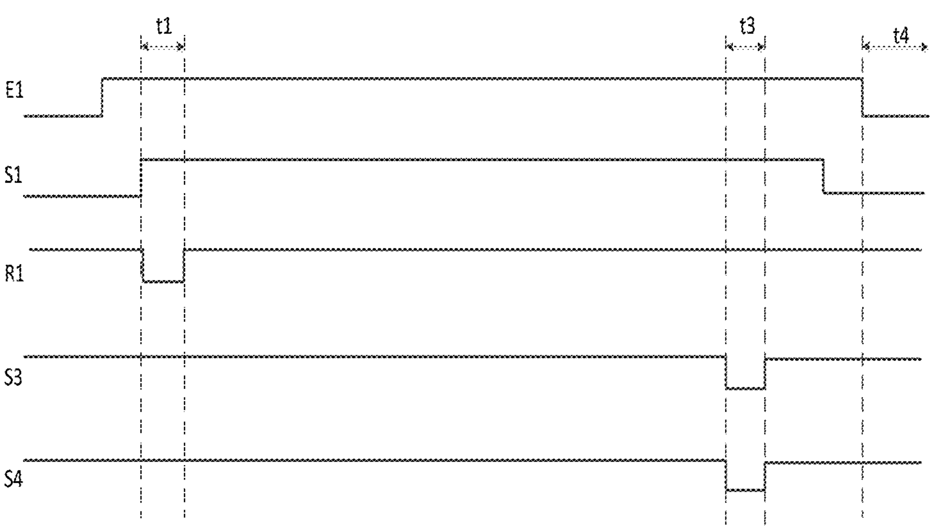
Figure 75:
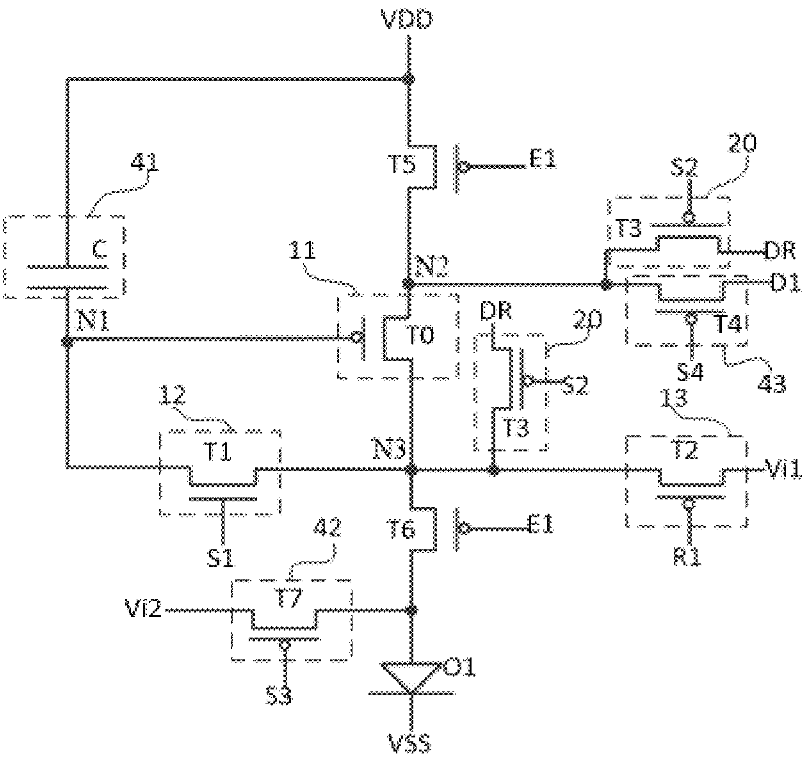
Figure 76:
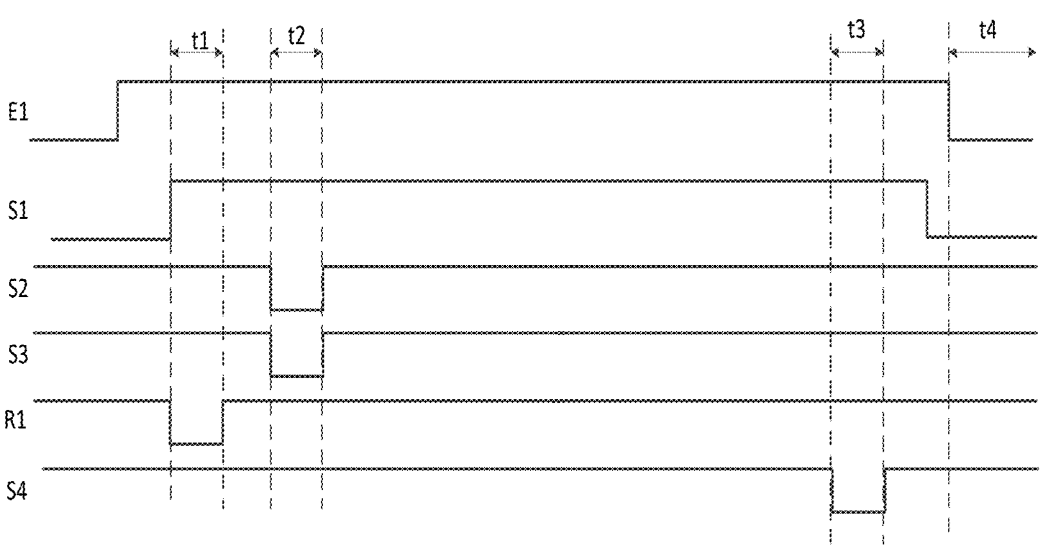
Figure 77:
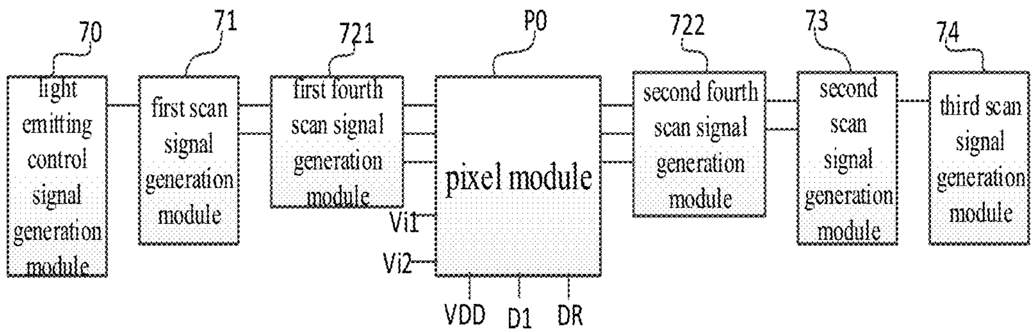
Figure 78:
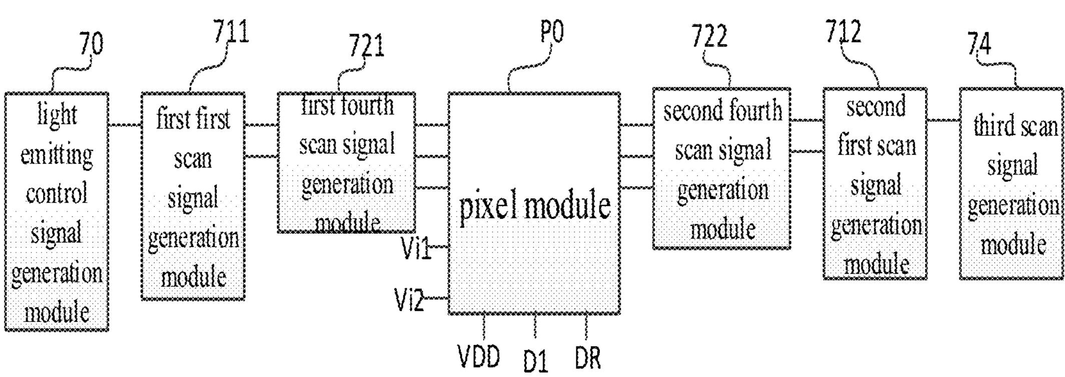

FIG. **37*a*** is the first equivalent circuit diagram of the pixel circuit provided by the embodiment of the present disclosure;

FIG. **37*b*** is the second equivalent circuit diagram of the pixel circuit provided by the embodiment of the present disclosure;

FIG. **38*a*** is the third equivalent circuit diagram of the pixel circuit provided by the embodiment of the present disclosure;

FIG. **38*b*** is the fourth equivalent circuit diagram of the pixel circuit provided by the embodiment of the present disclosure;

FIG. 39 is the working timing diagram of the pixel circuit shown in FIG. **37*a* or FIG. 37*b*** in one scan period;

FIG. 40 is a working timing diagram of the pixel circuit shown in FIG. **38*a* or 38*b*** in one scan period;

FIG. 41 is a schematic diagram of working state of the transistor of the pixel circuit shown in FIG. **37*a*** in the reset phase;

FIG. 42 is a schematic diagram of the working state of the transistor of the pixel circuit shown in FIG. **37*a*** in the reconfiguration phase;

FIG. 43 is a schematic diagram of the working state of the transistor of the pixel circuit shown in FIG. **37*a*** in the data writing-in-in phase;

FIG. 44 is a schematic diagram of the work state of the transistor of the pixel circuit shown in FIG. **37*a*** in the light emitting phase;

FIG. 45 is a schematic flowchart of a method for driving a pixel circuit according to an embodiment of the present disclosure;

FIG. 46 is a structural diagram of a pixel circuit according to at least one embodiment of the present disclosure;

FIG. 47 is a structural diagram of a pixel circuit according to at least one embodiment of the present disclosure;

FIG. 48 is a structural diagram of a pixel circuit according to at least one embodiment of the present disclosure;

FIG. 49 is a structural diagram of a pixel circuit according to at least one embodiment of the present disclosure;

FIG. 50 is a circuit diagram of a pixel circuit according to at least one embodiment of the present disclosure;

FIG. 51 is a working timing diagram of the pixel circuit shown in FIG. 50 according to at least one embodiment of the present disclosure;

FIG. 52 is a circuit diagram of a pixel circuit according to at least one embodiment of the present disclosure;

FIG. 53 is a circuit diagram of a pixel circuit according to at least one embodiment of the present disclosure;

FIG. 54 is a circuit diagram of a pixel circuit according to at least one embodiment of the present disclosure;

FIG. 55 is a schematic diagram of the electrical connection between two adjacent rows of pixel circuits and a reset voltage line in the same row;

FIG. 56 is a schematic diagram of the electrical connection between two adjacent columns of pixel circuits and a reset voltage line in the same column;

FIG. 57 is a schematic diagram of a shared reset voltage line between pixel circuits in adjacent rows and adjacent columns;

FIG. 58 is a schematic diagram of the connection relationship and positional relationship between the reset voltage lines arranged in a grid and a plurality of pixel circuits;

FIG. 59 is a structural diagram of a display device according to at least one embodiment of the present disclosure;

FIG. 60 is a structural diagram of a display device according to at least one embodiment of the present disclosure;

FIG. 61 is a structural diagram of a pixel circuit according to at least one embodiment of the present disclosure;

FIG. 62 is a structural diagram of a pixel circuit according to at least one embodiment of the present disclosure;

FIG. 63 is a structural diagram of a pixel circuit according to at least one embodiment of the present disclosure;

FIG. 64 is a structural diagram of a pixel circuit according to at least one embodiment of the present disclosure;

FIG. 65 is a structural diagram of a pixel circuit according to at least one embodiment of the present disclosure;

FIG. 66 is a structural diagram of a pixel circuit according to at least one embodiment of the present disclosure;

FIG. 67 is a structural diagram of a pixel circuit according to at least one embodiment of the present disclosure;

FIG. 68 is a circuit diagram of a pixel circuit according to at least one embodiment of the present disclosure;

FIG. 69 is a working timing diagram of the pixel circuit shown in FIG. 68;

FIG. 70 is a working timing diagram of the pixel circuit shown in FIG. 68;

FIG. 71 is a working timing diagram of the pixel circuit shown in FIG. 68;

FIG. 72 is a structural diagram of a pixel circuit according to at least one embodiment of the present disclosure;

FIG. 73 is a work timing diagram of the pixel circuit shown in FIG. 72;

FIG. 74 is a work timing diagram of the pixel circuit shown in FIG. 72;

FIG. 75 is a structural diagram of a pixel circuit according to at least one embodiment of the present disclosure;

FIG. 76 is a work timing diagram of the pixel circuit shown in FIG. 75;

FIG. 77 is a structural diagram of a display device according to at least one embodiment of the present disclosure;

FIG. 78 is a structural diagram of a display device according to at least one embodiment of the present disclosure.

DETAILED DESCRIPTION

Example embodiments will now be described more fully with reference to the accompanying drawings. However, embodiments can be implemented in various forms and should not be construed as limited to the examples set forth herein; these embodiments are provided so that the present disclosure will be thorough and complete, and will fully convey the concept of embodiments to those skilled in the art. The same reference numerals in the drawings denote the same or similar structures, and thus their detailed descriptions will be omitted.

The terms "a", "an", "the" are used to indicate the presence of one or more elements/components; the terms "including" and "having" are used to indicate non-exclusively including and refer to additional elements/components may be present in addition to the listed elements/components.

Figure 1:
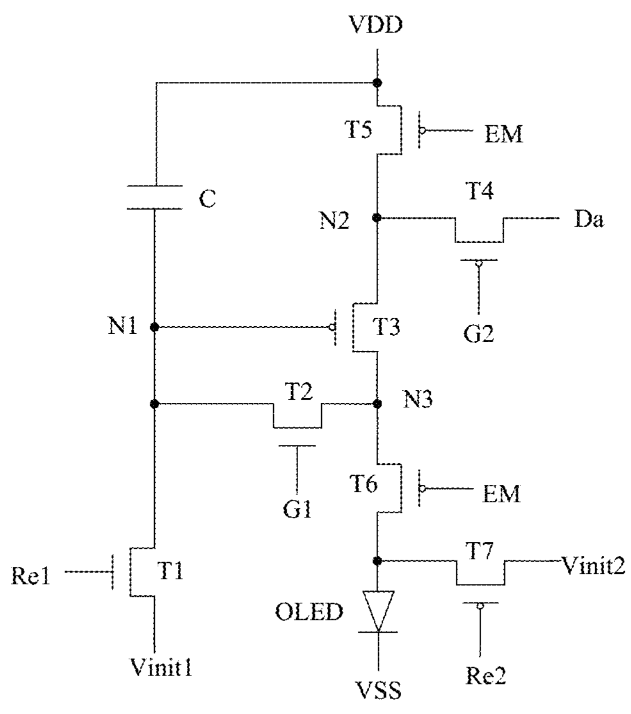
FIG. 1 is a schematic diagram of a circuit structure of a pixel driving circuit in the related art.

As shown in FIG. 1, it is a schematic diagram of a circuit structure of a pixel driving circuit in the related art. The pixel driving circuit may include: a driving transistor T3, a first transistor T1, a second transistor T2, a fourth transistor T4, a fifth transistor T5, a sixth transistor T6, a seventh transistor T7, and a capacitor C. A gate electrode of the driving transistor T3 is connected to a first node N1, a first electrode is connected to a second node N2, and a second electrode is connected to a third node N3; a first electrode of the fourth transistor T4 is connected to the data signal terminal Da, and a second electrode is connected to the second node N2, the gate electrode is connected to the gate driving signal terminal G2; a first electrode of the fifth transistor T5 is connected to the first power supply terminal VDD, a second electrode is connected to the second node N2, and the gate electrode is connected to the enable signal terminal EM; a first electrode of the second transistor T2 is connected to the first node N1, a second electrode is connected to the third node N3, and a gate electrode is connected to the gate driving signal terminal G1; a first electrode of the sixth transistor T6 is connected to the third node N3, and a second electrode is connected to the first electrode of the seventh transistor T7, a gate electrode is connected to the enable signal terminal EM, a second electrode of the seventh transistor T7 is connected to the second initial signal terminal Vinit2, and a gate electrode is connected to the second reset signal terminal Re2; a first electrode of the first transistor T1 is connected to the first node N1, a second electrode is connected to the first initial signal terminal Vinit1, the gate electrode is connected to the first reset signal terminal Re1, and the capacitor C is connected between the first power terminal VDD and the first node N1. The pixel driving circuit may be connected to a light emitting unit OLED for driving the light emitting unit OLED to emit light, and the light emitting unit OLED may be connected between the second electrode of the sixth transistor T6 and the power supply terminal VSS. Wherein, the first transistor T1 and the second transistor T2 may be N-type transistors, for example, the first transistor T1 and the second transistor T2 may be N-type metal oxide transistors, and the N-type metal oxide transistors have smaller leakage current, Therefore, it can avoid the node N from leaking electricity through the first transistor T1 and the second transistor T2 in the light emitting phase. Meanwhile, the driving transistor T3, the fourth transistor T4, the fifth transistor T5, the sixth transistor T6, and the seventh transistor T7 may be P-type transistors, for example, the driving transistor T3, the fourth transistor T4, the fifth transistor T5, the sixth transistor T6 and the seventh transistor T7 can be P-type low-temperature polycrystalline silicon transistors, and low-temperature polycrystalline silicon transistors have higher carrier mobility, which is beneficial to achieve high resolution, high response speed, high pixel density, and high aperture ratio display panel. The first initial signal terminal and the second initial signal terminal may output the same or different voltage signals according to actual conditions.

Figure 2:
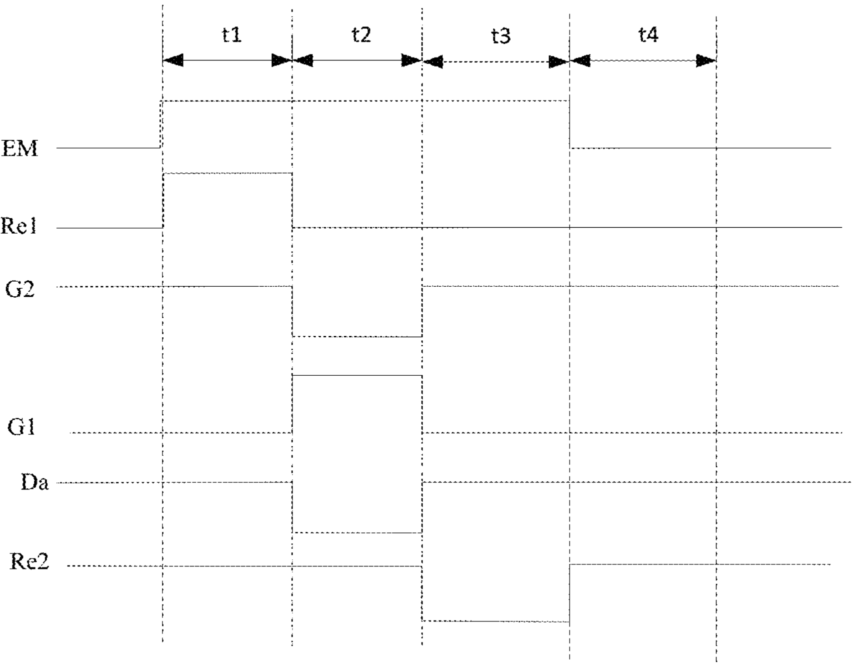
FIG. 2 is a timing diagram of each node in a driving method of the pixel driving circuit of FIG. 1.

As shown in FIG. 2, it is a timing diagram of each node in a driving method of the pixel driving circuit of FIG. 1. G1 represents the timing of the gate driving signal terminal G1, G2 represents the timing of the gate driving signal terminal G2, Re1 represents the timing of the first reset signal terminal Re1, Re2 represents the timing of the second reset signal terminal Re2, and EM represents the timing of the enable signal terminal EM, Da represents the timing of the data signal terminal Da, and N1 represents the timing of the first node N1. The driving method of the pixel driving circuit may include a first reset phase t1, a threshold compensation phase t2, a second reset phase t3, and a light emitting phase t4. In the first reset phase t1: the first reset signal terminal Re1 outputs a high-level signal, the first transistor T1 is turned on, and the first initial signal terminal Vinit1 inputs an initial signal to the first node N1. In the threshold compensation phase t2: the gate driving signal terminal G1 outputs a high level signal, the gate driving signal terminal G2 outputs a low level signal, the fourth transistor T4 and the second transistor T2 are turned on, and at the same time the data signal terminal Da outputs a driving signal to write the voltage Vdata+Vth to the node N, wherein Vdata is the voltage of the driving signal, and Vth is the threshold voltage of the driving transistor T3, in the second reset phase t3, the second reset signal terminal Re2 outputs a low-level signal, and the seventh transistor T7 is turned on, and the second initial signal terminal Vinit2 inputs an initial signal to the second electrode of the sixth transistor T6. In the light emitting phase t4: the enable signal terminal EM outputs a low-level signal, the sixth transistor T6 and the fifth transistor T5 are turned on, and the driving transistor T3 emits light under the action of the voltage Vdata+Vth stored in the capacitor C. According to the driving transistor output current formula I=(μWCox/2L)(Vgs−Vth)2, where u is the carrier mobility; Cox is the gate capacitance per unit area, W is the width of the channel of the driving transistor, and L is the length of the channel of the driving transistor, Vgs is the gate-source voltage difference of the driving transistor, and Vth is the threshold voltage of the driving transistor. The output current of the driving transistor in the pixel driving circuit of the present disclosure is I=(μWCox/2L)(Vdata+Vth−Vdd−Vth)2. The pixel driving circuit can avoid the influence of the threshold value of the driving transistor on the output current thereof.

Figure 3:
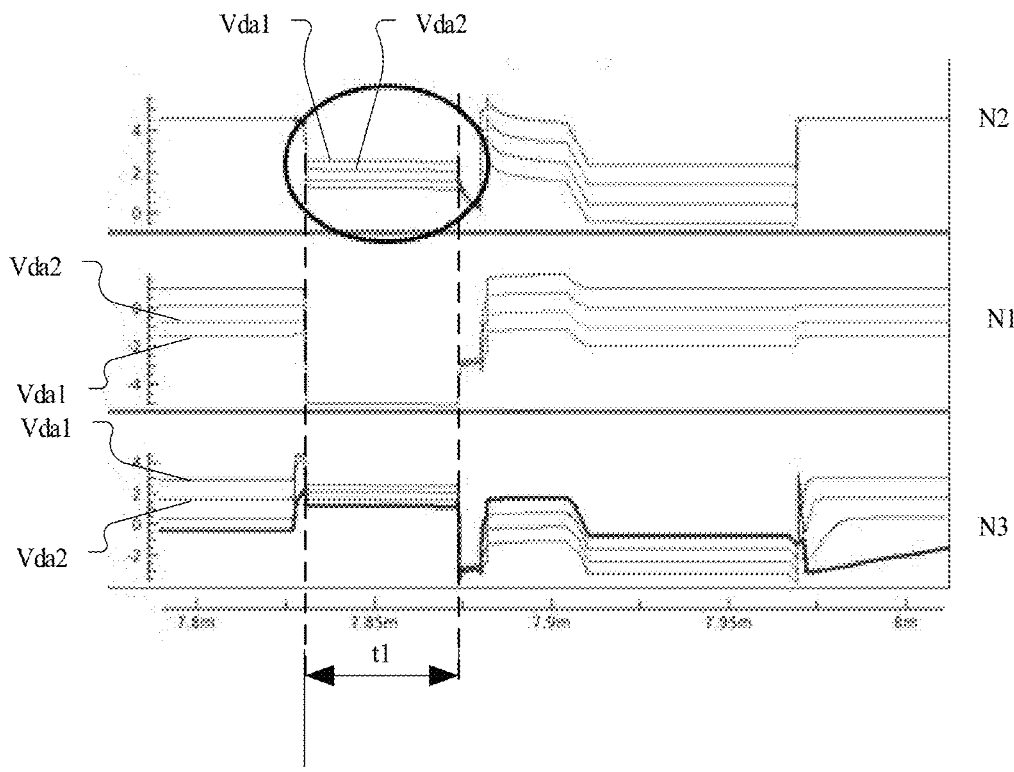
FIG. 3 is a simulation timing diagram of a first node, a second node, and a third node in the driving method shown in FIG. 2 for the pixel driving circuit in FIG. 1.

In the related art, there is a parasitic capacitance between the gate electrode and the source electrode of the driving transistor in the pixel driving circuit. During the reset phase of the pixel driving circuit, the gate voltage of the driving transistor is initialized to the initial voltage. Under the coupling of the parasitic capacitance, the source voltage of the driving transistor also changes accordingly. When different gray scales are reset in the reset phase, the change amounts of the gate voltage of the driving transistor are different, so the change amounts of the source voltage of the driving transistor are also different, which in turn enables the gate-source voltage (Vgs) of the driving transistor to be different after the reset phase is completed. FIG. 3 is the simulation timing diagram of the first node, the second node and the third node in the driving method shown in FIG. 2 for the pixel driving circuit in FIG. 1, N1 represents the timing diagram of the first node N1, and N2 represents the timing diagram of the second node N2, N3 represents the timing diagram of the third node N3, wherein, FIG. 3 specifically shows the timing diagram of each node of the pixel driving circuit shown in FIG. 1 under four data signals, and in the reset phase t1 in FIG. 3, the first node N1 under the four data signals needs to be reset, and the present embodiment describes the timing of each node under the two data signals. As shown in FIG. 3, under the first data signal, the timing sequence of each node is as shown by the curve Vda1, and under the second data signal, the timing sequence of each node is as shown by the curve Vda2. Because the voltages of the first data signal and the second data signal are different, before the reset phase t1, the voltage of the first node N1 is different, the voltage of the third node N3 is also different, and the voltage of the second node is the first power supply terminal VDD. In the reset phase t1, the voltages of the first node N1 under the two data signals are both pulled down to the initial voltage, because the pull-down variation of the first node N1 under the first data signal is smaller than the pull-down variation of N1 under the second data signal, so that the pull-down variation of the second node under the first data signal is smaller than the pull-down variation of the second node N2 under the second data signal, that is, in the reset phase, the voltage of the second node N2 under the first data signal is less than the voltage of the second node N2 under the second data signal, so that the Vgs (gate-source voltage difference) of the driving transistor is different under different data signals. At the same time, since the Vgs of the driving transistor will affect its threshold voltage, the display panel will suffer from afterimage and flicker problems. For example, when the display panel changes from a black and white image to the same gray-scale image, due to the different threshold voltages of the driving transistors in the corresponding pixel points of the black and white image, after the conversion to the same gray-scale image, the area where the black and white image of the previous frame is located will display different grayscales, that is, the afterimage problem occurs.

Figure 4:
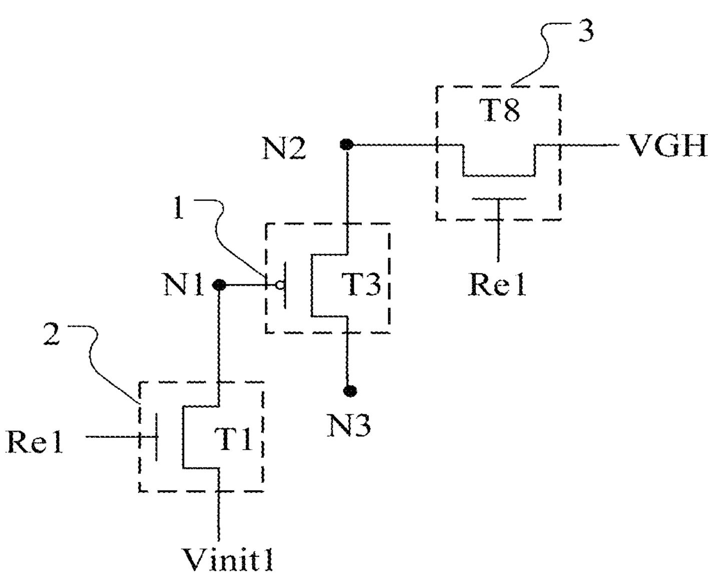
FIG. 4 is a schematic structural diagram of an exemplary embodiment of a pixel driving circuit of the present disclosure.

Based on this, the present embodiment provides a pixel driving circuit, as shown in FIG. 4, which is a schematic structural diagram of the pixel driving circuit of an exemplary embodiment of the present disclosure. Wherein, the pixel driving circuit may include: a driving circuit 1, a first reset circuit 2, and a second reset circuit 3, and the driving circuit 1 is connected to the first node N1 and the second node N2, and is configured to output a driving current based on the voltage difference between the first node N1 and the second node N2; the first reset circuit 2 is connected to the first node N1, the first initial signal terminal Vinit1, and the first reset signal terminal Re1, and is configured to transmit the signal of the first reset signal terminal Vinit1 to the first node N1 in responding to the signal of the first reset signal terminal Re1; the second reset circuit 3 is connected to the second node N2 and the first power terminal VGH, and is used to transmit the signal of the first power supply terminal VGH to the second node N2 in responding to the a control signal.

In this exemplary embodiment, the pixel driving circuit may use the first reset circuit 2 to transmit the signal of the first initial signal terminal Vinit1 to the first node N1 during the reset phase, and at the same time, use the second reset circuit 3 to transmit the signal of the first power supply terminal VGH to the second node N2, so that under different data signals, the pixel driving circuit can reset the gate-source voltage difference of the driving transistor to the same value, thereby improving the afterimage and flicker problems of the display panel.

In this exemplary embodiment, as shown in FIG. 4, the driving circuit 1 may further be connected to a third node N3, and the driving circuit 1 may include: a driving transistor T3, and the gate electrode of the driving transistor T3 is connected to the first node N1, the first electrode is connected to the second node N2, and the second electrode is connected to the third node N3. The driving transistor T3 may be a P-type transistor, for example, the driving transistor T3 may be a P-type low temperature polysilicon transistor, and the driving transistor T3 may input a driving current to the third node according to the voltage difference between the first node N1 and the second node N2. It should be understood that, in other exemplary embodiments, the driving transistor T3 may also be an N-type transistor, and when the driving transistor T3 is an N-type transistor, the driving transistor may input the driving current to the second node according to the voltage difference between the first node N1 and the second node N2. In addition, the driving circuit 1 may further include a plurality of driving transistors, and the plurality of driving transistors may be connected in parallel between the second node and the third node.

In this exemplary embodiment, as shown in FIG. 4, the first reset circuit 2 may include: a first transistor T1, the gate electrode of the first transistor T1 is connected to the first reset signal terminal Re1, and the first electrode is connected to the first initial signal terminal Vinit1, and the second electrode is connected to the first node N1. The turn-on level of the second reset circuit 3 may be the same polarity as the turn-on level of the first reset circuit 2, and the second reset circuit 3 may also be connected to the first reset signal terminal Re1, so that the second reset circuit 3 may be configured to transmit the signal of the first power supply terminal VGH to the second node N2 in response to the signal of the first reset signal terminal Re1. As shown in FIG. 4, the second reset circuit 3 may include: an eighth transistor T8, the gate electrode of the eighth transistor T8 is connected to the first reset signal terminal Re1, and the first electrode is connected to the first power supply terminal VGH, the second electrode is connected to the second node N2.

It should be noted that the pixel driving circuit needs to turn on the driving transistor T3 in the threshold compensation phase. Therefore, the voltage difference Vinit1−Vgh between the first initial signal terminal Vinit1 and the first power terminal VGH needs to be smaller than the threshold voltage of the driving transistor T3, wherein, Vinit1 is the voltage of the first initial signal terminal, and Vgh is the voltage of the first power terminal VGH. In addition, in other exemplary embodiments, the second reset circuit 3 may also transmit signals of other signal terminals to the second node in response to a control signal, so as to reset the second node.

In this exemplary embodiment, both the first transistor T1 and the eighth transistor T8 may be oxide transistors. For example, the semiconductor material of the first transistor T1 and the eighth transistor T8 may be indium gallium zinc oxide. Correspondingly, the first transistor T1 and the eighth transistor T8 may be N-type transistors. The oxide transistor has a smaller turn-off leakage current, so that the leakage current of the first node N1 through the first transistor T1 and the leakage current of the second node N2 through the eighth transistor T8 can be reduced.

Figure 5:
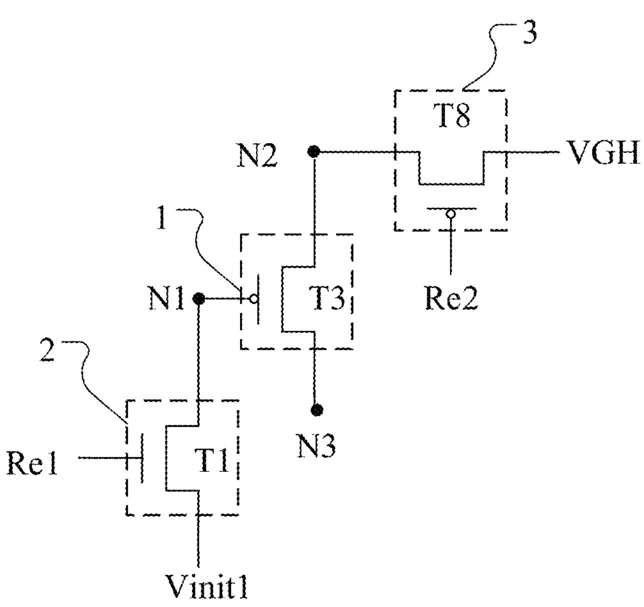
FIG. 5 is a schematic structural diagram of a pixel driving circuit according to an embodiment of the present disclosure.

It should be understood that, in other exemplary embodiments, the polarity of the turn-on level of the second reset circuit 3 and that of the turn-on level of the first reset circuit 2 may also be opposite. For example, as shown in FIG. 5, it is a schematic structural diagram of another exemplary embodiment of the pixel driving circuit of the present disclosure. The second reset circuit 3 can also be connected to the second reset signal terminal Re2, and the second reset circuit 3 can be used to transmit the signal of the first power supply terminal VGH to the second node N2 in respond to the signal of the second reset signal terminal Re2; wherein, the polarity of the signal of the second reset signal terminal Re2 and the polarity of the signal of the first reset signal terminal Re1 may be opposite. The first reset circuit 2 may include: an N-type first transistor T1, the gate electrode of the first transistor T1 is connected to the first reset signal terminal Re1, the first electrode is connected to the first initial signal terminal Vinit1, and the second electrode is connected to the first node N1. The second reset circuit 3 may include: an eighth transistor T8 of P-type, the gate electrode of the eighth transistor T8 is connected to the second reset signal terminal Re2, the first electrode is connected to the first power supply terminal VGH, and the second electrode is connected to the second node N2.

Figure 6:
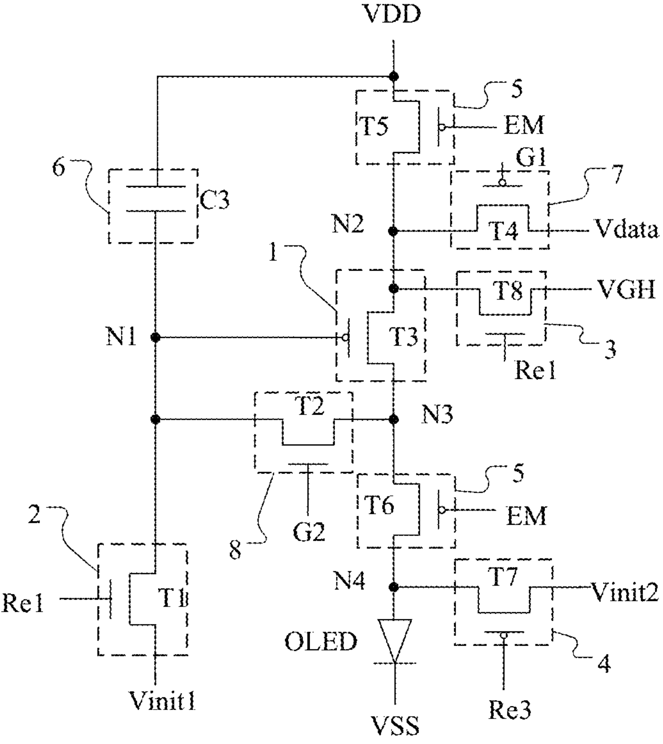
FIG. 6 is a schematic structural diagram of a pixel driving circuit according to an embodiment of the present disclosure.

In this exemplary embodiment, as shown in FIG. 6, it is a schematic structural diagram of another exemplary embodiment of the pixel driving circuit of the present disclosure. The pixel driving circuit may further include: a control circuit 5 and a coupling circuit 6, the control circuit 5 is connected to the second power supply terminal VDD, the second node N2, the third node N3, the fourth node N4, and the enable signal terminal EM, is configured to transmit the signal of the second power supply terminal VDD to the second node N2 in response to the signal of the enable signal terminal EM, and to connect the third node N3 and the fourth node N4 in response to the signal of the enable signal terminal EM; the coupling circuit 6 is connected between the second power supply terminal VDD and the first node N1.

In this exemplary embodiment, as shown in FIG. 6, the pixel driving circuit may further include: a data writing-in circuit 7 and a threshold compensation circuit 8, and the data writing-in circuit 7 is connected to the second node N2 and the data signal terminal Vdata, the first gate driving signal terminal G1, and is configured to transmit the signal of the data signal terminal Vdata to the second node N2 in response to the signal of the first gate driving signal terminal G1; the threshold compensation circuit 8 can be connected to the first node N1 and the third node N3, is configured to connect the first node N1 and the third node N3 in response to a control signal. The data writing-in circuit 7 and the threshold compensation circuit 8 are used to be turned on in the threshold compensation phase to write the compensation voltage Vdata+Vth to the first node N1, where Vdata is the voltage of the data signal terminal, and Vth is the threshold voltage of the driving transistor. It should be understood that, in other exemplary embodiments, there are other ways to write the compensation voltage to the first node N1, for example, a data writing-in circuit may be connected to the third node N3, the data signal terminal Vdata, the first gate driving signal terminal G1, the data writing-in circuit is used for transmitting the signal of the data signal terminal Vdata to the third node N3 in response to the signal of the first gate driving signal terminal G1, and at the same time to connect the threshold value compensation circuit 8 to the first node N1 and the second node N2, and the threshold compensation circuit 8 can be used to connect the first node N1 and the second node N2 in response to a control signal. When the data writing-in circuit 7 and the threshold compensation circuit 8 are turned on, the pixel driving circuit can also write the compensation voltage Vdata+Vth to the first node N1.

In this exemplary embodiment, as shown in FIG. 6, the fourth node N4 may be used to connect a light emitting unit OLED, the light emitting unit OLED may be a light emitting diode, and the other electrode of the light emitting unit OLED may be connected to the fourth power supply terminal VSS, the voltage of the fourth power supply terminal VSS is lower than the voltage of the second power supply terminal VDD. The pixel driving circuit may further include: a third reset circuit 4, the third reset circuit 4 is connected to the fourth node N4 and the second initial signal terminal Vinit2, and is configured to transmit a signal of the second initial signal terminal Vinit2 to the fourth node N4 in respond to a control signal. Wherein, the writing the initial signal into the fourth node N4 can eliminate the carriers that are not recombined on the light emitting interface inside the light emitting diode, and relieve the aging of the light emitting diode.

In this exemplary embodiment, as shown in FIG. 6, the control circuit 5 may include: a fifth transistor T5, a sixth transistor T6, the gate electrode of the fifth transistor T5 is connected to the enable signal terminal EM, the first electrode is connected to the second power supply terminal VDD, the second electrode is connected to the second node N2; the gate electrode of the sixth transistor T6 is connected to the enable signal terminal EM, the first electrode is connected to the third node N3, and the second electrode is connected to the fourth node N4. The coupling circuit 6 may include: a third capacitor C3 connected between the second power supply terminal VDD and the first node N1.

In this exemplary embodiment, as shown in FIG. 6, the turn-on level of the threshold compensation circuit 8 and the turn-on level of the data writing-in circuit 7 may have opposite polarities; the threshold compensation circuit 8 may also be connected to the second gate driving signal terminal G2, the threshold compensation circuit 8 is configured to connect the first node N1 and the third node N3 in response to the signal of the second gate driving signal terminal G2; wherein, the polarity of the signal of the first gate driving signal terminal G1 and the polarity of the signal of the second gate driving signal terminal G2 may be opposite. The data writing-in circuit 7 may include: a fourth transistor T4, the gate electrode of the fourth transistor T4 is connected to the first gate driving signal terminal G1, the first electrode is connected to the data signal terminal Vdata, and the second electrode is connected to the second node N2; the threshold compensation circuit 8 may include: a second transistor T2, the gate electrode of the second transistor T2 is connected to the second gate driving signal terminal G2, the first electrode is connected to the first node N1, the second electrode is connected to the third node N3; wherein, the fourth transistor T4 may be a P-type transistor, for example, the fourth transistor T4 may be a P-type low temperature polysilicon transistor, and the low temperature polysilicon transistor has a higher carrier mobility, so that the response speed of the fourth transistor T4 can be improved; the second transistor T2 can be an N-type transistor, for example, the second transistor T2 can be an oxide transistor, and the semiconductor material of the second transistor T2 can be Indium Gallium Zinc Oxide. The second transistor T2 is set as an oxide transistor, so as to reduce the leakage current of the pixel driving circuit through the second transistor at the first node N1 in the light emitting phase.

It should be understood that, in other exemplary embodiments, the fourth transistor T4 and the second transistor T2 may also be the same as N-type transistors or P-type transistors, and correspondingly, the fourth transistor T4 and the second transistor T2 may also share the same gate driving signal terminal.

In this exemplary embodiment, as shown in FIG. 6, the third reset circuit 4 may also be connected to a third reset signal terminal Re3, and the third reset circuit 4 may be used to transmit the signal of the second initial signal terminal Vinit2 to the fourth node N4 in respond to the signal of the third reset signal terminal Re3. The third reset circuit 4 may include: a seventh transistor T7, the gate electrode of the seventh transistor T7 is connected to the third reset signal terminal Re3, the first electrode is connected to the second initial signal terminal Vinit2, and the second electrode is connected to the fourth node N4. The seventh transistor T7 may be a P-type transistor, for example, the seventh transistor T7 may be a P-type low-temperature polycrystalline silicon transistor, and the low-temperature polycrystalline silicon transistor has higher carrier mobility, so that the seventh transistor T7 has a fast response speed.

In this exemplary embodiment, as shown in FIG. 6, the first electrode of the eighth transistor T8 and the first electrode of the fifth transistor T5 are respectively connected to different power supply terminals. It should be understood that in other exemplary embodiments, as shown in FIG. 7, which is a schematic structural diagram of the pixel driving circuit according to another exemplary embodiment of the present disclosure, the first electrode of the eighth transistor T8 and the first electrode of the fifth transistor T5 can be connected to the same power supply terminal, that is, the second power supply terminal VDD may share the first power supply terminal VGH.

Figure 7:
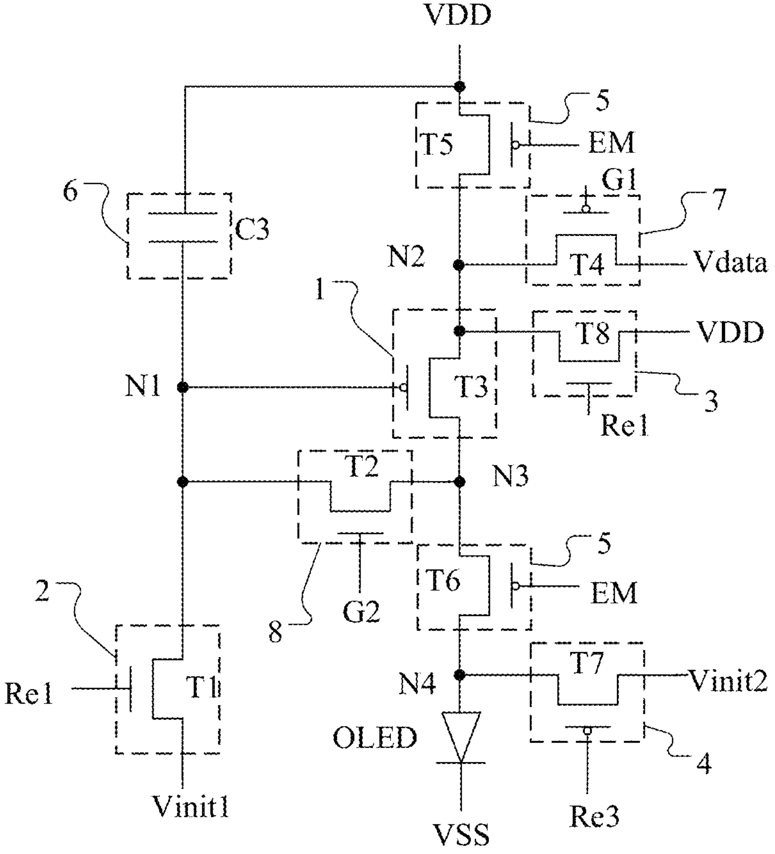
FIG. 7 is a schematic structural diagram of a pixel driving circuit according to an embodiment the present disclosure.
Figure 8:
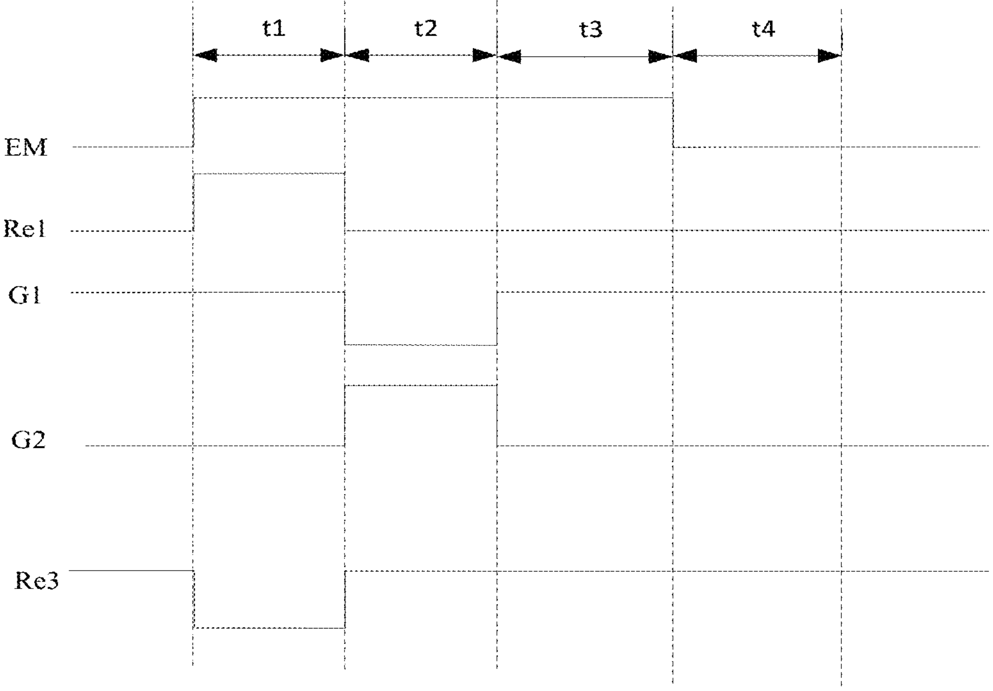
FIG. 8 is a timing diagram of each node in a driving method of the pixel driving circuit in FIG. 7.

As shown in FIG. 8, it is a timing diagram of each node in a driving method of the pixel driving circuit in FIG. 7, wherein G1 represents the timing of the first gate driving signal terminal, G2 represents the timing of the second gate driving signal terminal, and Re1 represents the timing of the first reset signal terminal, Re3 represents the timing of the third reset signal terminal, and EM represents the timing of the enable signal terminal. The pixel driving circuit driving method may include four phases: a reset phase t1, a threshold compensation phase t2, a buffer phase t3, and a light emitting phase t4. Among them, in the reset phase t1: the enable signal terminal EM, the first reset signal terminal Re1, and the first gate driving signal terminal output a high level signal, and the second gate driving signal terminal G2 and the third reset signal terminal Re3 output a low level signal, the first transistor T1, the seventh transistor T7, and the eighth transistor T8 are turned on, the first initial signal terminal Vinit1 inputs the first initial signal to the first node N1, and the first power terminal VDD inputs a power signal to the second node N2, the second initial signal terminal Vinit2 inputs a second initial signal to the fourth node, wherein the voltages of the first initial signal and the second initial signal may be the same or different. In the threshold compensation phase t2: the enable signal terminal EM, the second gate driving signal terminal G2 and the third reset signal terminal output a high level signal, and the first reset signal terminal Re1 and the first gate driving signal terminal G1 output a low level signal, the second transistor T2 and the fourth transistor T4 are turned on, the data signal terminal Vdata writes the compensation voltage Vdata+Vth to the first node N1, where Vdata is the voltage of the data signal terminal, and Vth is the threshold voltage of the driving transistor. In the buffering phase t3: the enable signal terminal EM, the third reset signal terminal Re3, and the first gate driving signal terminal G1 output a high level signal, and the second gate driving signal terminal G2 and the first reset signal terminal Re1 output a low level signal, all transistors are turned off. In the light emitting phase t4: the third reset signal terminal Re3 and the first gate driving signal terminal G1 output a high level signal, and the enable signal terminal EM, the second gate driving signal terminal G2 and the first reset signal terminal Re1 output a low level signal, the fifth transistor T5 and the sixth transistor T6 are turned on, and the driving transistor T3 emits light under the action of the voltage Vdata+Vth stored in the third capacitor C3. It should be understood that, in other exemplary embodiments, the driving method may not include a buffering phase; the first transistor T1 and the seventh transistor T7 may also be turned on in different phases. In the threshold compensation phase t2, the duration of the valid level (low level) of the first gate driving signal terminal G1 may be shorter than the duration of the valid level (high level) of the second gate driving signal terminal G2. In this threshold compensation phase At t2, the first gate driving signal terminal G1 can scan one row of pixel driving circuits, and the second gate driving signal terminal G2 can scan a plurality of rows of pixel driving circuits row by row, for example, two rows of pixel driving circuits.

Figure 9:
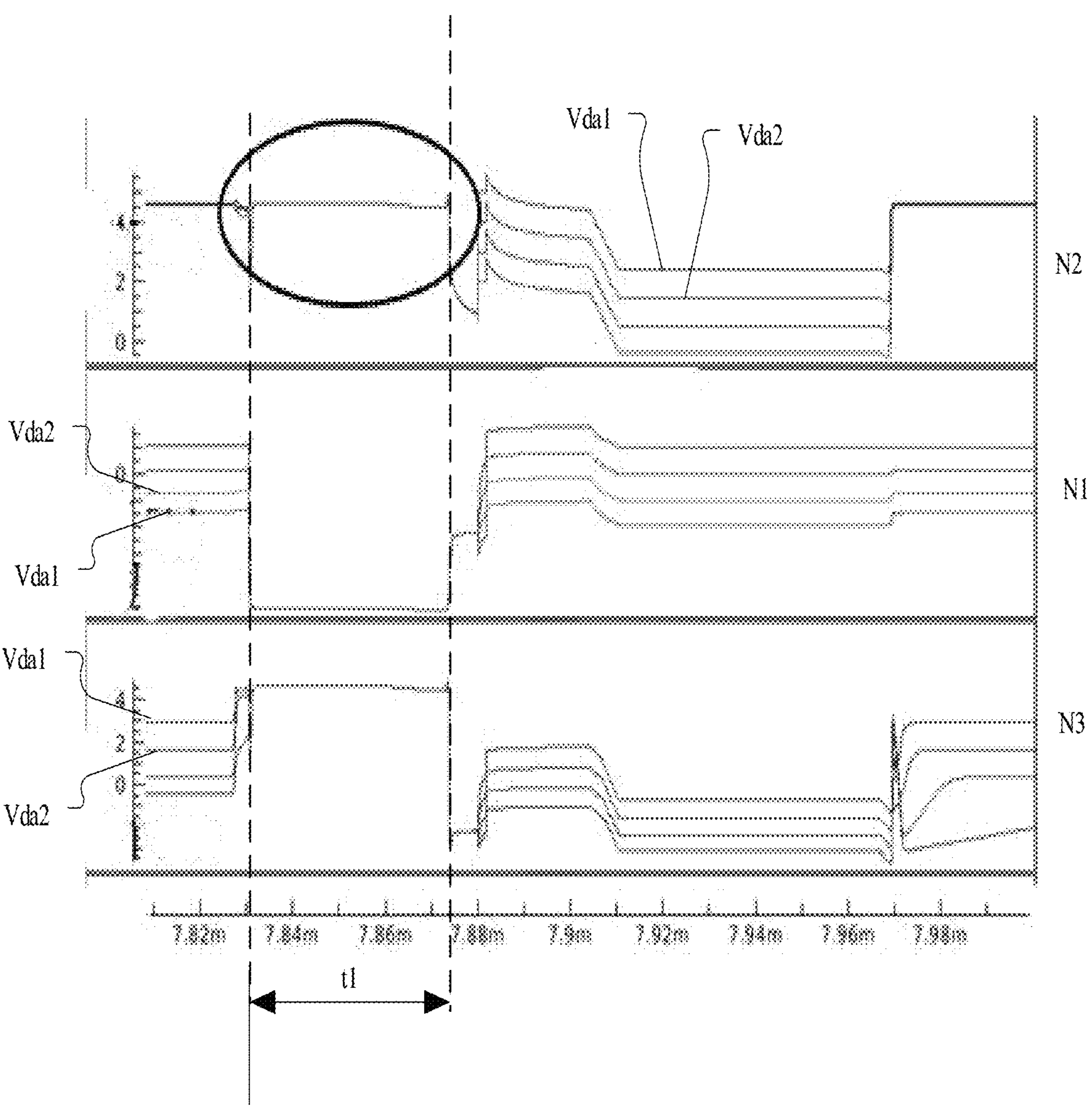
FIG. 9 is a simulation timing diagram of the first node, the second node, and the third node in the driving method shown in FIG. 8 for the pixel driving circuit in FIG. 7.

As shown in FIG. 9, it is a simulation timing diagram of the first node, the second node, and the third node in the driving method shown in FIG. 8 for the pixel driving circuit in FIG. 7. N1 represents the timing diagram of the first node N1, and N2 represents the timing diagram of the second node N2, N3 represents the timing diagram of the third node N3, wherein, FIG. 9 specifically shows the timing diagram of each node of the pixel driving circuit shown in FIG. 7 under four data signals, and in the reset phase t1 in FIG. 9, the first node N1 under the four data signals needs to be reset, and the present exemplary embodiment describes the timing of each node under the two data signals. As shown in FIG. 9, under the first data signal, the time sequence of each node is shown as a curve Vda1, and under the second data signal, the time sequence of each node is shown as a curve Vda2. As shown in FIG. 9, since the voltages of the first data signal and the second data signal are different, before the reset phase t1, the voltage of the first node N1 is different, the voltage of the third node N3 is also different, and the voltage of the second node is the voltage of the first power supply terminal VDD; in the reset phase t1, the voltage of the first node N1 under the two data signals is pulled down to the voltage of the first initial signal, and the voltage of the second node N2 is also initialized to the voltage of the first power terminal VDD, so that at the end of the reset phase, the gate-source voltage difference of the driving transistor under the first data signal is equal to the gate-source voltage difference of the driving transistor under the second data signal, so that the pixel driving circuit can improve the afterimage problem caused by the difference gate-source voltage difference of the driving transistors under different data signals.

This exemplary embodiment also provides a method for driving a pixel driving circuit, wherein the method includes:

In a reset phase, transmitting, by the first reset circuit 2, the signal of the first initial signal terminal Vinit1 to the first node N1, and transmitting, by the second reset circuit 3, the signal of the first power supply terminal VGH to the second node N2. The pixel driving method has been described in detail in the above content, and will not be repeated here.

The present exemplary embodiment also provides a display panel, which may include the above-mentioned pixel driving circuit. The display panel can be applied to display devices such as mobile phones, tablet computers, and televisions.

As shown in FIG. 1, in the related art, there is a parasitic capacitance between the first node N1 and the gate driving signal terminal G1. As shown in FIG. 2, at the end of the threshold compensation phase t2, the signal of the gate driving signal terminal G1 changes from a high level to a low level. Under the coupling of the parasitic capacitor, the voltage of the first node N1 is pulled down by the gate driving signal terminal G1, so that the maximum voltage of the data signal terminal cannot achieve 0 grayscale (black screen) display, or if normal 0 grayscale display is required, the data signal terminal needs to provide a larger voltage signal.

Figure 10:
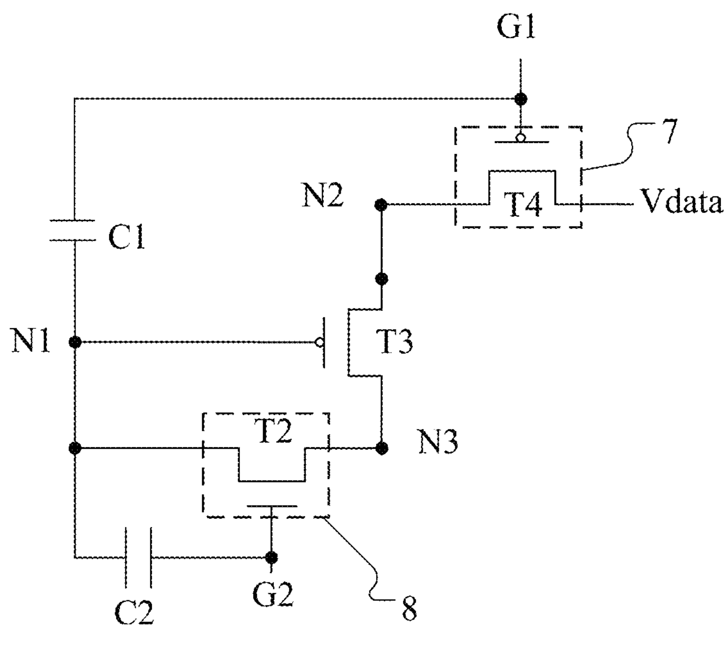
FIG. 10 is a structural diagram of the pixel driving circuit according to an embodiment of the present disclosure.

Based on this, the present exemplary embodiment provides a pixel driving circuit. As shown in FIG. 10, which is a structural diagram of the pixel driving circuit of the present disclosure, the pixel driving circuit may include: a driving transistor T3, a data writing-in circuit 7, a threshold compensation circuit 8, a first capacitor C1, a second capacitor C2, the gate electrode of the driving transistor T3 is connected to the first node N1, the first electrode is connected to the second node N2, and the second electrode is connected to the third node N3; the data writing-in circuit 7 is connected to the second node N2 and the data signal terminal Vdata, and is configured to transmit the signal of the data signal terminal Vdata to the second node N2 in response to the signal of the first gate driving signal terminal G1; the threshold compensation circuit 8 is connected to the first node N1, the third node N3, the second gate driving signal terminal G2, and is configured to connect the first node N1 and the third node N3 in response to the signal of the second gate drive signal terminal G2; the first capacitor C1 is connected between the first node N1 and the first gate driving signal terminal G1; the second capacitor C2 is connected between the first node N1 and the second gate driving signal terminal G2; wherein, the turn-on level of the data writing-in circuit 7 is a low level, the turn-on level of the threshold compensation circuit 8 is a high level, and the capacitance value of the first capacitor C1 is greater than the capacitance value of the second capacitor C2.

In this exemplary embodiment, in the threshold compensation phase, the first gate driving signal terminal G1 can output a low-level signal, and the second gate driving signal terminal G2 can output a high-level signal, so as to write the compensation voltage Vdata+Vth into the first node N1, Vdata is the voltage of the data signal terminal, and Vth is the threshold voltage of the driving transistor T3. After the threshold compensation phase ends, the signal of the first gate driving signal terminal G1 changes from a low level to a high level, and under the coupling action of the first capacitor C1, the first node N1 is pulled up by the first gate driving signal terminal G1; The signal of the second gate drive signal terminal G2 changes from a high level to a low level. Under the coupling action of the second capacitor C2, the first node N1 is pulled down by the second gate drive signal terminal G2. Since the capacitance value of C1 is greater than the capacitance value of the second capacitor C2, the first node N1 is pulled up as a whole. Therefore, the source driving circuit corresponding to the pixel driving circuit only needs to provide a small voltage signal to the data signal terminal to realize a limit gray scale (minimum gray scale or maximum gray scale) display of the pixel driving circuit. The display panel having the pixel driving circuit can have less power consumption.

In this exemplary embodiment, the driving transistor T3 may be a P-type transistor. For example, the driving transistor may be a P-type low temperature polysilicon transistor. When the driving transistor T3 is a P-type transistor, the higher the voltage of the first node N1 is, the smaller the output current of the driving transistor is, that is, the pixel driving circuit can reduce the data signal voltage outputted by the source driving circuit at 0 gray scale. It should be understood that, in other exemplary embodiments, the driving transistor T3 may also be an N-type transistor. When the driving transistor T3 is an N-type transistor, the higher the voltage of the first node N1 is, the higher the output current of the driving transistor T3 is, that is, the pixel driving circuit can reduce the data signal voltage outputted by the source driving circuit under the maximum gray scale.

In this exemplary embodiment, the capacitance value of the first capacitor C1 is C1, the capacitance value of the second capacitor C2 is C2, and C1/C2 may be greater than or equal to 1.5 and less than or equal to 4, for example, C1/C2 may be 1.5, 2, 2.3, 2.5, 3, 3.5, 4. Wherein, the larger the value of C1/C2 is, the more obvious the effect of pulling up the first node N1 is.

| | | | Vdata-L0 (V) | | | |
|---|---|---|---|---|---|---|
| C1/C2 | C1 (fF) | C2 (fF) | R | G | B | ΔV |
| 2.2 | 5.48 | 2.46 | | 6.2 | | |
| 1.35 | 5.8 | 4.31 | 6.72 | 6.77 | 6.51 | 0.12 |
| 1.73 | 6.94 | 4.02 | 6.51 | 6.58 | 6.32 | 0.31 |
| 2.05 | 6.94 | 3.39 | 6.42 | 6.46 | 6.2 | 0.43 |
| 2.3 | 7.92 | 3.44 | 6.29 | 6.36 | 6.09 | 0.53 |

As shown in the table, Vdata-L0 represents the voltage of the data signal required by each color sub-pixel at 0 gray level, and ΔV represents a difference between the maximum output voltage of the source driving circuit and the voltage of the maximum data signal required at 0 gray level, wherein, the maximum output voltage of the source driving circuit is 6.89V. Among them, C1/C2 is the multiple sets of data corresponding to 1.35, 1.73, 2.05, and 2.3, which are multiple sets of data under the same design structure (except C1/C2, other structures are the same), and the data corresponding to C1/C2 of 2.2 is under another design structure, it can be seen from this table that under the same design structure, the larger the C1/C2 is, the more obvious the pulling up effect of the first node N1 is, so that the voltage of the data signal required under the 0 grayscale is smaller.

In this exemplary embodiment, as shown in FIG. 10, the data writing-in circuit 7 may include: a P-type fourth transistor T4, for example, the fourth transistor T4 may be a P-type low-temperature polysilicon transistor, and the gate electrode of the fourth transistor T4 is connected to the first gate driving signal terminal G1, the first electrode is connected to the second node N2, and the second electrode is connected to the data signal terminal Vdata; the threshold compensation circuit 8 may include: an N-type second transistor T2, for example, the second transistor T2 may be an N-type oxide transistor, the semiconductor material of the oxide transistor may be indium gallium zinc oxide, and the gate electrode of the second transistor T2 is connected to the second gate driving signal terminal G2, the first electrode is connected to the first node N1, and the second electrode is connected to the third node N3.

Figure 11:
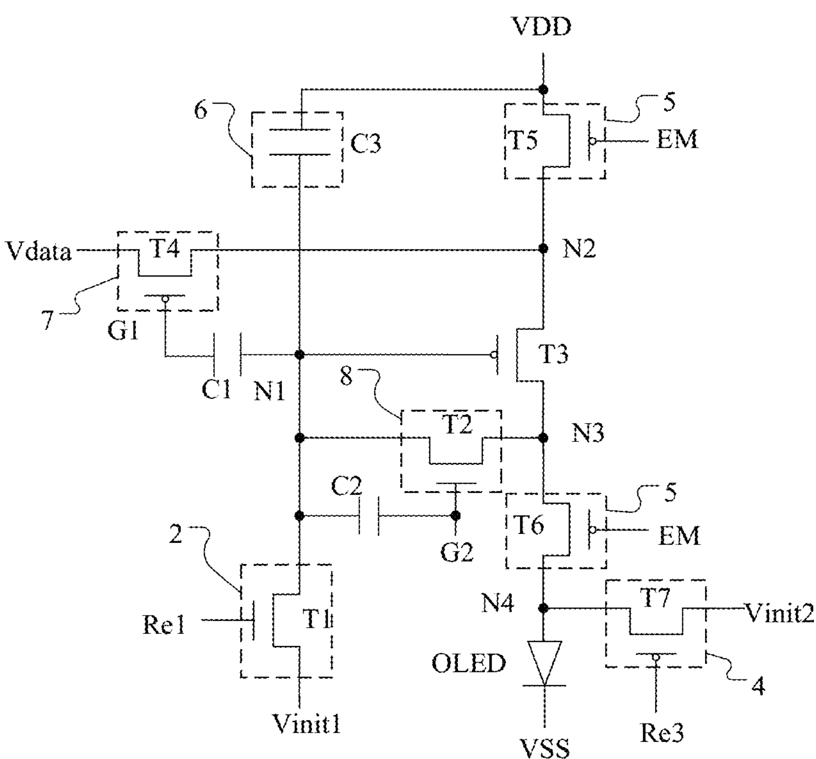
FIG. 11 is a schematic structural diagram of the pixel driving circuit according to an embodiment of the present disclosure.

In this exemplary embodiment, as shown in FIG. 11, which is a schematic structural diagram of a pixel driving circuit of the present disclosure, the pixel driving circuit may further include: a control circuit 5, a coupling circuit 6, and a control circuit 5 is connected to the second power supply terminal VDD, the second node N2, the third node N3, the fourth node N4, and the enable signal terminal EM, and the control circuit 5 can be used to transmit the signal of the second power supply terminal VDD to the second node N2 in respond to the signal of the enable signal terminal EM, and is used to connect the third node N3 and the fourth node N4 in response to the signal of the enable signal terminal EM; the coupling circuit 6 can be connected between the first node N1 and the second power supply terminal VDD. It should be understood that, in other exemplary embodiments, the control circuit 5 may also be used to transmit the signal of the second power supply terminal VDD to the third node N3 in response to the signal of the enable signal terminal EM, and used to connect the second node N2 and the fourth node N4 in response to the signal of the enable signal terminal EM.

In this exemplary embodiment, as shown in FIG. 11, the pixel driving circuit may further include: a first reset circuit 2, and the first reset circuit 2 may be connected to the first node N1, the first initial signal terminal Vinit1, the first reset signal terminal Re1, and the first reset circuit 2 can be configured to transmit the signal of the first initial signal terminal Vinit to the first node N1 in response to the signal of the first reset signal terminal Re1.

In this exemplary embodiment, as shown in FIG. 11, the fourth node N4 may be used to connect a light emitting unit OLED, and the pixel driving circuit may further include: a third reset circuit 4 connected to the fourth node N4, the second initial signal terminal Vinit2, the third reset signal terminal Re3, the third reset circuit 4 can be used to transmit the signal of the second initial signal terminal Vinit2 to the fourth node N4 in respond to the signal of the third reset signal terminal Re3. The other end of the light emitting unit OLED may be connected to the third power supply terminal VSS, and the light emitting unit OLED may be a light emitting diode. The writing the initial signal to the fourth node N4 can eliminate the carriers that are not recombined on the light emitting interface inside the light emitting diode, and relieve the aging of the light emitting diode.

In this exemplary embodiment, as shown in FIG. 11, the coupling circuit 6 may include: a third capacitor C3 connected between the first node N1 and the second power supply terminal VDD; wherein, the capacitance value of the third capacitor C3 may be greater than the capacitance value of the first capacitor C1, and the capacitance value of the third capacitor C3 may be greater than the capacitance value of the second capacitor C2. The capacitance value of the third capacitor C3 is set to a larger, thereby increasing the charge storage capacity of the third capacitor C3, increasing the maximum duration of the light emitting phase. The control circuit 5 may include: a fifth transistor T5 and a sixth transistor T6, the gate electrode of the fifth transistor T5 is connected to the enable signal terminal EM, the first electrode is connected to the second power supply terminal VDD, and the second electrode is connected to the second node N2; the gate electrode of the sixth transistor T6 is connected to the enable signal terminal EM, the first electrode is connected to the third node N3, and the second electrode is connected to the fourth node N4. The first reset circuit 2 may include: a first transistor T1, the gate electrode of the first transistor T1 is connected to the first reset signal terminal Re1, the first electrode is connected to the first initial signal terminal Vinit1, and the second electrode is connected to the first node N1; the third reset circuit 4 may include: a seventh transistor T7, the gate electrode of the seventh transistor T7 is connected to the third reset signal terminal Re3, and the first electrode is connected to the second initial signal terminal Vinit2, the second electrode is connected to the fourth node N4. Wherein, the first transistor T1 and the second transistor T2 may be N-type transistors, the semiconductor material of the N-type transistor may be indium gallium zinc oxide, and the oxide transistor has a small turn-off leakage current, which can reduce the leakage current of the first node N through the first transistor T1 and the second transistor T2 in the first light emitting phase. The fourth transistor T4, the fifth transistor T5, the sixth transistor T6, and the seventh transistor T7 may be P-type transistors, for example, the fourth transistor T4, the fifth transistor T5, the sixth transistor T6, and the seventh transistor T7 may be P-type low-temperature polycrystalline silicon transistors, low temperature polycrystalline silicon transistors have high carrier mobility, which is conducive to realizing display panels with high resolution, high response speed, high pixel density, and high aperture ratio.

Figure 12:
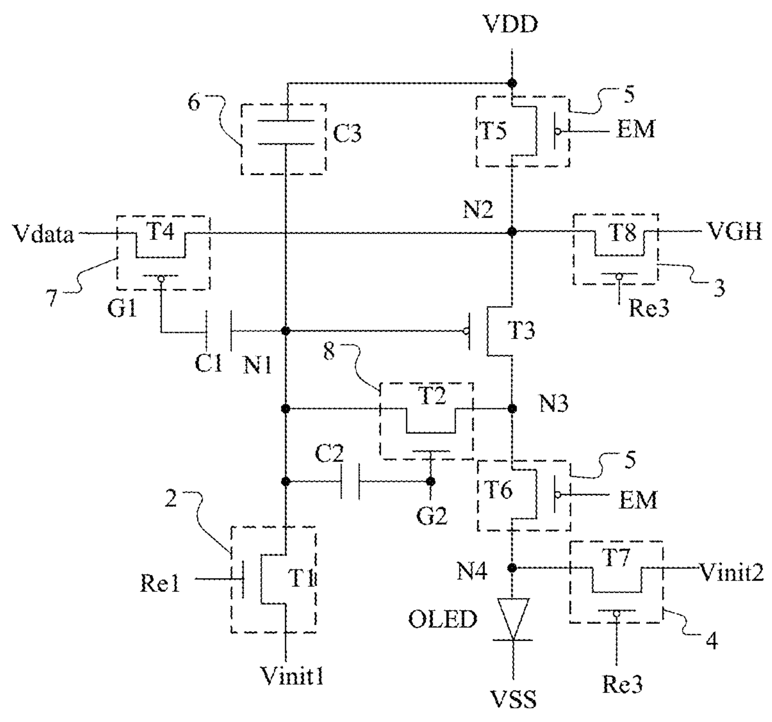
FIG. 12 is a schematic structural diagram of a pixel driving circuit according to an embodiment of the present disclosure.

As shown in FIG. 12, it is a schematic structural diagram of a pixel driving circuit of the present disclosure. The pixel driving circuit may further include: a second reset circuit 3, which may be connected to the second node N2 and the first power supply terminal VGH, and may be configured to transmit the signal of the first power supply terminal VGH to the second node N2 in respond to a control signal. In this exemplary embodiment, the turn-on level of the first reset circuit and the turn-on level of the third reset circuit may have opposite polarities, and the polarity of the signal at the first reset signal terminal Re1 and the polarity of signal at the third reset signal terminal Re3 may be opposite, the turn-on level of the second reset circuit 3 and the turn-on level of the first reset circuit 2 may have opposite polarities; the second reset circuit 3 can also be connected to the third reset signal terminal Re3, the second reset circuit 3 may be configured to transmit the signal of the first power supply terminal VGH to the second node N2 in response to the signal of the third reset signal terminal Re3.

In this exemplary embodiment, there is a parasitic capacitor between the gate and the source electrodes of the driving transistor in the pixel driving circuit. In the reset phase of the pixel driving circuit, the gate voltage of the driving transistor is initialized to the initial voltage. Under the coupling action of the parasitic capacitor, the source voltage of the driving transistor also changes accordingly. When different gray scales are reset in the reset phase, the change amounts of the gate voltage of the driving transistor are different, so the change amounts of the source voltage of the driving transistor are also different, which in turn causes the Vgs (gate-source voltage difference) of the driving transistors to be different after the reset phase is completed. At the same time, since the Vgs of the driving transistor will affect its threshold voltage, the display panel will have an afterimage problem. For example, when the display panel changes from a black and white image to the same gray-scale image, due to the different threshold voltages of the driving transistors in the pixels corresponding to the black and white image, after the conversion to the same gray-scale image, the area of the previous frame of the black and white image will display different grayscales, that is, the afterimage problem occurs. In this exemplary embodiment, the pixel driving circuit may use the first reset circuit 2 to transmit the signal of the first initial signal terminal Vinit1 to the first node N1 in the reset phase, and at the same time, use the second reset circuit 3 to transmit the signal of the first power supply terminal VGH to the second node N2, so that under different data signals, the pixel driving circuit can reset the gate-source voltage difference of the driving transistor to the same value, thereby improving the afterimage problem of the display panel.

In this exemplary embodiment, the second reset circuit 3 may include: an eighth transistor T8, the gate electrode of the eighth transistor T8 is connected to the third reset signal terminal Re3, and the first electrode is connected to the first power supply terminal VGH, the second electrode is connected to the second node N2; wherein, the eighth transistor T8 may be a P-type transistor. It should be understood that, in other exemplary embodiments, the turn-on level of the second reset circuit may have the same polarity as the turn-on level of the first reset circuit, the second reset circuit may be connected to the first reset signal terminal, and the second reset circuit may be connected to the first reset signal terminal. The second reset circuit may be used to transmit the signal of the first power supply terminal VGH to the second node in response to the signal of the first reset signal terminal. Correspondingly, the eighth transistor may be an N-type transistor, and the semiconductor material of the N-type transistor may be indium gallium zinc oxide. The first power supply terminal VGH may also share the second power supply terminal VDD, for example, the second reset circuit may be connected to the second power supply terminal VDD.

Figure 13:
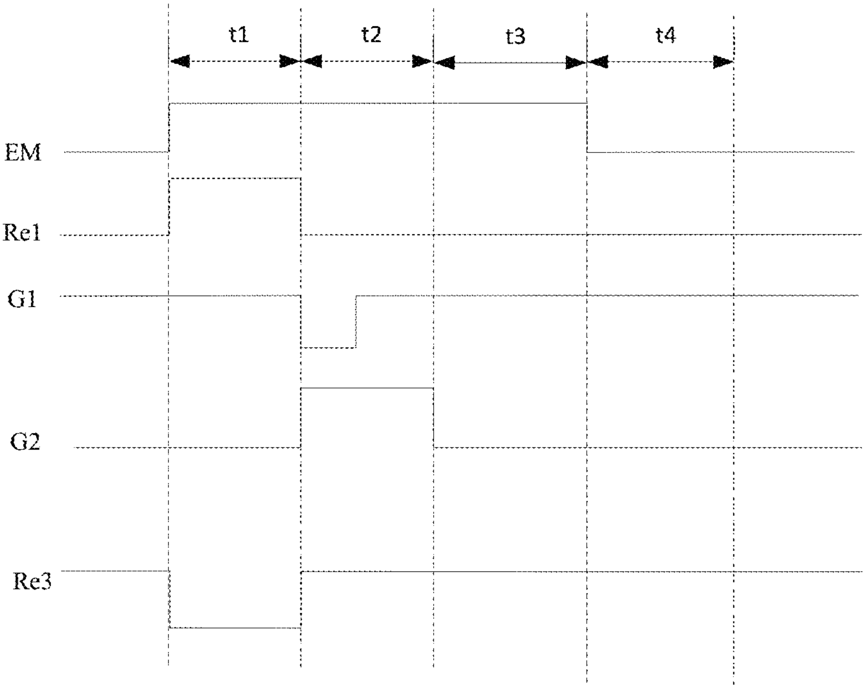
FIG. 13 is a timing diagram of each node in a driving method of the pixel driving circuit in FIG. 12.

As shown in FIG. 13, it is a timing diagram of each node in a driving method of the pixel driving circuit in FIG. 12. G1 represents the timing of the first gate driving signal terminal, G2 represents the timing of the second gate driving signal terminal, Re1 represents the timing of the first reset signal terminal, Re3 represents the timing of the third reset signal terminal, and EM represents the timing of the enable signal terminal. The driving method for the pixel driving circuit may include four phases: a reset phase t1, a threshold compensation phase t2, a buffer phase t3, and a light emitting phase t4. In the reset phase t1: the enable signal terminal EM, the first reset signal terminal Re1, and the first gate driving signal terminal output a high level signal, and the second gate driving signal terminal G2 and the third reset signal terminal Re3 output a low level signal, the first transistor T1, the seventh transistor T7, and the eighth transistor T8 are turned on, the first initial signal terminal Vinit1 inputs the first initial signal to the first node N1, and the first power terminal VDD inputs the power signal to the second node N2, the second initial signal terminal Vinit2 inputs a second initial signal to the fourth node, wherein the voltages of the first initial signal and the second initial signal may be the same or different. In the threshold compensation phase t2: the enable signal terminal EM, the second gate driving signal terminal G2, and the third reset signal terminal output a high-level signal, the first reset signal terminal Re1 outputs a low-level signal, and in at least part of the threshold compensation phase t2, the first gate driving signal terminal G1 outputs a low-level signal, the second transistor T2 and the fourth transistor T4 are turned on, and the data signal terminal Vdata writes the compensation voltage Vdata+Vth to the first node N1, wherein Vdata is the voltage of the data signal terminal, Vth is the threshold voltage of the driving transistor. In the buffering phase t3: the enable signal terminal EM, the third reset signal terminal Re3, and the first gate driving signal terminal G1 output a high level signal, and the second gate driving signal terminal G2 and the first reset signal terminal Re1 output a low level signal, all transistors are turned off. In the light emitting phase t4: the third reset signal terminal Re3 and the first gate driving signal terminal G1 output a high level signal, and the enable signal terminal EM, the second gate driving signal terminal G2 and the first reset signal terminal Re1 output a low level signal, the fifth transistor T5 and the sixth transistor T6 are turned on, and the driving transistor T3 emits light under the action of the voltage Vdata+Vth stored in the capacitor C. In this exemplary embodiment, in the threshold compensation phase t2, the duration of the valid level (low level) of the first gate driving signal terminal G1 may be shorter than the duration of the valid level (high level) of the second gate driving signal terminal G2, in the threshold compensation phase t2, the first gate driving signal terminal G1 can scan one row of pixel driving circuits, and the second gate driving signal terminal G2 can scan multiple rows of pixel driving circuits row by row, for example, the second gate driving signal terminal G2 can scan two rows of pixel driving circuits row by row. It should be understood that, in other exemplary embodiments, the driving method may not include a buffer phase; the first transistor T1 and the seventh transistor T7 may also be turned on in different phases. The duration of the valid level (low level) of the first gate driving signal terminal G1 may also be equal to the duration of the valid level (high level) of the second gate driving signal terminal G2.

Figure 14:
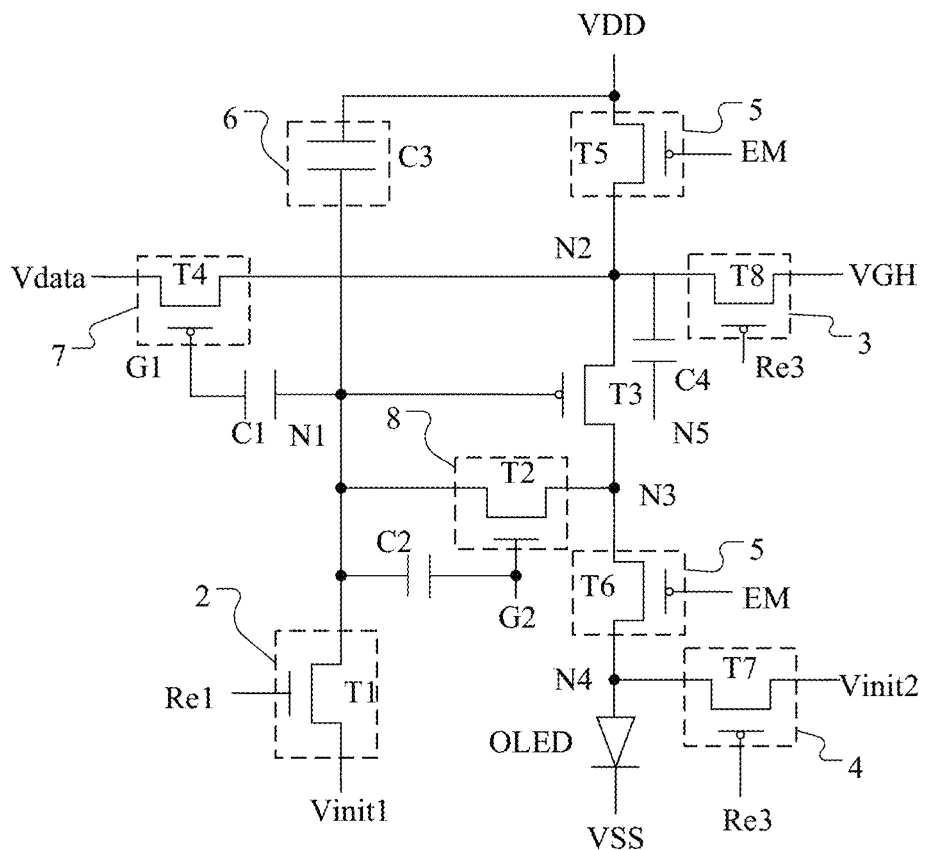
FIG. 14 is a schematic structural diagram of a pixel driving circuit according to an embodiment of the present disclosure.

As shown in FIG. 14, which is a schematic structural diagram of another exemplary embodiment of the pixel driving circuit of the present disclosure, the pixel driving circuit may further include a fourth capacitor C4, and the first electrode of the fourth capacitor C4 may be connected to the second node N2, in the light emitting phase of the pixel driving circuit, the second power supply terminal VDD can charge the fourth capacitor C4, and at the beginning of the reset phase, the fourth capacitor C4 can maintain the high level of the second node N2, so that the speed at which the first power supply terminal VGH writes a high-level signal into the second node N2 in the reset phase may be increased. The second electrode of the fourth capacitor C4 can be connected to the fifth node N5. When the equipotential conductive portion of the fifth node N5 has a pull-down action before the threshold compensation phase or the initial phase, the fifth node N5 will have a pull-down action on the second node N2, so that the voltage of the second node N2 at different positions of the display panel are different. For example, the equipotential conductive portion of the fifth node N5 may be the first gate line for providing the first gate driving signal terminal G1, and the first gate line may partially overlap with the equipotential conductive portion of the second node N2, so that a part of the structure of the first gate line can be used to form the second electrode of the fourth capacitor C4. The first gate line changes from a high level to a low level at the beginning of the threshold compensation phase, so that the first gate line will pull down the voltage of the second node N2. In this exemplary embodiment, the overlapping area of the equipotential conductive portion of the second node N2 and the first gate line can be reduced as much as possible, so as to reduce the pull-down effect of the first gate line on the second node N2. The capacitance value C4 of the fourth capacitor C4 may be smaller than the capacitance value of the second capacitor C2, and the fourth capacitor C4 may be 0.5 fF-4 fF, for example, 0.5 fF, 2 fF, and 4 fF. The capacitance value C4 of the fourth capacitor C4 may also be less than half of the capacitance value of the first capacitor C1, for example, the capacitance value C4 of the fourth capacitor C4 may be ⅓, ¼, ⅕ of the capacitance value of the first capacitor C1.

In this exemplary embodiment, as shown in FIGS. 12 and 14, the pixel driving circuit needs to turn on the driving transistor T3 in the threshold compensation phase. Therefore, the voltage difference Vinit1−Vgh between the first initial signal terminal Vinit1 and the first power supply terminal VGH needs to be lower than the threshold voltage Vth of the driving transistor T3, wherein Vinit1 is the voltage of the first initial signal terminal, and Vgh is the voltage of the first power supply terminal VGH. Wherein, Vinit1 can be −2 to −6V, for example, −2V, −3V, −4V, −5V, −6V, etc. Vinit1−Vgh can be less than a*Vth, a can be 2 to 7, for example, a can be 2, 4, 6, 7; Vth can be −2 to −5V, such as −2V, −3V, −5V, Vgh may be greater than 1.5 times of Vth, for example, Vgh may be 1.6 times, 1.8 times, 2 times of Vth.

Figure 15:
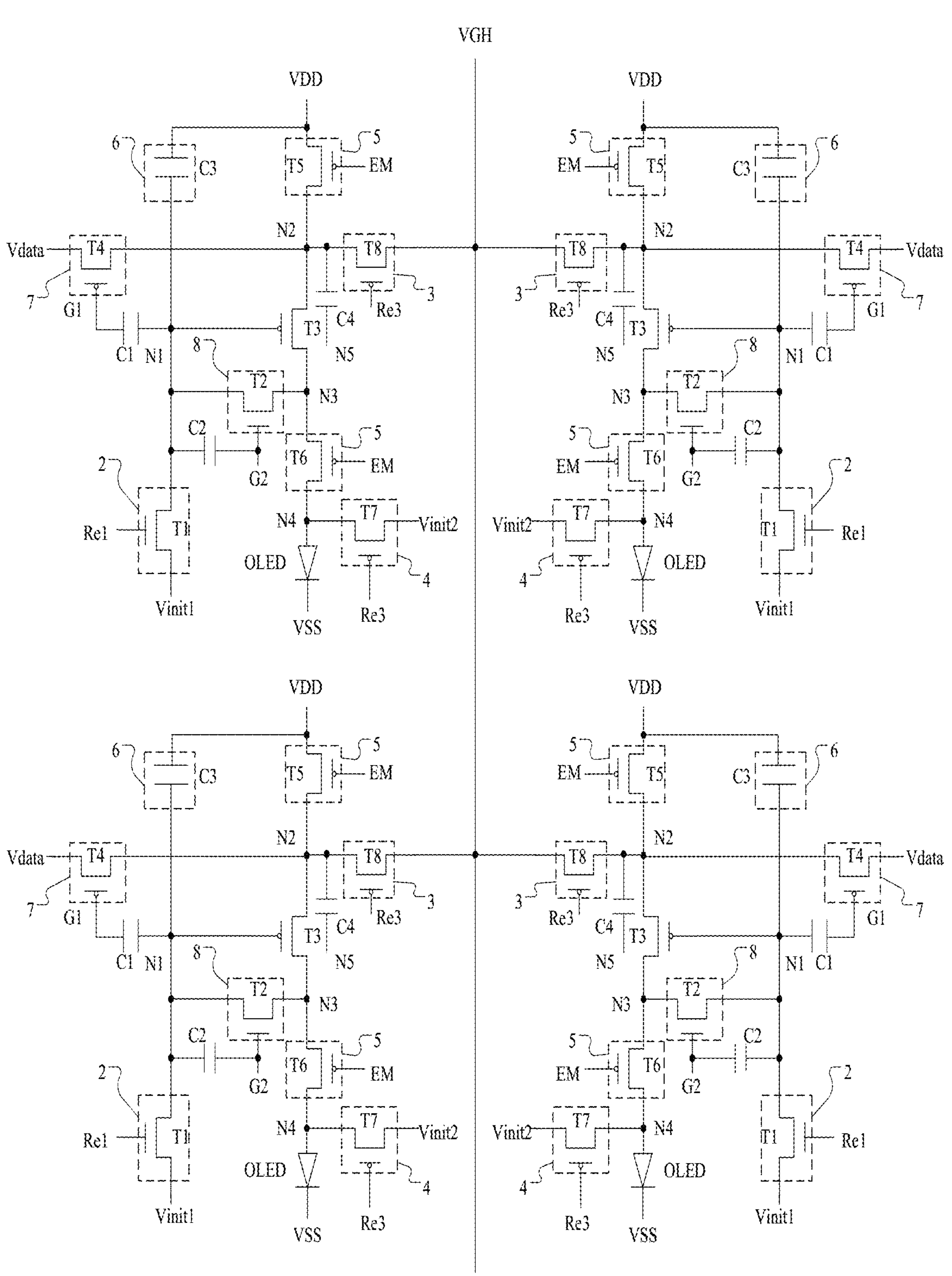
FIG. 15 is a distribution diagram of a pixel driving circuit in a display panel according to an embodiment of the present disclosure.

As shown in FIG. 15, it is a distribution diagram of a pixel driving circuit in an exemplary embodiment of the display panel of the present disclosure. The two adjacent columns of pixel circuits can be connected to the first power line VGH extending in the same column direction. The first power line VGH is used to provide a first power supply terminal to the pixel driving circuit, and the first power line VGH can be located between the two adjacent columns of pixel driving circuits. As shown in FIG. 15, in the same row of pixels, two pixel circuits in adjacent columns can be arranged in mirror to facilitate wiring.

Figure 16:
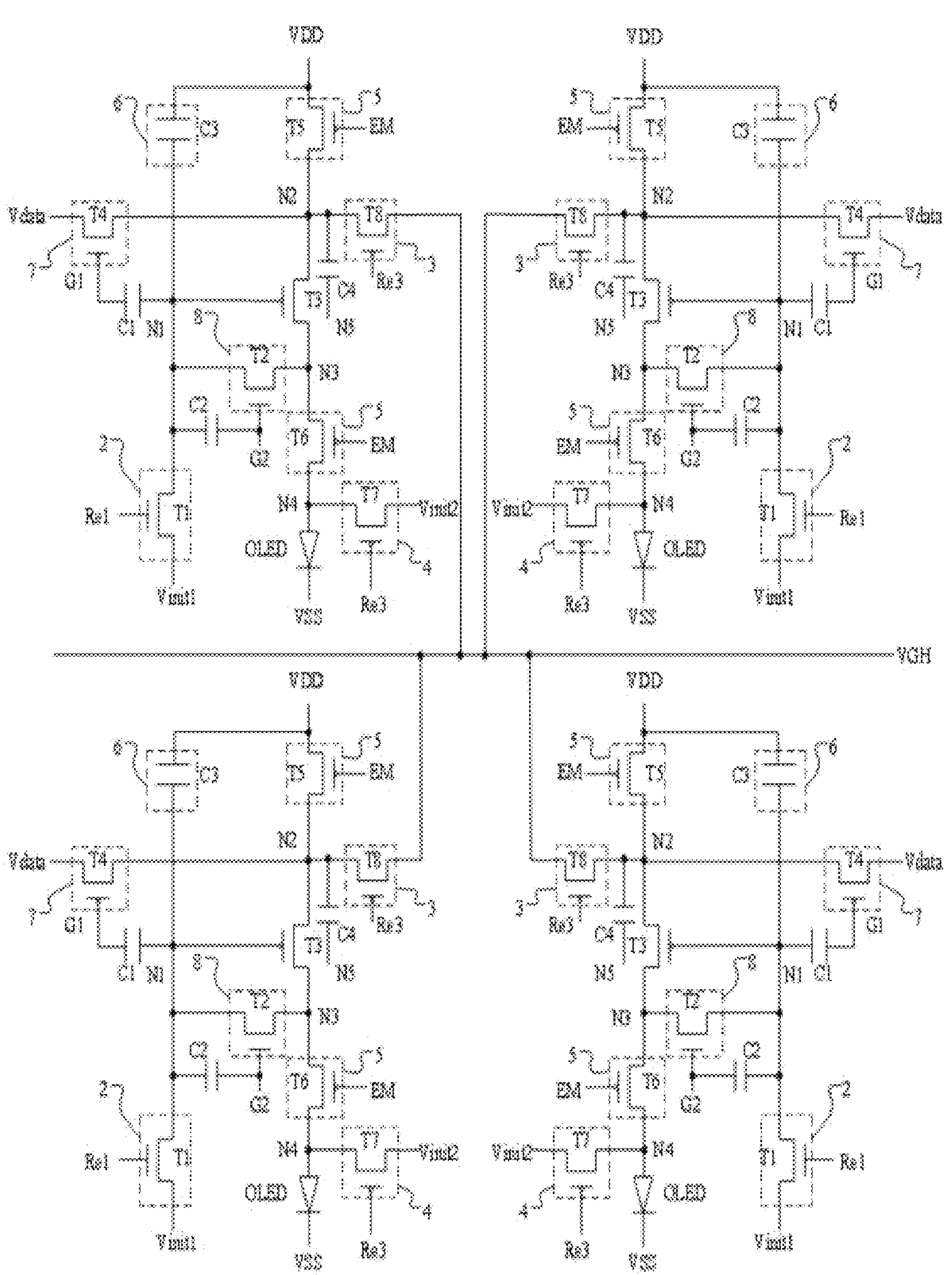
FIG. 16 is a distribution diagram of a pixel driving circuit in a display panel according to an embodiment of the present disclosure.

As shown in FIG. 16, it is a distribution diagram of a pixel driving circuit in another exemplary embodiment of the display panel of the present disclosure. Two adjacent rows of pixel circuits can be connected to a first power line VGH extending in the same row direction, and the first power line VGH is used to provide a first power supply terminal to the pixel driving circuit, and the first power line VGH can be located between the two adjacent rows of pixel driving circuits. As shown in FIG. 16, in the same row of pixels, two pixel circuits in adjacent columns can be arranged in mirror to facilitate wiring.

Figure 17:
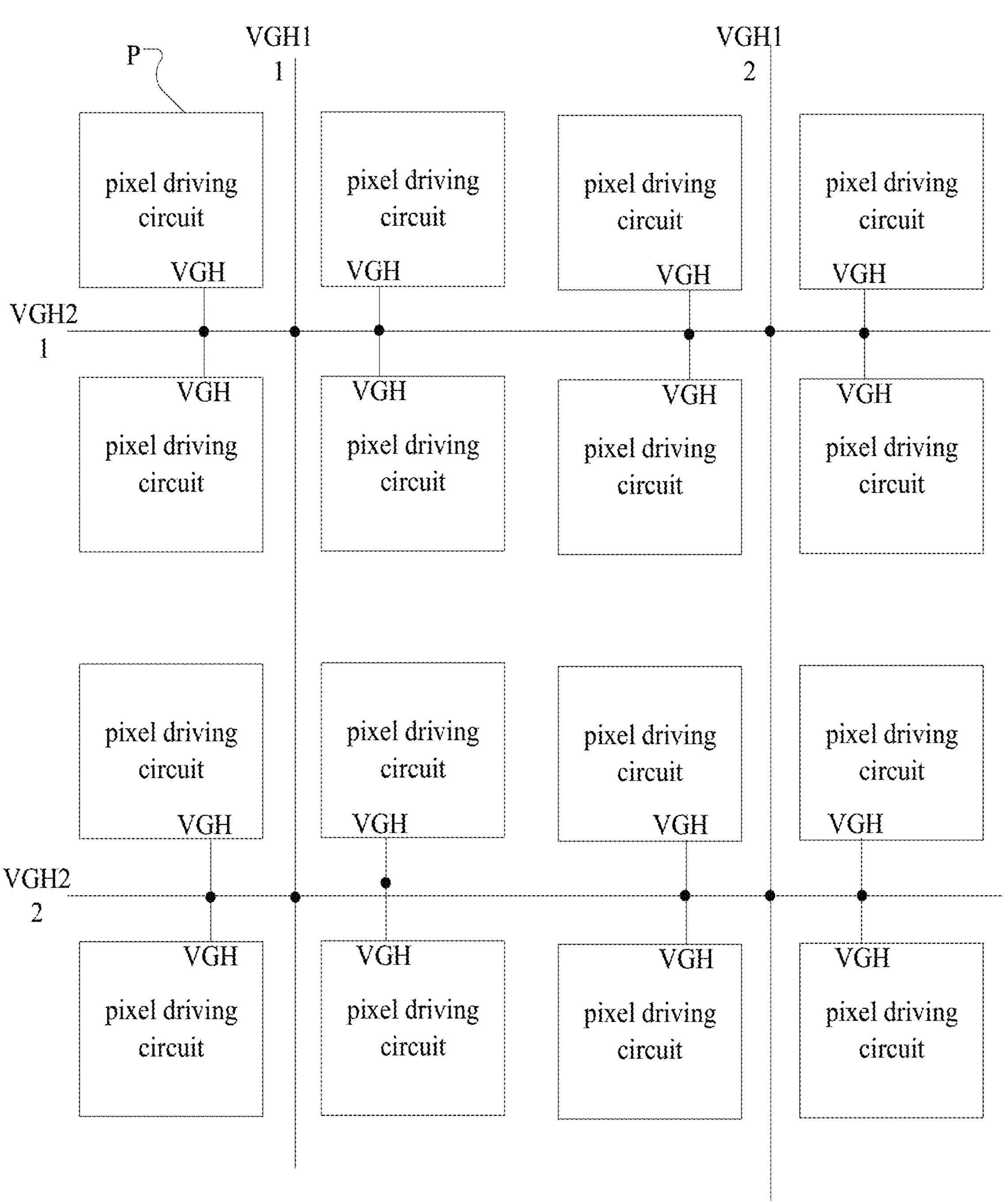
FIG. 17 is a distribution diagram of a pixel driving circuit in a display panel according to an embodiment of the present disclosure.

As shown in FIG. 17, it is a distribution diagram of a pixel driving circuit in another exemplary embodiment of the display panel of the present disclosure. The display panel may include a plurality of pixel driving circuits P arranged in an array, a plurality of first power lines VGH11, VGH12, VGH21, VGH22, all of which may be used to provide first power terminals. As shown in FIG. 17, the first power lines VGH11 and VGH12 extend along the column direction, the first power lines VGH21 and VGH22 extend along the row direction, and the two adjacent rows of pixel circuits can be connected to the first power lines extending in the same row direction. The first power line VGH may be located between the two adjacent rows of pixel driving circuits, and the first power line extending along the column direction may be connected to a plurality of first power lines extending in the row direction intersecting to the first power line extending along the column direction, so that a plurality of power lines can form a grid structure. Wherein, the first power line extending along the column direction may be located in a region where the red pixel driving circuit is located. In addition, in the same row of pixels, two pixel circuits in adjacent columns can be arranged in mirror to facilitate wiring.

The present exemplary embodiment also provides a method for driving a pixel driving circuit, which includes:

In the reset phase, inputting a high-level signal to the enable signal terminal EM, the first reset signal terminal Re1, and the first gate driving signal terminal G1, and inputting a low-level signal to the second gate driving signal terminal G2 and the third reset signal terminal Re3;

In the threshold compensation phase: inputting a high-level signal to the enable signal terminal EM, the second gate driving signal terminal G2, and the third reset signal terminal Re3, and inputting a low-level signal to the first reset signal terminal Re1 and the first gate driving signal terminal G1;

In the light emitting phase: inputting a high-level signal to the third reset signal terminal Re3 and the first gate driving signal terminal G1, and inputting a low-level signal to the enable signal terminal EM, the second gate driving signal terminal G2, and the first reset signal terminal Re1.

The driving method has been described in detail, and will not be repeated here.

Figure 18:
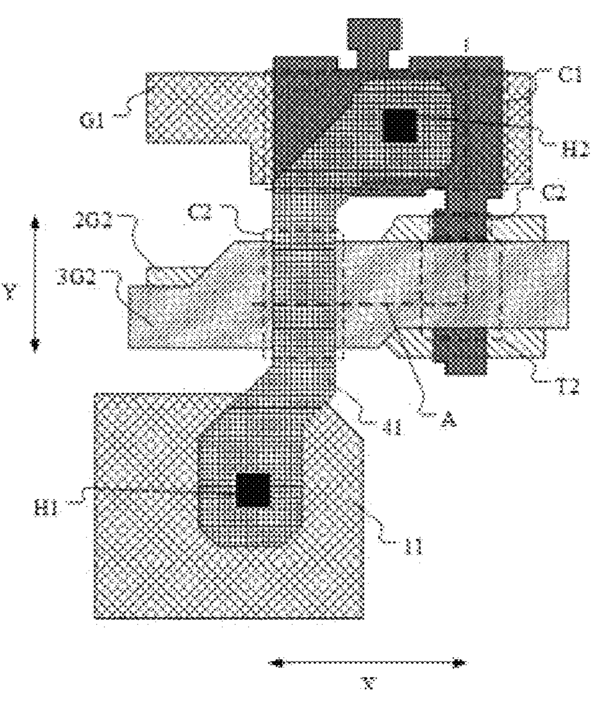
FIG. 18 is a partial structural layout of a display panel according to an embodiment of the present disclosure.
Figure 19:
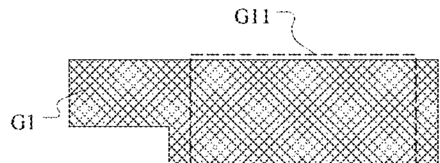
FIG. 19 is the structural layout of the first conductive layer in FIG. 18.
Figure 19:
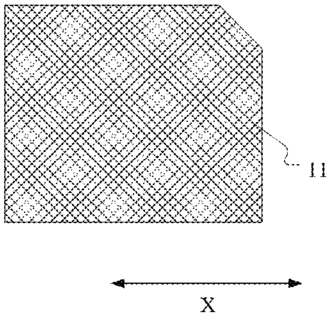
Figure 20:
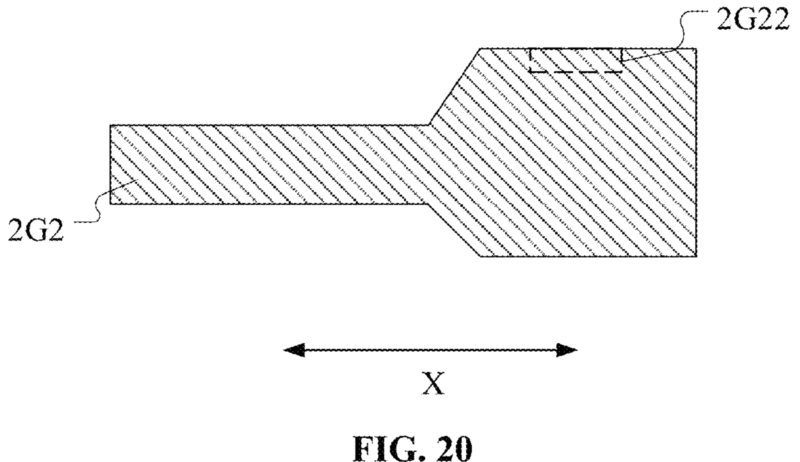
FIG. 20 is the structural layout of the second conductive layer in FIG. 18.
Figure 21:
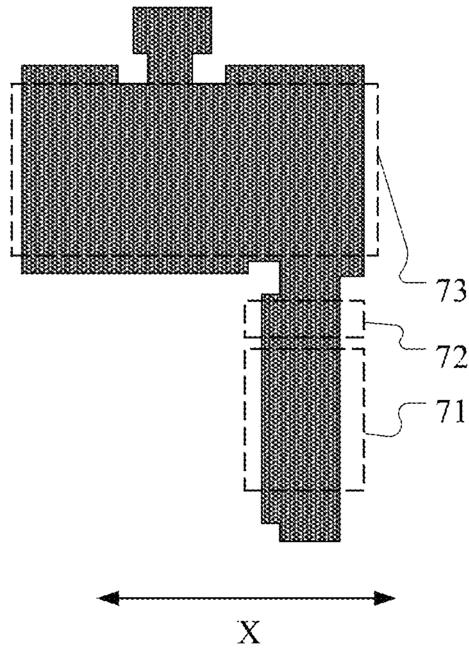
FIG. 21 is the structural layout of the second active layer in FIG. 18.
Figure 22:
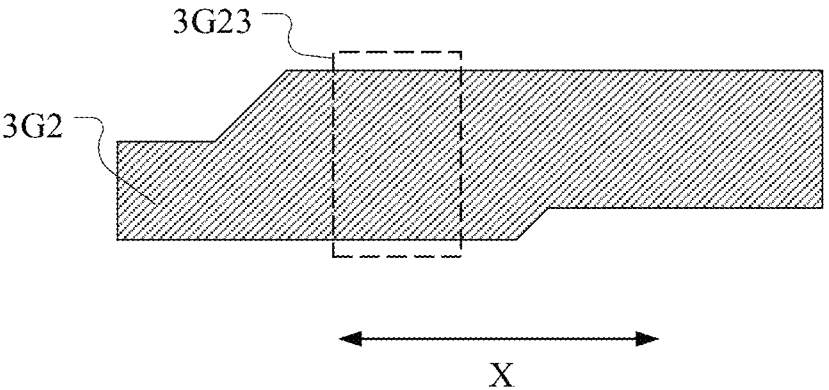
FIG. 22 is the structural layout of the third conductive layer in FIG. 18.
Figure 23:
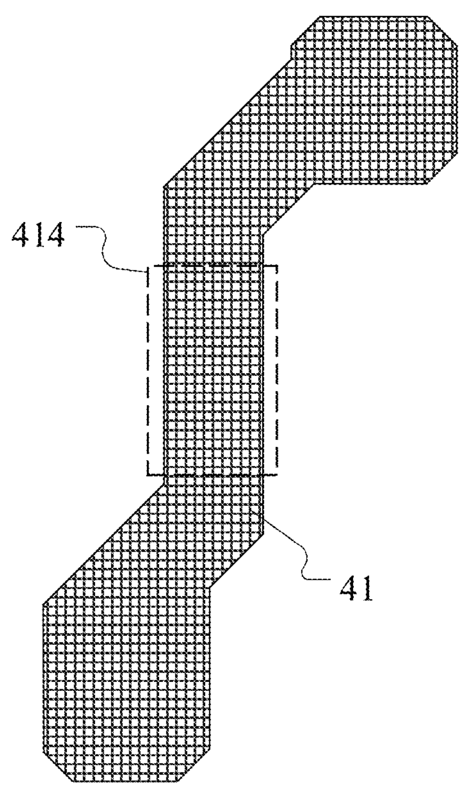
FIG. 23 is the structural layout of the fourth conductive layer in FIG. 18.
Figure 24:
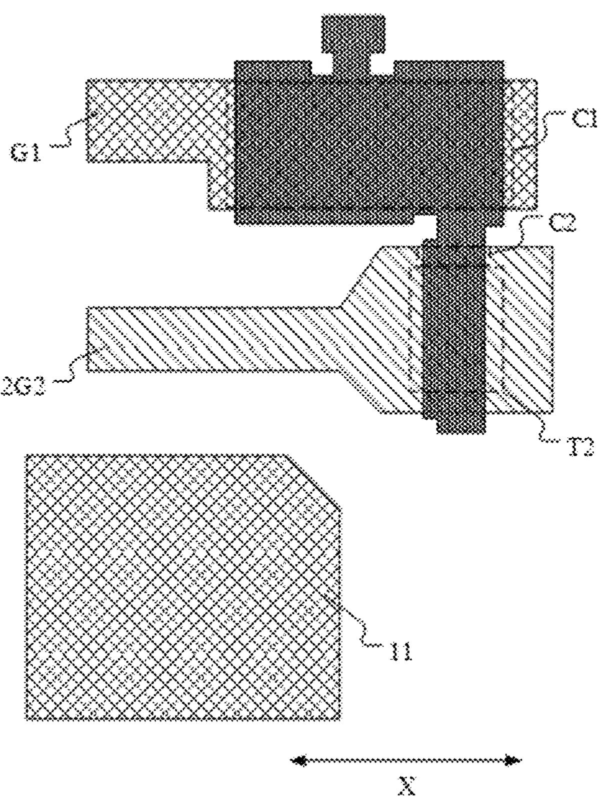
FIG. 24 is a structural layout of the first conductive layer, the second conductive layer, and the second active layer in FIG. 18.
Figure 25:
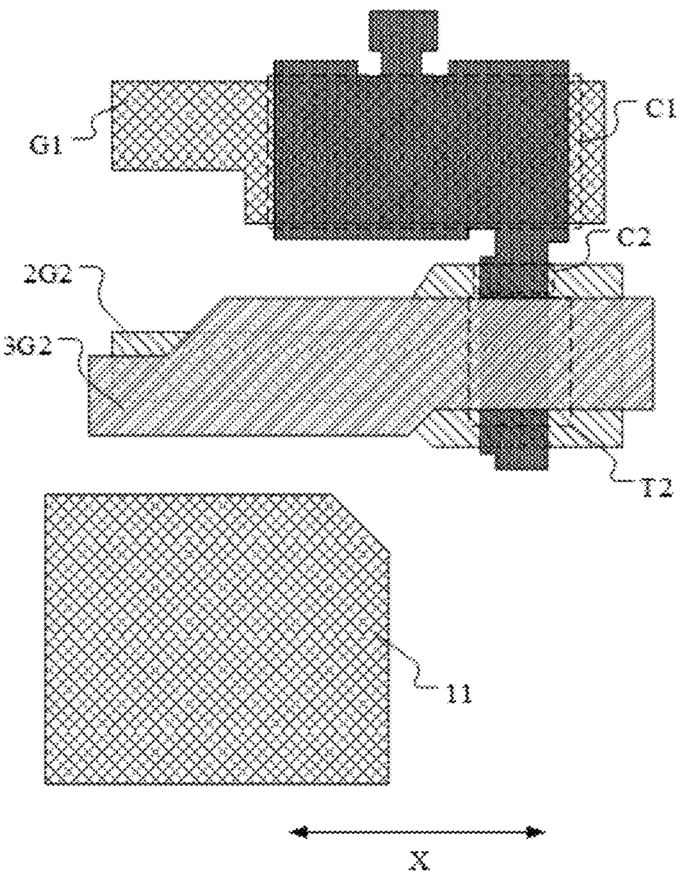
FIG. 25 is a structural layout of the first conductive layer, the second conductive layer, the second active layer, and the third conductive layer in FIG. 18.

The present exemplary embodiment also provides a display panel, wherein the display panel may include the above-mentioned pixel driving circuit. The display panel can be applied to display devices such as mobile phones, tablet computers, and televisions. The pixel driving circuit in the display panel may be as shown in FIG. 10, wherein the display panel may include a base substrate, a first conductive layer, a second conductive layer, a second active layer, a third conductive layer and a fourth conductive layer that are stacked in sequence, wherein an insulating layer may also be provided between the above-mentioned layer structure. As shown in FIGS. 18-25, FIG. 18 is a partial structural layout of an exemplary embodiment of the display panel of the present disclosure, FIG. 19 is a structural layout of the first conductive layer in FIG. 18, FIG. 20 is a structural layout of the second conductive layer in FIG. 18, FIG. 21 is the structural layout of the second active layer in FIG. 18, FIG. 22 is the structural layout of the third conductive layer in FIG. 18, FIG. 23 is the structural layout of the fourth conductive layer in FIG. 18, and FIG. 24 is the structural layout of the first conductive layer, the second conductive layer, and the second active layer in FIG. 18, and FIG. 25 is the structural layout of the first conductive layer, the second conductive layer, the second active layer, and the third conductive layer in FIG. 18.

As shown in FIGS. 18, 19, and 24, the first conductive layer may include a first conductive portion 11 and the first gate line G1, and the first conductive portion 11 may be used to form the gate electrode of the driving transistor T3, an orthographic projection of the first gate line G1 on the base substrate may extend along the first direction X, and the first gate line G1 may be connected to the gate electrode of the fourth transistor T4, for example, a partial structure of the first gate line G1 can be used to form the gate electrode of the fourth transistor.

As shown in FIGS. 18, 20 and 24, the second conductive layer may include the second gate line 2G2, and the orthographic projection of the second gate line 2G2 on the base substrate may be extended along the first direction X, the second gate line 2G2 may be connected to the gate electrode of the second transistor, for example, a part of the structure of the second gate line 2G2 may be used to form the bottom gate electrode of the second transistor.

As shown in FIGS. 18, 21 and 24, the second active layer may include a first active portion 71, a second active portion 72 and a third active portion 73, and the second active portion 72 is connected between the first active portion 71 and the third active portion 73, the first active portion 71 can be used to form the channel region of the second transistor T2, the orthographic projection of the second gate line 2G2 on the base substrate may cover the orthographic projection of the first active portion 71 on the base substrate. The material of the second active layer may be indium gallium zinc oxide.

As shown in FIGS. 18, 22 and 25, the third conductive layer may include the third gate line 3G2, and the orthographic projection of the third gate line 3G2 on the base substrate may be extended along the first direction X, the orthographic projection of the third gate line 3G2 on the base substrate can cover the orthographic projection of the first active portion 71 on the base substrate, and the part of structure of the third gate line 3G2 can be used to form the top gate electrode of the second transistor. The display panel can use the third conductive portion as a mask to conduct conduction treatment on the second active layer, that is, a region of the second active layer covered by the third conductive layer forms the channel region of the transistor, and a region of the second active layer not covered by the third conductive layer form a conductor structure.

As shown in FIGS. 18 and 23, the fourth conductive layer may include a connection portion 41, and the connection portion 41 may be connected to the first conductive portion 11 through a via hole H1, and may be connected to the third active portion 73 through a via hole H2.

Figure 26:
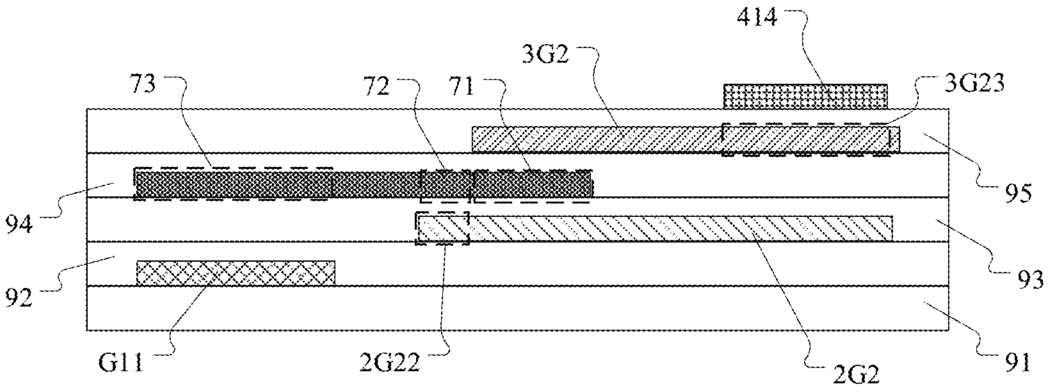
FIG. 26 is a partial cross-sectional view along dotted line A in FIG. 18.

As shown in FIG. 26, which is a partial cross-sectional view along the dotted line A in FIG. 18, the display panel may further include a first insulating layer 92, a second insulating layer 93, a third insulating layer 94, and a dielectric layer 95, wherein the base substrate 91, the first conductive layer, the first insulating layer 92, the second conductive layer, the second insulating layer 93, the second active layer, the third insulating layer 94, the third conductive layer, the dielectric layer 95, the fourth conductive layer are stacked in sequence. The first insulating layer 92, the second insulating layer 93, and the third insulating layer 94 may include silicon oxide layers. The dielectric layer 95 may include a silicon nitride layer. The material of the fourth conductive layer may include metal materials, such as molybdenum, aluminum, copper, titanium, niobium, one of them or alloys, or a molybdenum/titanium alloys or stacked layers, etc., or may be stacked layers of titanium/aluminum/titanium. The material of the first conductive layer, the second conductive layer, and the third conductive layer can be molybdenum, aluminum, copper, titanium, niobium, one of them or alloys, or molybdenum/titanium alloys or stacked layers.

As shown in FIGS. 18-26, the first gate line G1 may include a first extension portion G11, and an orthographic projection of the first extension portion G11 on the base substrate may coincide with an orthographic projection of the third active portion 73 on the base substrate, the first extension portion G11 can be used to form the first electrode of the first capacitor C1, and the third active portion 73 can be used to form the second electrode of the first capacitor C1. The second gate line 2G2 may include a second extension portion 2G22, and the orthographic projection of the second extension portion 2G22 on the base substrate may coincide with an orthographic projection of the second active portion 72 on the base substrate, and the orthographic projection of the third gate line 3G2 on the base substrate is located on a side of the orthographic projection of the second active portion 72 on the base substrate, that is, the orthographic projection of the first gate line 3G2 on the base substrate does not overlap the orthographic projection of the second active portion 72 on the base substrate. For example, as shown in FIG. 18, the orthographic projection of the third gate line 3G2 on the base substrate may be located on a side of the orthographic projection of the second active portion 72 on the base substrate in the second direction Y, and the second direction Y may intersect the first direction X, for example, the second direction Y may be perpendicular to the first direction X. The second extension portion 2G22 can be used to form part of the first electrode of the second capacitor C2, and the second active portion 72 can be used to form part of the second electrode of the second capacitor C2; the third gate line 3G2 may include a third extension portion 3G23, the connection portion 41 may include a fourth extension portion 414, and the orthographic projection of the third extension portion 3G23 on the base substrate may coincide with the orthographic projection of the fourth extension portion 414 on the base substrate, the third extension portion 3G23 can be used to form part of the first electrode of the second capacitor C2, and the fourth extension 414 can be used to form part of the second electrode of the second capacitor C2. The size of the orthographic projection of the third active portion 73 on the base substrate in the first direction X may be larger than that of the orthographic projection of the second active portion 72 on the base substrate in the first direction X, this setting can increase the capacitance value of the first capacitor C1, wherein, in this exemplary embodiment, the size of orthographic projection of the third active portion 73 on the base substrate in the first direction X can be adjusted so as to adjust the capacitance value of the first capacitor, and the size of the orthographic projection of the third active portion 73 on the base substrate in the first direction X may be 5 um-20 um, for example, 5 um, 9.7 um, 12 um, 15.55 um, 50 um. In addition, the present exemplary embodiment can also adjust the capacitance value of the first capacitor C1 by adjusting the thicknesses of the first insulating layer 92 and the second insulating layer 93 at the third active portion 73. For example, the present exemplary embodiment can reduce the thickness of the first insulating layer 92 and/or the second insulating layer 93 at the third active portion 73, to increase the capacitance value of the first capacitor C1. In this exemplary embodiment, the capacitance value of the second capacitor can also be adjusted by adjusting the size of the orthographic projection of the fourth extension portion 414 on the base substrate in the first direction X. The smaller the size of the orthographic projection of the fourth extension portion 414 on the base substrate in the first direction X is, the smaller the capacitance value of the second capacitor is, the size of the orthographic projection of the fourth extension 414 on the base substrate in the first direction may be 2 um-4 um, for example, 4 um, 3.7 um, 3.5 um, 2.95 um, 2.2 um, 2 um. In addition, in this exemplary embodiment, the capacitance value of the second capacitor can also be adjusted by adjusting the size of the orthographic projection of the second extension portion 2G22 on the base substrate in the second direction Y, and the smaller the size of the orthographic projection of the second extension portion 2G22 on the base substrate in the second direction Y is, the smaller the capacitance value of the second capacitor is.

It should be noted that, as shown in FIGS. 18 and 26, in a region where the fourth extension portion 414 is located, the orthographic projection of the third gate line 3G2 on the base substrate covers the orthographic projection of the second gate line 2G2 on the base substrate, although within the region, the orthographic projection of the second gate line 2G2 on the base substrate overlaps with the orthographic projection of the fourth extension portion 414 on the base substrate, due to the shielding effect of the third gate line 3G2, the change of the area of the orthographic projection of the second gate line 2G2 on the base substrate does not affect the capacitance value of the second capacitor. Similarly, in the region where the first extending portion G11 is located, the orthographic projection of the third active portion 73 on the base substrate covers the orthographic projection of the connecting portion 41 on the base substrate, although within the region, the orthographic projection of the connecting portion 41 on the base substrate overlaps with the orthographic projection of the first extension portion G11 on the base substrate, due to the shielding effect of the third active portion 73, the change of the area of the orthographic projection of the connection portion 41 on the base substrate in this region does not affect the capacitance value of the first capacitor.

FIGS. 27-45 are drawings of another set of exemplary embodiments of pixel driving circuits of the present disclosure.

In the embodiments of the present disclosure, a transistor refers to an element including at least three terminals of a gate electrode, a drain electrode, and a source electrode. A transistor has a channel region between the drain electrode (drain electrode terminal, drain region or drain electrode) and the source electrode (source electrode terminal, source region or source electrode), and current can flow through the drain electrode, the channel region or the source electrode. The channel region refers to a region through which current mainly flows.

Those skilled in the art can understand that the transistors used in all the embodiments of the present disclosure may be thin film transistors or field effect transistors or other devices with the same characteristics. In this specification, the first electrode may be the drain electrode and the second electrode may be the source electrode, or the first electrode may be the source electrode and the second electrode may be the drain electrode. The functions of the "source electrode" and the "drain electrode" may be interchanged when using transistors of opposite polarities or when the direction of the current changes during the operation of the circuit. Therefore, in the present disclosure, "source electrode" and "drain electrode" may be interchanged with each other.

In the present disclosure, "connected" includes a case where elements are connected together by means of an element having a certain electrical effect. The "element having a certain electrical effect" is not particularly limited as long as it can transmit and receive electrical signals between the connected elements. Examples of "elements having a certain electrical effect" include not only electrodes and wirings, but also switching elements such as transistors, resistors, inductors, capacitors, other elements having various functions, and the like.

Figure 27:
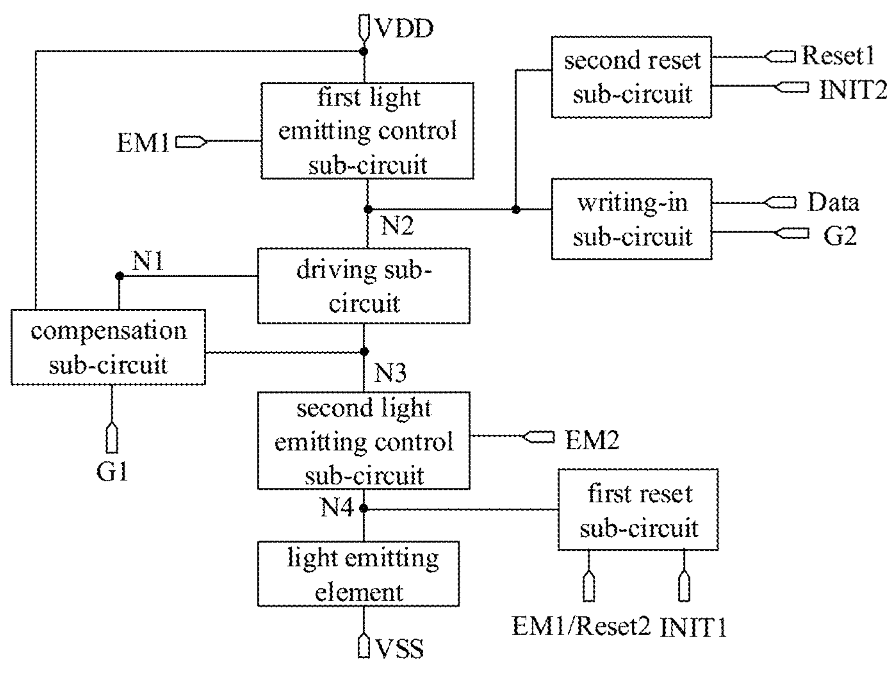
FIG. 27 is a first schematic structural diagram of a pixel circuit provided by an embodiment of the present disclosure.
Figure 28:
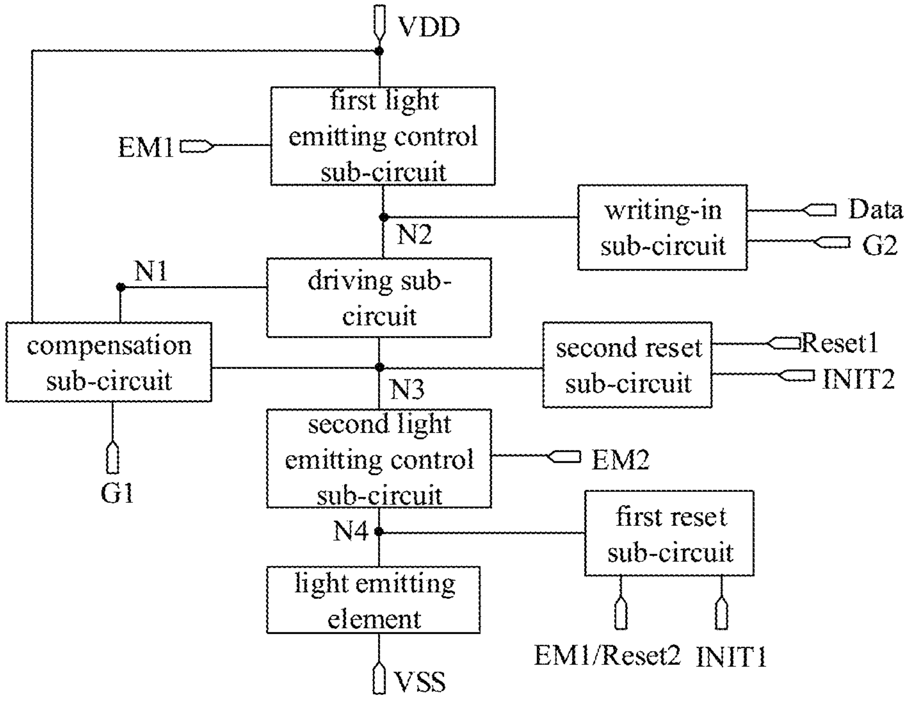
FIG. 28 is a second schematic structural diagram of a pixel circuit provided by an embodiment of the present disclosure.

FIGS. 27 and 28 are schematic structural diagrams of two types of pixel circuits according to an exemplary embodiment of the present disclosure. As shown in FIGS. 27 and 28, the pixel circuit includes a driving sub-circuit, a first reset sub-circuit, a second reset sub-circuit and the light emitting element.

Wherein, the driving sub-circuit is respectively connected to the first node N1, the second node N2 and the third node N3, and is configured to generate a driving current between the second node N2 and the third node N3 in response to the control signal of the first node N1;

The first reset sub-circuit is respectively connected to the first reset signal line INIT1 and the anode of the light emitting element, and is also connected to the first light emitting control signal line EM1 or the second reset control signal line Reset2, and is configured to write the first reset signal provided by the first reset signal line INIT1 into the anode of the light emitting element in respond to the signal of the first light emitting control signal line EM1 or the second reset control signal line Reset2;

The second reset sub-circuit is respectively connected to the first reset control signal line Reset1 and the second reset signal line INIT2, and is also connected to the second node N2 or the third node N3, and is configured to write the second reset signal provided by the second reset signal line INIT2 into the first electrode or the second electrode of the driving sub-circuit in respond to the signal of the first reset control signal line Reset1; the second reset signal is greater than the first reset signal.

In some exemplary embodiments, the absolute value of the second reset signal is greater than 1.5 times of the threshold voltage of the driving sub-circuit.

In some exemplary embodiments, the magnitude of the second reset signal is greater than zero.

Exemplarily, the second reset signal is generally a reset voltage of 4 to 10V, the first reset signal is generally a reset voltage of −2V to −6V, and the threshold voltage of the driving sub-circuit is generally −5V to −2V. Optionally, the threshold voltage of the driving sub-circuit may be −3V.

In some exemplary embodiments, as shown in FIGS. 27 and 28, the pixel circuit further includes a writing-in sub-circuit, a compensation sub-circuit, a first light emitting control sub-circuit and a second light emitting control sub-circuit.

The writing-in sub-circuit is respectively connected to the second scan signal line G2, the data signal line Data and the second node N2, and is configured to write the data signal of the data signal line Data into the second node N2 in response to the signal of the second scan signal line G2.

The compensation sub-circuit is respectively connected to the first power line VDD, the first scan signal line G1, the first node N1 and the third node N3, and is configured to write a first reset signal or a second reset signal of the third node N3 into the first node N1 in respond to the signal of the first scan signal line G1; configured to compensate the first node N1 in response to the signal of the first scan signal line G1.

The first light emitting control sub-circuit is respectively connected to the first light emitting control signal line EM1, the first power line VDD and the second node N2, and is configured to provide the second node N2 with the signal of the first power line VDD in response to the signal of the first light emitting control signal line EM1.

The second light emitting control sub-circuit is respectively connected to the second light emitting control signal line EM2, the third node N3 and the fourth node N4, and is configured to write the first reset signal of the fourth node N4 into the third node N3 in response to the signal of the second light emitting control signal line EM2; and is further configured to allow a driving current to pass between the third node N3 and the fourth node N4 in response to a signal of the second light emitting control signal line EM2.

In some exemplary embodiments, when the second reset sub-circuit writes the second reset signal into the second node N2, the driving sub-circuit is further configured to write the second reset signal of the second node N2 into the third node N3 in response to the control signal of the first node N1.

In some exemplary embodiments, as shown in FIGS. 27 and 28, one end of the light emitting element is connected to the fourth node N4, and the other end of the light emitting element is connected to the second power line VSS.

Figure 29:
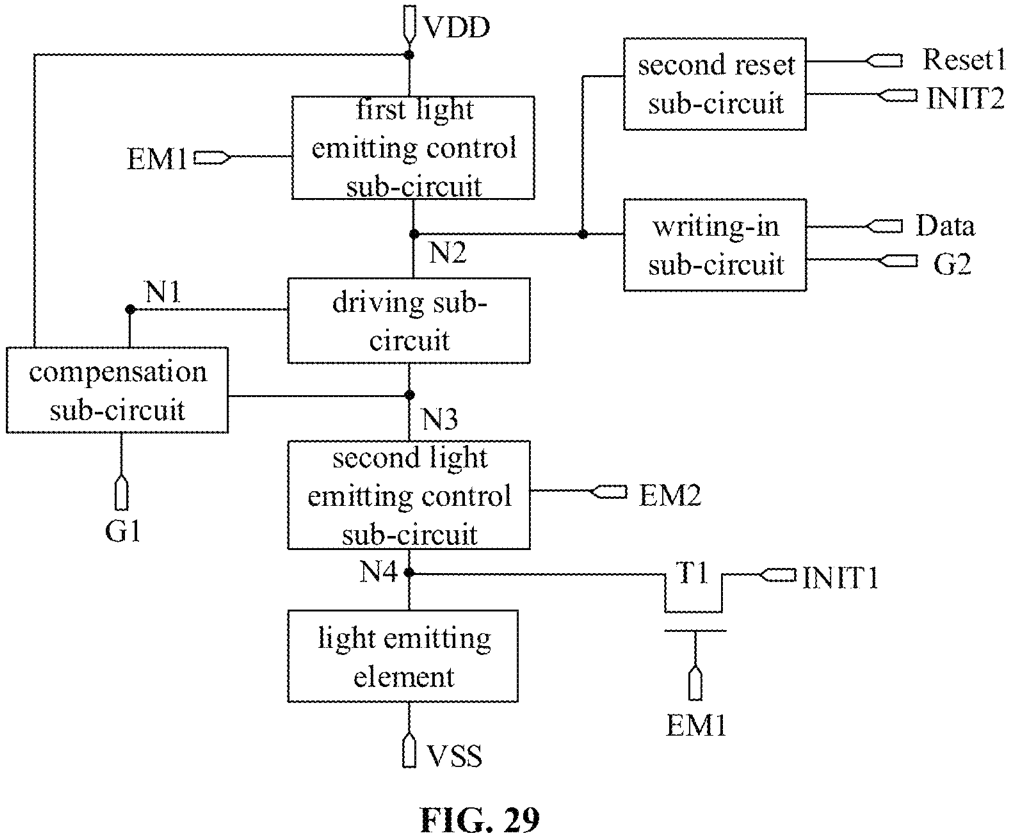
FIG. 29 is a schematic structural diagram of a first reset sub-circuit provided by an embodiment of the present disclosure.

In some exemplary embodiments, as shown in FIG. 29, the first reset sub-circuit includes a first transistor T1.

The control electrode of the first transistor T1 is connected to the first light emitting control signal line EM1 or the second reset control signal line Reset2 (not shown in the figure), and the first electrode of the first transistor T1 is connected to the first reset signal line INIT1, the second electrode of the first transistor T1 is connected to the fourth node N4.

FIG. 29 shows an exemplary structure of the first reset sub-circuit. Those skilled in the art can easily understand that the implementation of the first reset sub-circuit is not limited to this, as long as its function can be realized.

Figure 30:
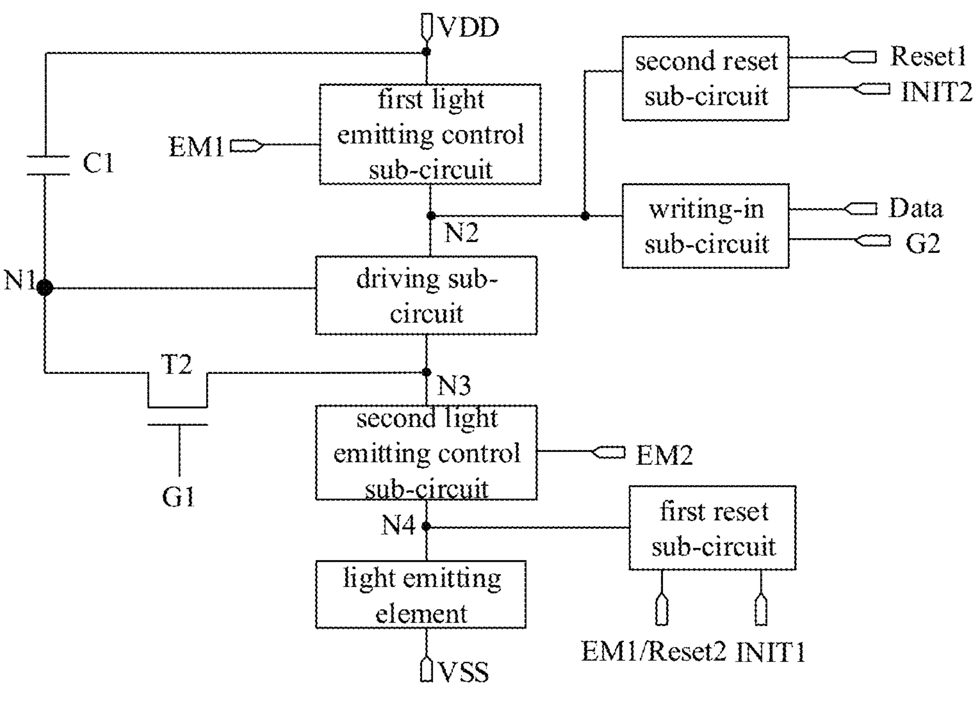
FIG. 30 is a schematic structural diagram of a compensation sub-circuit provided by an embodiment of the present disclosure.

In some exemplary embodiments, as shown in FIG. 30, the compensation sub-circuit includes a second transistor T2 and a first capacitor C1.

The control electrode of the second transistor T2 is connected to the first scan signal line G1, the first electrode of the second transistor T2 is connected to the third node N3, and the second electrode of the second transistor T2 is connected to the first node N1.

One end of the first capacitor C1 is connected to the first node N1, and the other end of the first capacitor C1 is connected to the first power line VDD.

FIG. 30 shows an exemplary structure of the compensation sub-circuit. Those skilled in the art can easily understand that the implementation of the compensation sub-circuit is not limited to this, as long as its function can be realized.

Figure 31:
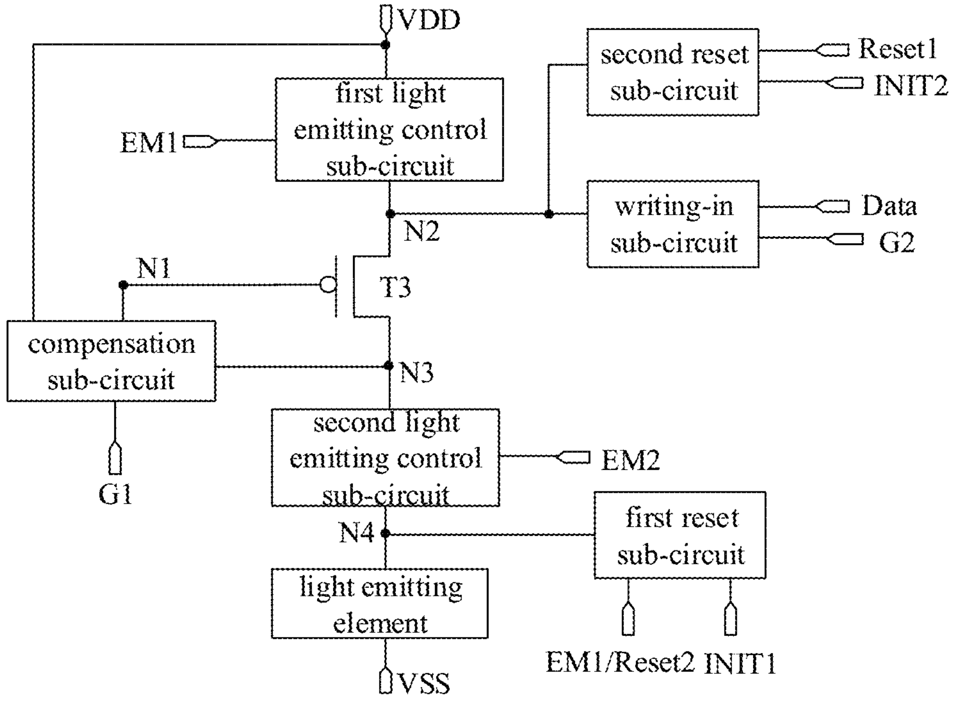
FIG. 31 is a schematic structural diagram of a driving sub-circuit provided by an embodiment of the present disclosure.

In some exemplary embodiments, as shown in FIG. 31, the driving sub-circuit includes a third transistor T3.

The control electrode of the third transistor T3 is connected to the first node N1, the first electrode of the third transistor T3 is connected to the second node N2, and the second electrode of the third transistor T3 is connected to the third node N3.

FIG. 31 shows an exemplary structure of the driving sub-circuit. Those skilled in the art can easily understand that the implementation of the driving sub-circuit is not limited to this, as long as its function can be realized.

Figure 32:
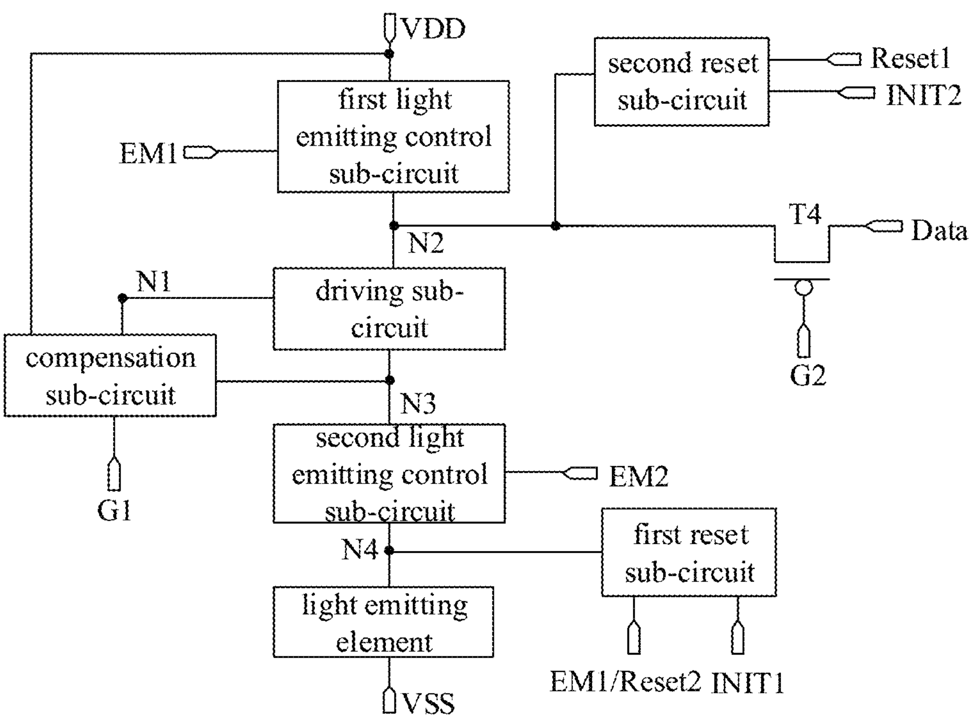
FIG. 32 is a schematic structural diagram of a writing-in-in sub-circuit provided by an embodiment of the present disclosure.

In some exemplary embodiments, as shown in FIG. 32, the writing-in sub-circuit includes a fourth transistor T4.

The control electrode of the fourth transistor T4 is connected to the second scan signal line G2, the first electrode of the fourth transistor T4 is connected to the data signal line Data, and the second electrode of the fourth transistor T4 is connected to the second node N2.

FIG. 32 shows an exemplary structure of the writing-in sub-circuit. Those skilled in the art can easily understand that the implementation of the writing-in sub-circuit is not limited to this, as long as its function can be realized.

Figure 33:
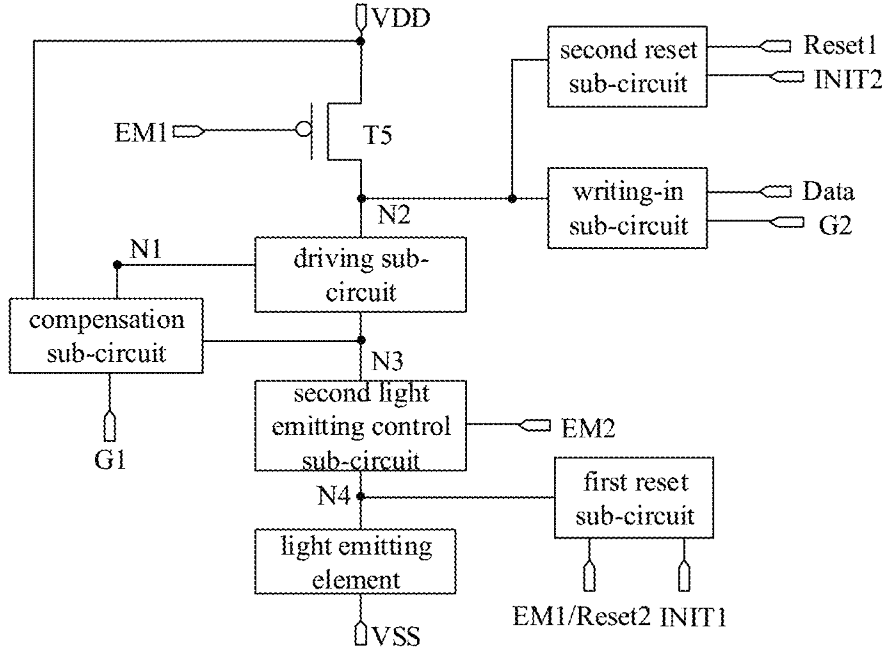
FIG. 33 is a schematic structural diagram of a first light emitting control sub-circuit according to an embodiment of the present disclosure.

In some exemplary embodiments, as shown in FIG. 33, the first light emitting control sub-circuit includes a fifth transistor T5.

The control electrode of the fifth transistor T5 is connected to the first light emitting control signal line EM1, the first electrode of the fifth transistor T5 is connected to the first power line VDD, and the second electrode of the fifth transistor T5 is connected to the second node N2.

FIG. 33 shows an exemplary structure of the first light emitting control sub-circuit. Those skilled in the art can easily understand that the implementation of the first light emitting control sub-circuit is not limited to this, as long as its function can be realized.

Figure 34:
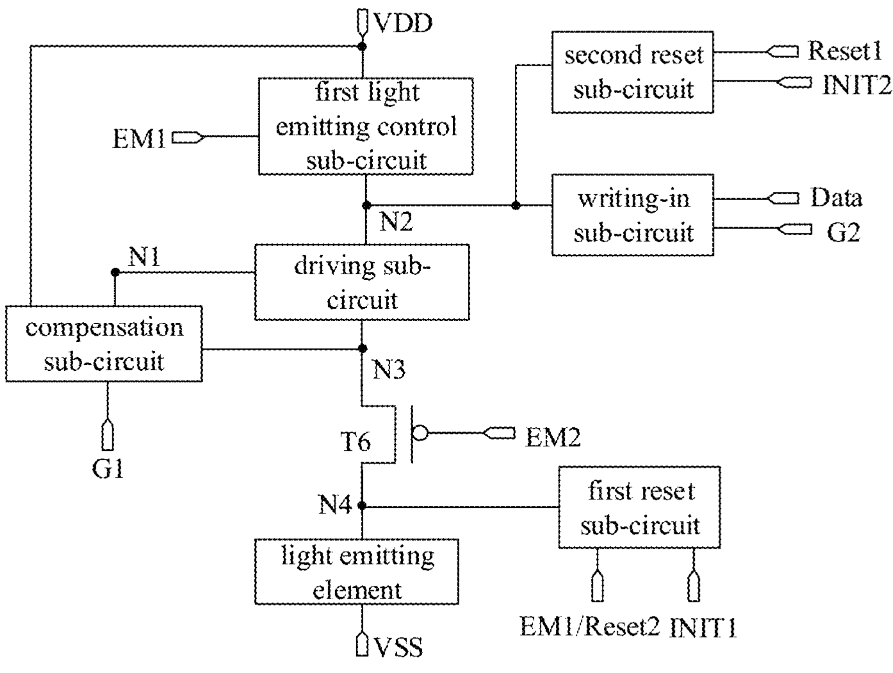
FIG. 34 is a schematic structural diagram of a second light emitting control sub-circuit according to an embodiment of the present disclosure.

In some exemplary embodiments, as shown in FIG. 34, the second light emitting control sub-circuit includes a sixth transistor T6.

The control electrode of the sixth transistor T6 is connected to the second light emitting control signal line EM2, the first electrode of the sixth transistor T6 is connected to the third node N3, and the second electrode of the sixth transistor T6 is connected to the fourth node N4.

FIG. 34 shows an exemplary structure of the second light emitting control sub-circuit. Those skilled in the art can easily understand that the implementation of the second light emitting control sub-circuit is not limited to this, as long as its function can be realized.

Figure 35:
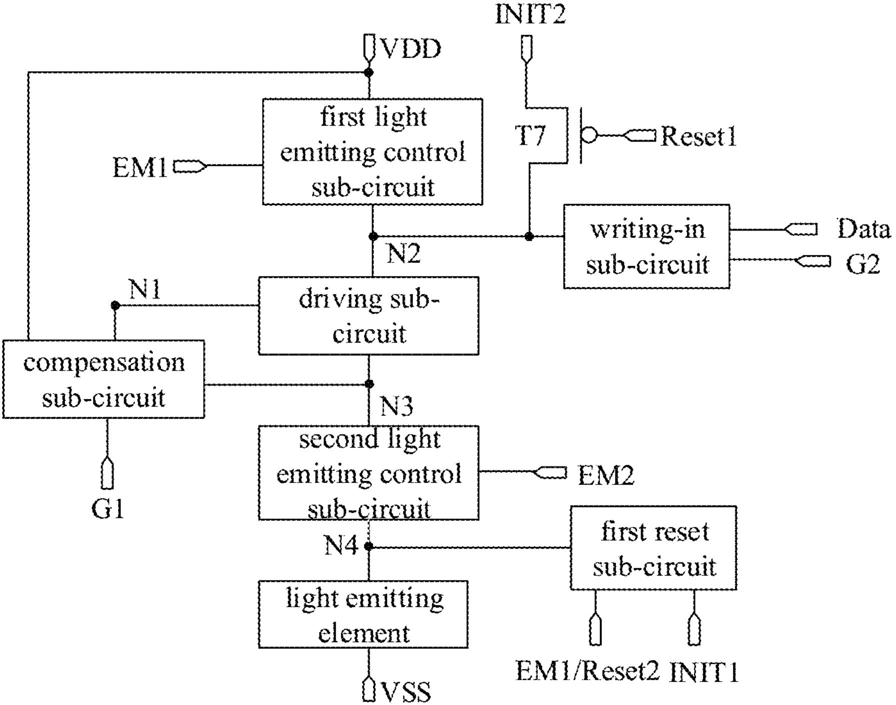
FIG. 35 is the first schematic structural diagram of the second reset sub-circuit provided by the embodiment of the present disclosure.

In some exemplary embodiments, as shown in FIG. 35, the second reset sub-circuit includes a seventh transistor T7.

The control electrode of the seventh transistor T7 is connected to the reset control signal line Reset, the first electrode of the seventh transistor T7 is connected to the second reset signal line INIT2, and the second electrode of the seventh transistor T7 is connected to the second node N2.

Figure 36:
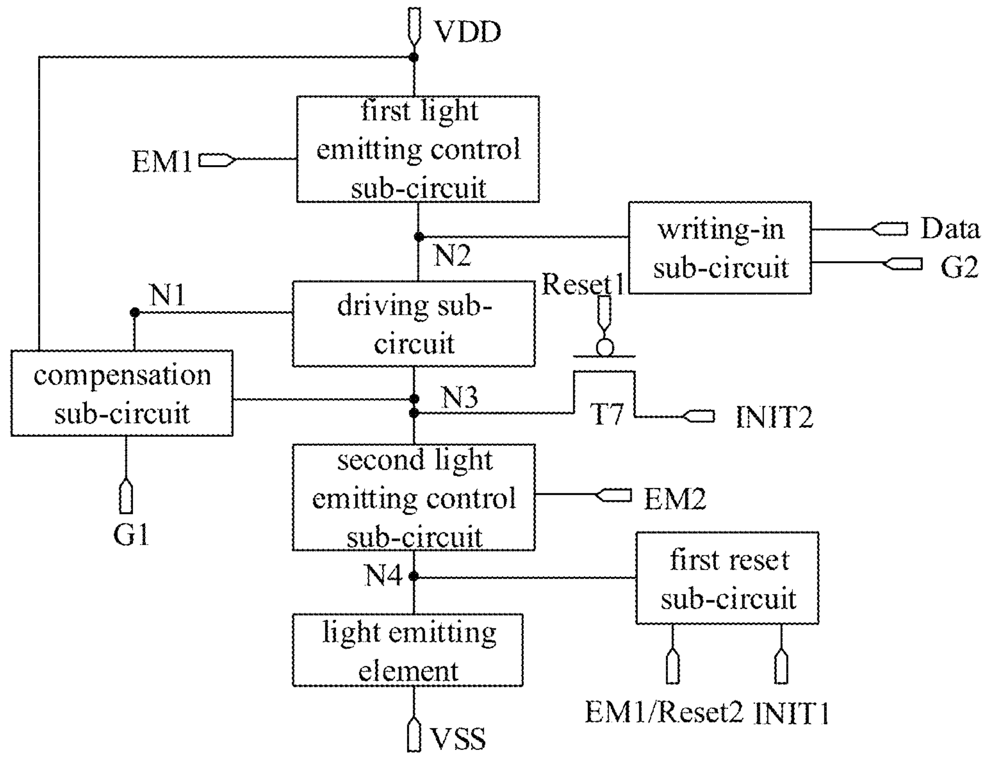
FIG. 36 is the second schematic structural diagram of the second reset sub-circuit provided by the embodiment of the present disclosure.

In some exemplary embodiments, as shown in FIG. 36, the second reset sub-circuit includes a seventh transistor T7.

The control electrode of the seventh transistor T7 is connected to the reset control signal line Reset, the first electrode of the seventh transistor T7 is connected to the second reset signal line INIT2, and the second electrode of the seventh transistor T7 is connected to the third node N3.

FIGS. 35 and 36 show two exemplary structures of the second reset sub-circuit. Those skilled in the art can easily understand that the implementation of the second reset sub-circuit is not limited to this, as long as its function can be realized.

In some exemplary embodiments, as shown in FIG. 37*a* or FIG. 37*b*, the first reset sub-circuit includes a first transistor T1, the compensation sub-circuit includes a second transistor T2 and a first capacitor C1, and the driving sub-circuit includes a third transistor T3, the writing-in sub-circuit includes a fourth transistor T4, the first light emitting control sub-circuit includes a fifth transistor T5, the second light emitting control sub-circuit includes a sixth transistor T6, and the second reset sub-circuit includes a seventh transistor T7.

The control electrode of the first transistor T1 is connected to the first light emitting control signal line EM1, the first electrode of the first transistor T1 is connected to the first reset signal line INIT1, and the second electrode of the first transistor T1 is connected to the fourth node N4.

The control electrode of the second transistor T2 is connected to the first scan signal line G1, the first electrode of the second transistor T2 is connected to the third node N3, and the second electrode of the second transistor T2 is connected to the first node N1.

One end of the first capacitor C1 is connected to the first node N1, and the other end of the first capacitor C1 is connected to the first power line VDD.

The control electrode of the third transistor T3 is connected to the first node N1, the first electrode of the third transistor T3 is connected to the second node N2, and the second electrode of the third transistor T3 is connected to the third node N3.

The control electrode of the fourth transistor T4 is connected to the second scan signal line G2, the first electrode of the fourth transistor T4 is connected to the data signal line Data, and the second electrode of the fourth transistor T4 is connected to the second node N2.

The control electrode of the fifth transistor T5 is connected to the first light emitting control signal line EM1, the first electrode of the fifth transistor T5 is connected to the first power line VDD, and the second electrode of the fifth transistor T5 is connected to the second node N2.

The control electrode of the sixth transistor T6 is connected to the second light emitting control signal line EM2, the first electrode of the sixth transistor T6 is connected to the third node N3, and the second electrode of the sixth transistor T6 is connected to the fourth node N4.

The control electrode of the seventh transistor T7 is connected to the first reset control signal line Reset1, the first electrode of the seventh transistor T7 is connected to the second reset signal line INIT2, and the second electrode of the seventh transistor T7 is connected to the second node N2 or the third Node N3.

FIGS. 37*a* and 37*b* show two example structures of the first reset sub-circuit, the compensation sub-circuit, the driving sub-circuit, the writing-in sub-circuit, the first light emitting control sub-circuit, the second light emitting control sub-circuit, and the second reset sub-circuit. It can be easily understood by those skilled in the art that the implementation of the above sub-circuits is not limited to this, as long as their functions can be realized. Since the number of transistors in the pixel circuit of the present disclosure is less, the pixel circuit occupies less space, thereby improving the pixel resolution of the display device.

In some exemplary embodiments, the second reset signal line INIT2 may be the same voltage line as at least one of the following: the first power line VDD, the first light emitting control signal line EM1, the second light emitting control signal line EM2 or the third power line, the third power line provides a third power voltage, and the third power voltage is greater than the first reset voltage provided by the first reset signal line INIT1.

In some exemplary embodiments, the pulse width of the signal of the reset control signal line Reset is substantially the same as the pulse width of the signal of the second scan signal line G2.

In some exemplary embodiments, the signal pulse of the first light emitting control signal line EM1 and the signal pulse of the second light emitting control signal line EM2 differ by one or two time units h, and one time unit h is the scan time of one row of sub-pixels.

Figure 38A:
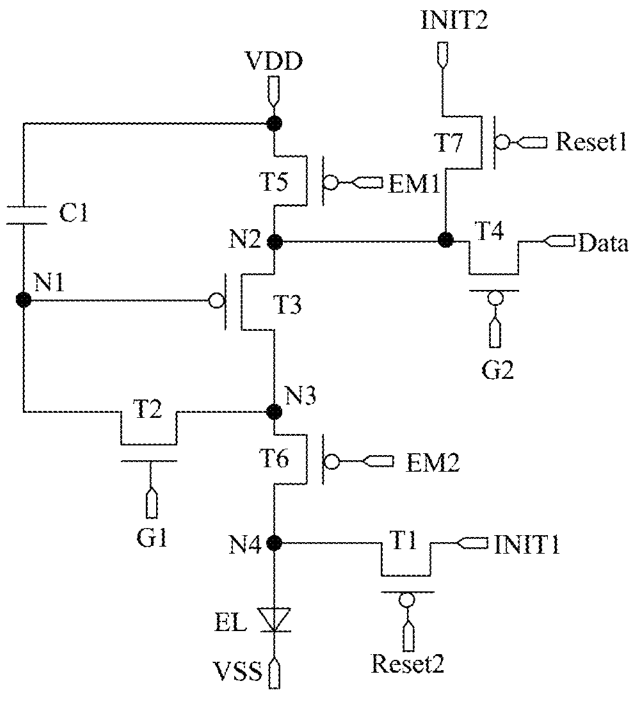
Figure 38B:
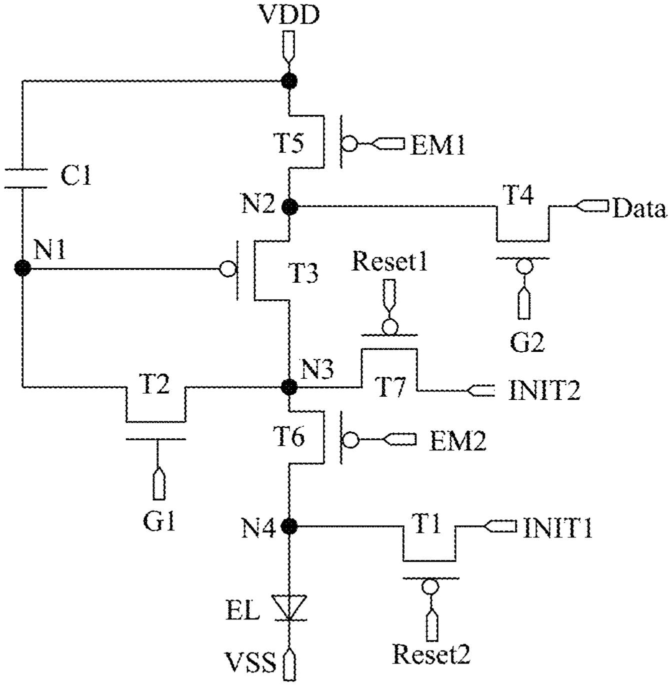

In some exemplary embodiments, as shown in FIG. 38*a* or FIG. 38*b*, the first reset sub-circuit includes a first transistor T1, the compensation sub-circuit includes a second transistor T2 and a first capacitor C1, and the driving sub-circuit includes a third transistor T3, the writing-in sub-circuit includes a fourth transistor T4, the first light emitting control sub-circuit includes a fifth transistor T5, the second light emitting control sub-circuit includes a sixth transistor T6, and the second reset sub-circuit includes a seventh transistor T7.

The control electrode of the first transistor T1 is connected to the second reset control signal line Reset2, the first electrode of the first transistor T1 is connected to the first reset signal line INIT1, and the second electrode of the first transistor T1 is connected to the fourth node N4.

The control electrode of the second transistor T2 is connected to the first scan signal line G1, the first electrode of the second transistor T2 is connected to the third node N3, and the second electrode of the second transistor T2 is connected to the first node N1.

One end of the first capacitor C1 is connected to the first node N1, and the other end of the first capacitor C1 is connected to the first power line VDD.

The control electrode of the third transistor T3 is connected to the first node N1, the first electrode of the third transistor T3 is connected to the second node N2, and the second electrode of the third transistor T3 is connected to the third node N3.

The control electrode of the fourth transistor T4 is connected to the second scan signal line G2, the first electrode of the fourth transistor T4 is connected to the data signal line Data, and the second electrode of the fourth transistor T4 is connected to the second node N2.

The control electrode of the fifth transistor T5 is connected to the first light emitting control signal line EM1, the first electrode of the fifth transistor T5 is connected to the first power line VDD, and the second electrode of the fifth transistor T5 is connected to the second node N2.

The control electrode of the sixth transistor T6 is connected to the second light emitting control signal line EM2, the first electrode of the sixth transistor T6 is connected to the third node N3, and the second electrode of the sixth transistor T6 is connected to the fourth node N4.

The control electrode of the seventh transistor T7 is connected to the first reset control signal line Reset1, the first electrode of the seventh transistor T7 is connected to the second reset signal line INIT2, and the second electrode of the seventh transistor T7 is connected to the second node N2 or the third Node N3.

FIGS. 38*a* and 38*b* show the other two structures of the first reset sub-circuit, the compensation sub-circuit, the driving sub-circuit, the writing-in sub-circuit, the first light emitting control sub-circuit, the second light emitting control sub-circuit, and the second reset sub-circuit. It can be easily understood by those skilled in the art that the implementation of the above sub-circuits is not limited to this, as long as their functions can be realized.

In some exemplary embodiments, the light emitting element EL may be an organic light emitting diode (OLED), or may be a Mini Light Emitting Diodes, a micro light emitting diode, a quantum Point light emitting diodes (QLED) and other types of light emitting diodes. In practical applications, the structure of the light emitting element EL needs to be designed and determined according to the actual application environment, which is not limited here. The following description will be given by taking the light emitting element EL as an organic light emitting diode as an example.

In some exemplary embodiments, at least one of the first transistor T1, the second transistor T2 and the seventh transistor T7 is a first type transistor, the first type transistor includes an N-type transistor or a P-type transistor, and the third transistor T3 to the sixth transistor T6 are second-type transistors, the second-type transistor includes a P-type transistor or an N-type transistor, and the second-type transistor is different from the first-type transistor, that is, when the first-type transistor is an N-type transistor, the second-type transistor is a P-type transistor, and when the first-type transistor is a P-type transistor, the second-type transistor is an N-type transistor.

In some exemplary embodiments, as shown in FIGS. 37*a* and 37*b*, the first transistor T1 and the second transistor T2 are all N-type thin film transistors, and the third transistor T3 to the seventh transistor T7 are all P-type thin film transistors.

In some exemplary embodiments, the first transistor T1, the second transistor T2 and the seventh transistor T7 are all N-type thin film transistors, and the third transistor T3 to the sixth transistor T6 are all P-type thin film transistors.

In some exemplary embodiments, as shown in FIGS. 38*a* and 38*b*, the second transistor T2 is an N-type thin film transistor, and the first transistor T1 and the third to seventh transistors T3 to T7 are all P-type thin film transistors.

In some exemplary embodiments, the N-type thin film transistor may be a Low Temperature Poly Silicon (LTPS) thin film transistor (TFT), and the P-type thin film transistor may be Indium Gallium Zinc Oxide (IGZO) thin film transistor; or, the N-type thin film transistor can be an IGZO thin film transistor, and the P-type thin film transistor can be an LTPS thin film transistor.

In some exemplary embodiments, the first transistor T1 and the second transistor T2 are both IGZO thin film transistors, and the third transistor T3 to the seventh transistor T7 are all LTPS thin film transistors.

In this embodiment, the indium gallium zinc oxide thin film transistor generates less leakage current than the low temperature polysilicon thin film transistor. Therefore, by setting the first transistor T1 and the second transistor T2 as indium gallium zinc oxide thin film transistors, it is possible to significantly reduce the leakage current of the control electrode of the driving transistor in the light emitting phase, thereby improving the low-frequency and low-brightness flickering problem of the display panel.

In some exemplary embodiments, the first transistor T1, the second transistor T2 and the seventh transistor T7 are all IGZO thin film transistors, and the third transistor T3 to the sixth transistor T6 are all LTPS thin film transistors.

In some exemplary embodiments, the second transistor T2 is an IGZO thin film transistor, and the first transistor T1 and the third transistor T3 to the seventh transistor T7 are all LTPS thin film transistors. In some exemplary embodiments, the first capacitor C1 may be a liquid crystal capacitor composed of a pixel electrode and a common electrode, or an equivalent capacitor composed of a liquid crystal capacitor composed of a pixel electrode and a common electrode, and a storage capacitor. This is not limited.

FIG. 39 is a timing sequence of the operation of the pixel circuit shown in FIG. 37*a* or FIG. 37*b* in one scan period. In the following, in the pixel circuit provided by the embodiment of the present disclosure, the first transistor T1 and the second transistor T2 are N-type transistors, and the third transistor T3 to the seventh transistor T7 are all P-type transistors as an example, combined with the pixel circuit shown in FIG. 11*a* and the operation timing diagram shown in FIG. 39, the work process of one pixel circuit in one frame period is described. As shown in FIG. 37*a*, the pixel circuit provided by the embodiment of the present disclosure includes 7 transistor units (T1-T7), 1 capacitor unit (C1), and 3 voltage lines (VDD, VSS, INIT1, since the second reset signal line INIT2 can be the same voltage line as any one of the first power line VDD, the first light emitting control signal line EM1 and the second light emitting control signal line EM2, the second reset signal line INIT2 is not included in the above three voltage lines), wherein the first power line VDD continuously provides a high-level signal, the second power line VSS continuously provides a low-level signal, and the first reset signal line INIT1 provides a first reset voltage (initial voltage signal). As shown in FIG. 39, the working process includes:

In the first phase t1, that is the reset phase, the first scan signal line G1, the second scan signal line G2, the first reset control signal line Reset1 and the first light emitting control signal line EM1 are at the high level, and the second light emitting control signal line EM2 is at the low level. The first light emitting control signal line EM1 is at a high level, so that the first transistor T1 is turned on and the fourth node N4 (i.e., the anode of the light emitting element EL) is reset to the first reset voltage of the first reset signal line INIT1. The second light emitting control signal line EM2 is at a low level, so that the sixth transistor T6 is turned on; the first scan signal line G1 is at a high level, so that the second transistor T2 is turned on, and the first node N1 (i.e., the gate electrode of the third transistor T3 and one end of the first capacitor C1) and the third node N3 are reset to the first reset voltage of the first reset signal line INIT1. At this phase, the fourth transistor T4, the fifth transistor T5 and the seventh transistor T7 are maintained to be off, as shown in FIG. 41.

In the second phase t2, that is the reconfiguration phase, the first scan signal line G1, the second scan signal line G2, the first light emitting control signal line EM1 and the second light emitting control signal line EM2 are at a high level, and the first reset control signal line Reset is at the low level. The second light emitting control signal line EM2 is at a high level, so that the sixth transistor T6 is turned off. The first reset control signal line Reset1 is at a low level, so that the seventh transistor T7 is turned on (The timing is described by taking the seventh transistor T7 being a P type TFT as an example, when the seventh transistor T7 is an N type TFT, the first reset control signal line Reset1 provides a high-level signal in the second phase t2, and provides a low-level signal in other phases), the second node N2 is reset to a second reset voltage, wherein the second reset voltage may be the first power line VDD, the first light emitting control signal line EM1, the second light emitting control signal line EM2 or the third power line, the second reset voltage is greater than the first reset voltage, since the first node N1 is the first reset voltage of the first reset signal line INIT1, the third transistor T3 is turned on, the first scan signal line G1 is at a high level, the second transistor T2 is turned on, and the voltage of the second node N2 is transmitted to the first node N1 through the third transistor T3 and the second transistor T2. At this phase, the fourth transistor T4, the fifth transistor T5 and the sixth transistor T6 are maintained to be off, as shown in FIG. 42.

In the third phase t3, that is the data writing-in phase, the first scan signal line G1, the first reset control signal line Reset1, the first light emitting control signal line EM1 and the second light emitting control signal line EM2 are at a high level, and the second scan signal line G2 is at a low level. At this time, the second scan signal line G2 is at a low level, so that the fourth transistor T4 is turned on, and the data voltage signal Vdata outputted by the data signal line Data is applied to the first node N1 through the fourth transistor T4, the third transistor T3 and the second transistor T2 that are turned on, and the sum of the data voltage signal Vdata outputted by the data signal line Data and the threshold voltage Vth of the third transistor T3 is stored on the first capacitor C1. At this phase, the fifth transistor T5, the sixth transistor T6 and the seventh transistor T7 are maintained to be off, as shown in FIG. 43.

In the fourth phase t4, that is the light emitting phase, the second scan signal line G2 and the first reset control signal line Reset1 are at a high level, and the first scan signal line G1, the first light emitting control signal line EM1 and the second light emitting control signal line EM2 are at the low level. The first light emitting control signal line EM1 is at a low level, so that the fifth transistor T5 is turned on, the first transistor T1 is turned off, and the second light emitting control signal line EM2 is at a low level, so that the sixth transistor T6 is turned on, and the power supply voltage outputted by first power line VDD provides a driving voltage to the fourth node N4 (i.e., the anode of the light emitting element EL) through the fifth transistor T5, the third transistor T3 and the sixth transistor T6 that are turned on, and the light emitting element EL is driven to emit light. At this phase, the first transistor T1, the second transistor T2, the fourth transistor T4 and the seventh transistor T7 are maintained to be off, as shown in FIG. 44.

FIG. 40 is a timing sequence of the operation of the pixel circuit shown in FIG. 38*a* or 38*b* in one scan period. In the pixel circuit provided by the embodiment of the present disclosure, the second transistor T2 is an N-type transistor, and the first transistor T1 and the third transistor T3 to the seventh transistor T7 are all P-type transistors, combined with the pixel circuit shown in FIG. 38*a* and the work timing diagram shown in FIG. 40, the operation process of one pixel circuit in one frame period is described. As shown in FIG. 38*a*, the pixel circuit provided by the embodiment of the present disclosure includes 7 transistor units (T1-T7), 1 capacitor unit (C1), and 3 voltage lines (VDD, VSS, INIT1, since the second reset signal line INIT2 can be the same voltage line as any one of the first power line VDD, the first light emitting control signal line EM1 and the second light emitting control signal line EM2, the second reset signal line INIT2 is not included in the above three voltage lines), wherein the first power line VDD continuously provides a high-level signal, the second power line VSS continuously provides a low-level signal, and the first reset signal line INIT1 provides a first reset voltage (initial voltage signal). As shown in FIG. 40, the working process includes:

In the first phase A1, that is the reset phase, the first scan signal line G1, the second scan signal line G2, the first reset control signal line Reset1 and the first light emitting control signal line EM1 are at a high level, and the second reset control signal line Reset2 and the second light emitting control signal line EM2 is at a low level. The first transistor T1, the sixth transistor T6 and the second transistor T2 are turned on, the fourth node N4 (i.e. the anode of the light emitting element EL), the third node N3 and the first node N1 (i.e. the gate electrode of the third transistor T3 and one end of the first capacitor C1) are reset to the first reset voltage of the first reset signal line INIT1. At this phase, the fourth transistor T4, the fifth transistor T5 and the seventh transistor T7 are maintained to be off.

In the second phase A2, that is the reconfiguration phase, the first scan signal line G1, the second scan signal line G2, the second reset control signal line Reset2, the first light emitting control signal line EM1 and the second light emitting control signal line EM2 are high level, the first reset control signal line Reset1 is at a low level. The second light emitting control signal line EM2 is at a high level, so that the sixth transistor T6 is turned off. The first reset control signal line Reset1 is at a low level, so that the seventh transistor T7 is turned on (the timing is described by taking the seventh transistor T7 being P type TFT as an example, when the seventh transistor is N type TFT, the first reset control signal line Reset1 provides a high-level signal in the second phase A2 and provides a low-level signal in other phases), the second node N2 is reset to a second reset voltage, wherein the second reset voltage may be the first power line VDD, the first light emitting control signal line EM1, the second light emitting control signal line EM2 or the power signal provided by the third power line, the second reset voltage is greater than the first reset voltage, since the first node N1 is the first reset voltage of the first reset signal line INIT1, the third transistor T3 is turned on, the first scan signal line G1 is at a high level, the second transistor T2 is turned on, and the voltage of the second node N2 is transmitted to the first node N1 through the third transistor T3 and the second transistor T2. At this phase, the fourth transistor T4, the fifth transistor T5 and the sixth transistor T6 are maintained to be off.

In the third phase A3, that is the data writing-in phase, the first scan signal line G1, the second reset control signal line Reset2, the first reset control signal line Reset1, the first light emitting control signal line EM1 and the second light emitting control signal line EM2 are at a high level, the second scan signal line G2 is at a low level. At this time, the second scan signal line G2 is at a low level, so that the fourth transistor T4 is turned on, and the data voltage signal Vdata outputted by the data signal line Data is provided to the first node N1 through the fourth transistor T4, the third transistor T3 and the second transistor T2 that are turned on. and the sum of the data voltage signal Vdata outputted by the data signal line Data and the threshold voltage Vth of the third transistor T3 is stored on the first capacitor C1. At this phase, the fifth transistor T5, the sixth transistor T6 and the seventh transistor T7 are maintained to be off.

In the fourth phase A4, that is the light emitting phase, the second scan signal line G2, the second reset control signal line Reset2 and the first reset control signal line Reset1 are at high level, and the first scan signal line G1 and the first light emitting control signal line EM1 and the second light emitting control signal line EM2 is at a low level. The first light emitting control signal line EM1 is at a low level, so that the fifth transistor T5 is turned on, and the second reset control signal line Reset2 is at a high level, so that the first transistor T1 is turned off, the second light emitting control signal line EM2 is at a low level, so that the sixth transistor T6 is turned on, and the power supply voltage outputted by the first power line VDD provides a driving voltage to the fourth node N4 (i.e., the anode of the light emitting element EL) through the fifth transistor T5, third transistor T3 and The sixth transistor T6 that are turned on, and the light emitting element EL is driven to emit light. At this phase, the first transistor T1, the second transistor T2, the fourth transistor T4 and the seventh transistor T7 are maintained to be off.

During the driving process of the pixel circuit, the driving current flowing through the third transistor T3 (i.e., the driving transistor) is determined by the voltage difference between the gate electrode and the first electrode of the third transistor. Since the voltage of the first node N1 is Vdata+ Vth, the driving current of the third transistor T3 is:

$$I = K*(Vgs-Vth)2 = K*[(Vdata+Vth-Vdd)-Vth]2 = K*[(Vdata-Vdd)]2$$

Wherein, I is the driving current flowing through the third transistor T3, that is, the driving current driving the light emitting element EL, K is a constant, Vgs is the voltage difference between the gate electrode and the first electrode of the third transistor T3, and Vth is the threshold voltage of the third transistor T3, Vdata is the data voltage outputted by the data signal line Data, and Vdd is the power supply voltage outputted by the first power line VDD.

It can be seen from the above formula that the current I flowing through the light emitting element EL is not related to the threshold voltage Vth of the third transistor T3, which eliminates the influence of the threshold voltage Vth of the third transistor T3 on the current I and ensures the uniformity of brightness.

Due to the long response time of the LTPS low temperature polysilicon transistor+Oxide transistor (LTPO) pixel circuit, brightness flicker occurs in the picture during low frequency switching. The pixel circuit of the embodiment of the present disclosure adds a large bias voltage to the third transistor T3 (driving transistor) to improve the hysteresis in the reset phase of the driving transistor, so that the brightness of the picture can be maintained when switching between high and low frequencies, and the risk of flicker is reduced.

In a column of sub-pixels, for at least two adjacent sub-pixels, the second light emitting control signal line EM2 in the previous row of sub-pixels is electrically connected to the first light emitting control signal line EM1 in the current row of sub-pixels, and the second scan signal line G2 in the previous row of the sub-pixels is electrically connected to the first reset control signal line Reset1 in the current row of sub-pixels.

Embodiments of the present disclosure also provide a method for driving a pixel circuit, which is used to drive the pixel circuit as described above, where the pixel circuit has a plurality of scan periods, and within one scan period, as shown in FIG. 45, the driving method includes steps 100 to 400.

Wherein, step 100 includes: in the reset phase, writing, by the first reset sub-circuit, the first reset to the anode (i.e., the fourth node) of the light emitting element in response to a signal of the first light emitting control signal line or the second reset control signal line.

In some exemplary embodiments, step 100 further includes: writing, by the second light emitting control sub-circuit, the first reset signal of the fourth node into the third node in respond to the signal of the second light emitting control signal line; writing, by the compensation sub-circuit, the first reset signal of the third node into the first node in response to the signal of the first scan signal line.

Step 200 includes: in the reconfiguration phase, writing, by the second reset sub-circuit, the second reset signal to the first electrode (i.e. the second node) or the second electrode (i.e. the third node) of the driving sub-circuit in respond to the signal of the first reset control signal line; the second reset signal being greater than the first reset signal.

In some exemplary embodiments, step 100 further includes: writing, by the compensation sub-circuit, the second reset signal of the third node into the first node in response to the signal of the first scan signal line.

In some exemplary embodiments, the second reset signal may be a signal inputted by a voltage line of at least one of the following: a first power line, a first light emitting control signal line, a second light emitting control signal line, or a third power line.

Step 300 includes: in the light emitting phase, generating, by the driving sub-circuit, a driving current between the second node and the third node in response to the control signal of the first node.

In some exemplary embodiments, before step 300, the method further includes: in the data writing-in phase, writing, by the writing-in sub-circuit, a data signal to the second node in response to the signal of the second scan signal line; compensating, by the compensation sub-circuit, the first node in response to the signal of the first scan signal line.

In some exemplary embodiments, step 300 further includes: in the light emitting phase, providing, by the first light emitting control sub-circuit, the second node with the signal of the first power line in response to the signal of the first light emitting control signal line signal; enabling, by the second light emitting control sub-circuit, a driving current to pass between the third node and the fourth node in response to the signal of the second light emitting control signal line.

In the pixel circuit, the driving method thereof, and the display device according to the embodiments of the present disclosure, the second reset sub-circuit writes the second reset signal into the first electrode or the second electrode of the driving sub-circuit in response to the signal of the first reset control signal line, a large bias voltage is added to the driving sub-circuit to improve the hysteresis, so that the screen brightness can be maintained when switching between high and low frequencies, the flicker risk of screen is reduced, and the display effect of the display device under high and low gray scales is improved. In addition, since the number of transistors in the pixel circuit of the present disclosure is less, the pixel circuit occupies less space, thereby improving the pixel resolution of the display device.

The following points need to be noted:

The drawings of the embodiments of the present disclosure only relate to the structures involved in the embodiments of the present disclosure, and other structures may refer to general designs.

The embodiments of the present disclosure and features within the embodiments may be combined with each other to obtain new embodiments.

FIGS. 46-60 are explanatory drawings of another set of exemplary embodiments of pixel driving circuits of the present disclosure.

The transistors used in all the embodiments of the present disclosure may be triodes, thin film transistors, field effect transistors, or other devices with the same characteristics. In the embodiments of the present disclosure, in order to distinguish the two electrodes of the transistor except the control electrode, one electrode is the first electrode, and the other electrode is the second electrode.

In actual operation, when the transistor is a thin film transistor or a field effect transistor, the first electrode may be a drain electrode, and the second electrode may be a source electrode; or, the first electrode may be a source electrode, the second electrode may be a drain electrode.

As shown in FIG. 46, the pixel circuit according to the embodiment of the present disclosure includes a driving circuit 11, a first control circuit 12, a compensation control circuit 13 and a first initialization circuit 14;

The first control circuit 12 is electrically connected to the first scan line S1, the control end of the driving circuit 11 and the connection node N0 respectively, and is configured to control, under the control of the first scan signal provided by the first scan line S1, to connect the control end of the driving circuit 11 and the connection node NO;

The compensation control circuit 13 is electrically connected to the second scan line S2, the connection node N0 and the first end of the driving circuit 11, respectively, is configured to control to connect the connection node N0 and the first end of the driving circuit 11 under the control of the second scan signal provided by the second scan line S2;

The first initialization circuit 14 is electrically connected to the initialization control line R1, the first initialization voltage line, and the connection node NO, respectively, and is configured to write the first initialization voltage Vi1 provided by the first initialization voltage line into the connection node N0 under the control of the initialization control signal provided by the initialization control line R1;

The driving circuit 11 is configured to control to connect the first end of the driving circuit 11 and the second end of the driving circuit 11 under the control of the potential of the control end thereof.

In at least one embodiment shown in FIG. 46, the first node N1 is a node connected to the control end of the driving circuit 11.

In the pixel circuit described in the embodiment of the present disclosure, the first control circuit 12 is directly electrically connected to the first node N1, and neither the first initialization circuit 14 nor the compensation control circuit 13 is directly electrically connected to the first node N1, so as to reduce the leakage path of the first node N1, ensure the stability of the voltage of the first node during low frequency operation, it is beneficial to improve display quality, improve display uniformity, and reduce flicker.

When the embodiment of the pixel circuit shown in FIG. 46 of the present disclosure is in operation, the display period includes an initialization phase and a data writing-in phase; the driving method includes:

In the initialization phase, controlling, by the first control circuit 12, to connect the control end of the driving circuit 11 and the connection node N0 under the control of the first scan signal, and writing, by the first initialization circuit 14, the first initialization voltage Vi1 into the connection node N0 under the control of the initialization control signal, so that the first initialization voltage Vi1 is written into the control end of the driving circuit 11, the driving circuit 11 can control to connect the first end and the second end of the driving circuit 11 at the beginning of the data writing-in phase;

In the data writing-in phase, controlling, by the first control circuit 12, to connect the control end of the driving circuit 11 and the connection node N0 under the control of the first scan signal, and controlling, by the compensation control circuit 13, to connect the connection node N0 and the first end of the driving circuit 11 under the control of the second scan signal, so that the control end of the driving circuit 11 is connected to the first end of the driving circuit 11.

Optionally, the first control circuit includes a first transistor;

The control electrode of the first transistor is electrically connected to the first scan line, the first electrode of the first transistor is electrically connected to the control end of the driving circuit, and the second electrode of the first transistor is electrically connected to the connection node;

The first control transistor is an oxide thin film transistor.

In at least one embodiment of the present disclosure, the first transistor included in the control circuit is an oxide thin film transistor.

Oxide transistors have good hysteresis characteristics, low leakage current, and low mobility. Therefore, in at least one embodiment of the present disclosure, the first transistor is set as an oxide thin film transistor, so as to achieve low leakage and ensure the stability of the potential of the control end of the driving circuit.

Optionally, the compensation control circuit includes a second transistor;

The control electrode of the second transistor is electrically connected to the second scan line, the first electrode of the second transistor is electrically connected to the connection node, and the second electrode of the second transistor is electrically connected to the first end of the driving circuit.

In at least one embodiment of the present disclosure, the second transistor may be a low temperature polysilicon thin film transistor, but not limited thereto. During specific implementation, the second transistor may also be other types of transistors.

Optionally, the first initialization circuit includes a third transistor;

The control electrode of the third transistor is electrically connected to the initialization control line, the first electrode of the third transistor is electrically connected to the first initialization voltage line, and the second electrode of the third transistor is electrically connected to the connection node.

In at least one embodiment of the present disclosure, the third transistor is a low temperature polysilicon thin film transistor. During specific implementation, the third transistor may also be other types of transistors.

As shown in FIG. 47, on the basis of the pixel circuit shown in FIG. 46, the pixel circuit described in at least one embodiment of the present disclosure may further include a reset circuit 20;

The reset circuit 20 is electrically connected to the third scan line S3, the reset voltage line DR and the second end of the driving circuit 11 respectively, and is configured to write the reset voltage provided by the reset voltage line DR into the second end of the driving circuit 11 under the control of the third scan signal provided by the third scan line S3.

In at least one embodiment of the pixel circuit shown in FIG. 47 of the present disclosure, a reset circuit 20 is added. Under the control of the third scan signal, before the data voltage is written to the second end of the driving circuit 11, the reset circuit 20 writes the reset voltage into the second end of the driving circuit 11 in a non-light emitting phase, to provide a bias voltage to the driving transistor in the driving circuit 11 (the gate potential of the driving transistor is also initialized to Vi1 at this time), so that the driving transistor maintains in the reset state, to improve the hysteresis of the driving transistor, which is beneficial to the display FFR (first frame response time).

In specific implementation, the magnetic hysteresis of the driving transistor will cause the characteristic response of the driving transistor to be relatively slow. However, in at least one embodiment of the present disclosure, before the data voltage is written, the gate-source voltage of the driving transistor is quickly reset, which is beneficial to increase the recovery speed of the driving transistor, improve the hysteresis of the driving transistor and improve the hysteresis recovery speed.

When the pixel circuit shown in FIG. 47 of the present disclosure is in operation, in a non-light emitting phase (the non-light emitting phase may refer to phases other than the light emitting phase included in the display period), before the data voltage is written to the second end of the driving circuit 11, the time for resetting the second end of the driving circuit 11 can be increased by increasing the duty ratio of the third scan signal, so that the reset effect of the potential of the second end of the driving circuit 11 is better.

When the pixel circuit shown in FIG. 47 of the present disclosure is in operation, in the initialization phase, the reset circuit writes a reset voltage into the second end of the driving circuit under the control of the third scan signal.

In at least one embodiment of the present disclosure, the reset voltage is a DC voltage signal, which provides a fixed bias voltage for the driving transistor and improves the hysteresis phenomenon.

Optionally, the reset voltage may be a high voltage, but not limited thereto.

In at least one embodiment of the present disclosure, one third scan signal generation module may be used to provide the third scan signal to the third scan line, which facilitates resetting the potential of the second end of the driving circuit.

In at least one embodiment of the present disclosure, the reset voltage line and the first voltage line may be the same voltage line, which can reduce the number of signal lines. The voltage value of the reset voltage is greater than the voltage value of the first initialization voltage; the first voltage line is used for providing a first voltage signal (the first voltage line may be a high voltage line). The voltage value of the first voltage signal may be greater than 0V and less than or equal to 5V, for example, the voltage value of the first voltage signal may be 4.6V, but not limited thereto. The first initialization voltage may be a DC voltage, and the voltage value of the first initialization voltage may be greater than or equal to −7V and less than or equal to 0V; for example, the voltage value of the first initialization voltage may be −6V, −5V, −4V, −3V or −2V, but not limited thereto.

In at least one embodiment of the present disclosure, the threshold voltage Vth of the driving transistor in the driving circuit may be greater than or equal to −5V and less than or equal to −2V, and Vth may be greater than or equal to −4V and less than or equal to −2.5V; for example, Vth can be −4V, −3.5V, −3V or −2.5V, but not limited thereto.

The absolute value of the voltage value of the reset voltage may be greater than 1.5 times of the absolute value of the threshold voltage, so as to ensure that the bias effect can be quickly achieved in a relatively short period of time. For example, the absolute value of the voltage value of the reset voltage may be greater than 2 times, 2.5 times or 3 times of the absolute value of the threshold voltage, but not limited thereto.

Optionally, the reset circuit includes a fourth transistor;

The control electrode of the fourth transistor is electrically connected to the third scan line, the first electrode of the fourth transistor is electrically connected to the reset voltage line, and the second electrode of the fourth transistor is electrically connected to the second end of the driving circuit.

In at least one embodiment of the present disclosure, the fourth transistor may be a low temperature polysilicon thin film transistor, but not limited thereto.

As shown in FIG. 48, the pixel circuit described in at least one embodiment of the present disclosure may further include a light emitting element 30, a light emitting control circuit 31, and a second initialization circuit 32;

The light emitting control circuit 31 is respectively electrically connected to the light emitting control line E1, the first voltage line V1, the second end of the driving circuit 11, and the first end of the driving circuit 11 and the first electrode of the light emitting element 30, is configured to control to connect the first voltage line V1 and the second end of the driving circuit 11 under the control of the light emitting control signal provided by the light emitting control line E1, and control to connect the first end of the driving circuit 11 and the first electrode of the light emitting element 30;

The second initialization circuit 32 is electrically connected to the fourth scan line S4, the second initialization voltage line and the first electrode of the light emitting element 30, respectively, and is configured to write the second initialization voltage Vi2 provided by the second initialization voltage line into the first electrode of the light emitting element 30 under the control of the fourth scan signal provided by the fourth scan line S4;

The second electrode of the light emitting element 30 is electrically connected to the second voltage line V2.

In at least one embodiment of the present disclosure, the first voltage line V1 may be a high voltage line, and the second voltage line V2 may be a low voltage line, but not limited thereto;

The light emitting element 30 may be an OLED, the first electrode of the light emitting element 30 may be the anode of the OLED, and the second electrode of the light emitting element 30 may be the cathode of the OLED, but not limited thereto.

In at least one embodiment of the pixel circuit shown in FIG. 48 of the present disclosure, a fourth scan signal can be provided to the fourth scan line through one fourth scan signal generation module, which is beneficial to switching frequency switching under low frequency flicker (the switching frequency is the switching frequency of the transistors included in the second initialization circuit 32). When the display panel to which the pixel circuit is applied operates at a low frequency, the light emitting control circuit 31 controls to disconnect the first voltage line V1 from the second end of the driving circuit 11, and controls to disconnect the first end of the driving circuit 11 from the first electrode of the light emitting element 30, the frequency of the fourth scan signal can be increased to reduce flicker.

In at least one embodiment of the present disclosure, the third scan signal and the fourth scan signal may be the same scan signal, and the third scan signal generation module and the fourth scan signal generation module may be the same modules, but not limited to this.

When the pixel circuit shown in FIG. 48 of the present disclosure is in operation, the first scan signal and the light emitting control signal may be the same signal, but considering that when pulse width modulation (PWM) controls the light emitting function, the EM may provide a high voltage signal during the light emitting process, the first scan signal is provided for the first scan line through one first scan signal generation module, and the light emitting control line is provided with light control signal through the light emitting control signal generation module.

In at least one embodiment of the present disclosure, when the reset voltage line is the first voltage line, the voltage value of the reset voltage may be greater than the voltage value of the second initialization voltage.

The voltage value of the second initialization voltage may be greater than or equal to −7V and less than or equal to 0V. For example, the voltage value of the second initialization voltage may be −6V, −5V, −4V, −3V or −2V.

Optionally, the light emitting control circuit includes a fifth transistor and a sixth transistor;

The control electrode of the fifth transistor is electrically connected to the light emitting control line, the first electrode of the fifth transistor is electrically connected to the first voltage line, and the second electrode of the fifth transistor is electrically connected to the second end of the driving circuit;

The control electrode of the sixth transistor is electrically connected to the light emitting control line, the first electrode of the sixth transistor is electrically connected to the first end of the driving circuit, and the second electrode of the sixth transistor is electrically connected to the first electrode of the light emitting element;

the second initialization circuit includes a seventh transistor;

The control electrode of the seventh transistor is electrically connected to the fourth scan line, the first electrode of the seventh transistor is electrically connected to the second initialization voltage line, and the second electrode of the seventh transistor is electrically connected to the first electrodes of the light emitting element.

Optionally, the seventh transistor may be an oxide thin film transistor.

In at least one embodiment of the present disclosure, the seventh transistor can be set as an oxide thin film transistor, which can reduce leakage and ensure the stability of the potential of the first electrode of the light emitting element.

As shown in FIG. 49, on the basis of the pixel circuit shown in FIG. 48, the pixel circuit described in at least one embodiment of the present disclosure may further include a data writing-in circuit 41 and an energy storage circuit 42;

The data writing-in circuit 41 is electrically connected to the second scan line S2, the data line D1 and the second end of the driving circuit 11 respectively, and is configured to write the data voltage on the data line D1 into the second end of the driving circuit 11 under the control of the second scan signal provided by the second scan line S2;

The energy storage circuit 42 is electrically connected to the control end of the driving circuit 11 and used for storing electrical energy.

When the pixel circuit shown in FIG. 49 of the present disclosure is in operation, the display period further includes a light emitting phase arranged after the data writing-in phase;

In the initialization phase, the second initialization circuit 32 writes the second initialization voltage Vi2 provided by the second initialization voltage line into the first electrode of the light emitting element 30 under the control of the fourth scan signal provided by the fourth scan line S4;

In the data writing-in phase, the data writing-in circuit 41 writes the data voltage Vdata on the data line D1 into the second end of the driving circuit 11 under the control of the second scan signal;

At the beginning of the data writing-in phase, the driving circuit 11 controls to connect the first end of the driving circuit 11 and the second end of the driving circuit 11 to charge the energy storage circuit 42 with the data voltage Vdata, thereby changing the potential of the control end of the driving circuit 11 until the potential of the control end of the driving circuit 11 becomes Vdata+Vth, wherein Vth is the threshold voltage of the driving transistor of the driving circuit 11;

In the light emitting phase, under the control of the light emitting control signal, the light emitting control circuit 31 controls to connect the first voltage line V1 and the second end of the driving circuit 11, and controls to connect the first end of the driving circuit 11 and the first electrode of the light emitting element 30, and the driving circuit 11 drives the light emitting element 30 to emit light.

Optionally, the data writing-in circuit includes an eighth transistor, and the energy storage circuit includes a storage capacitor;

The control electrode of the eighth transistor is electrically connected to the second scan line, the first electrode of the eighth transistor is electrically connected to the data line, and the second electrode of the eighth transistor is electrically connected to the second end of the driving circuit;

The first end of the storage capacitor is electrically connected to the control end of the driving circuit, and the second end of the storage capacitor is electrically connected to the first voltage line.

In at least one embodiment of the present disclosure, the driving circuit may include a driving transistor;

The driving transistor is a single-gate transistor, the gate electrode of the driving transistor is electrically connected to the control end of the driving circuit, the first electrode of the driving transistor is electrically connected to the first end of the driving circuit, and the second electrode of the driving transistor is electrically connected to the second end of the driving circuit; or, The driving transistor is a double-gate transistor, the first gate electrode of the driving transistor is electrically connected to the control end of the driving circuit, the second gate electrode of the driving transistor is electrically connected to the first voltage line, and the first electrode of the driving transistor is electrically connected to the first end of the driving circuit, and the second electrode of the driving transistor is electrically connected to the second end of the driving circuit; the first gate electrode is a top gate, and the second gate electrode is a bottom gate.

Optionally, the driving transistor may be a single-gate transistor or a double-gate transistor. When the driving transistor is a dual-gate transistor, the first gate electrode of the driving transistor is electrically connected to the control end of the driving circuit, the second gate electrode of the driving transistor is electrically connected to the first voltage line, and the first gate electrode is a top gate, and the second gate electrode is a bottom gate, so that the substrate of the driving transistor is biased and the hysteresis of the driving transistor is improved.

As shown in FIG. 50, on the basis of the pixel circuit shown in FIG. 49, the first control circuit 12 includes a first transistor T1; the driving circuit 11 includes a driving transistor T0; the light emitting element is an organic light emitting diode O1;

The gate electrode of the first transistor T1 is electrically connected to the first scan line S1, the drain electrode of the first transistor T1 is electrically connected to the gate electrode of the driving transistor T0, and the source electrode of the first transistor T1 electrically connected to the connection node NO;

The compensation control circuit 13 includes a second transistor T2;

The gate electrode of the second transistor T2 is electrically connected to the second scan line S2, the drain electrode of the second transistor T2 is electrically connected to the connection node N0, and the source electrode of the second transistor T2 is electrically connected to the drain electrode of the driving transistor T0;

The first initialization circuit 14 includes a third transistor T3;

The gate electrode of the third transistor T3 is electrically connected to the initialization control line R1, the drain electrode of the third transistor T3 is electrically connected to the first initialization voltage line, and the source electrode of the third transistor T3 is connected to the connection node N0; the first initialization voltage line is used to provide the first initialization voltage Vi1;

The reset circuit 20 includes a fourth transistor T4;

The gate electrode of the fourth transistor T4 is electrically connected to the third scan line S3, the drain electrode of the fourth transistor T4 is electrically connected to the reset voltage line DR, and the source electrode of the fourth transistor T4 is electrically connected to the source electrode of the driving transistor T0;

The light emitting control circuit includes a fifth transistor T5 and a sixth transistor T6;

The gate electrode of the fifth transistor T5 is electrically connected to the light emitting control line E1, the drain electrode of the fifth transistor T5 is electrically connected to the high voltage line, and the source electrode of the fifth transistor T5 is electrically connected to the source electrode of the driving transistor T0; the high-voltage line is used to provide a high-voltage signal VDD;

The gate electrode of the sixth transistor T6 is electrically connected to the light emitting control line E1, the drain electrode of the sixth transistor T6 is electrically connected to the drain electrode of the driving transistor T0, and the source electrode of the sixth transistor T6 is electrically connected to the anode of the organic light emitting diode O1;

The second initialization circuit 32 includes a seventh transistor T7;

The gate electrode of the seventh transistor T7 is electrically connected to the fourth scan line S4, the drain electrode of the seventh transistor T7 is electrically connected to the second initialization voltage line, and the source electrode of the seventh transistor T7 is electrically connected to the anode of the organic light emitting diode O1; the second initial voltage line is used to provide the second initial voltage Vi2;

The data writing-in circuit 41 includes an eighth transistor T8, and the energy storage circuit 42 includes a storage capacitor C;

The gate electrode of the eighth transistor T8 is electrically connected to the second scan line S2, the drain electrode of the eighth transistor T8 is electrically connected to the data line D1, and the source electrode of the eighth transistor T8 is electrically connected to the source electrode of the driving transistor T0;

The first end of the storage capacitor C is electrically connected to the gate electrode of the driving transistor T0, and the second end of the storage capacitor C is electrically connected to the high voltage line;

The cathode of O1 is electrically connected to the low voltage line, which is used to provide the low voltage VSS.

In FIG. 50, N1 is the first node, and the first node N1 is electrically connected to the gate electrode of T0; N2 is the second node, and N3 is the third node; N2 is electrically connected to the source electrode of T0, and N3 is electrically connected to the drain electrode of T0.

In at least one embodiment shown in FIG. 50, the first voltage line is a high voltage line, and the second voltage line is a low voltage line.

In at least one embodiment of the pixel circuit shown in FIG. 50, T1 may be an oxide thin film transistor, T0, T2, T3, T4, T5, T6, T7 and T8 may all be low temperature polysilicon thin film transistors, and T1 is an n-type transistor, T0, T2, T3, T4, T5, T6, T7 and T8 are p-type transistors, and T0 is a single-gate transistor, but not limited thereto.

In at least one embodiment of the pixel circuit shown in FIG. 50, N1 is only directly electrically connected to T1, and N1 is not directly electrically connected to T2 and T3, so as to reduce the current leakage of N1 and stabilize the potential of the gate electrode of T0.

In at least one embodiment of the pixel circuit shown in FIG. 50, T1 is an oxide thin film transistor, which can reduce current leakage and ensure the stability of the potential of N1.

Optionally, T2 and T3 can be single-gate transistors to save space.

In at least one embodiment of the pixel circuit shown in FIG. 50, the initialization control signal provided by the initialization control line R1 and the second scan signal provided by the second scan line may both be generated by the second scan signal generation module.

Optionally, in at least one embodiment of the pixel circuit, each transistor included in the pixel circuit can be arranged on a substrate, and the overlapping area between the orthographic projection of the conductive pattern on the substrate and the orthographic projection of the fourth scan line S4 on the substrate is set as small as possible, and the overlapping area between the orthographic projection of the conductive pattern on the substrate and the orthographic projection of the initialization control line R1 on the substrate is set as small as possible, to reduce parasitic capacitance. Optionally, the capacitance between the conductive pattern and the fourth scan line S4 is less than 0.3Cz, and the capacitance between the conductive pattern for electrically connecting the source electrode of T0 and the source electrode of T5 and the initialization control line R1 is less than 0.3Cz; wherein, Cz is the capacitance value of the storage capacitor C.

The conductive pattern includes a source electrode of T0, a source electrode of T5, and a connection conductive pattern for electrically connecting the source electrode of T0 and the source electrode of T5.

As shown in FIG. 51, when at least one embodiment of the pixel circuit shown in FIG. 50 of the present disclosure is in operation, the display period includes an initialization phase t1, a data writing-in phase t2, and a light emitting phase t3 that are set in sequence;

In the initialization phase t1, E1 provides a high voltage signal, S1 provides a high voltage signal, T1 is turned on, R1 provides a low voltage signal, S2 provides a high voltage signal, T2 is turned on, T3 is turned off, and Vi1 writes N1, so that T0 is turned on at the beginning of the data writing-in phase t2; S3 and S4 provide a low-voltage signal, T7 is turned on, and T4 is turned on to write the reset voltage provided by DR to N2, and write Vi2 into the anode of O1, so that O1 does not emit light, and the residual charge of the anode of O1 is cleared;

In the data writing-in phase t2, E1 provides a high voltage signal, S1 provides a high voltage signal, T1 is turned on, R1 provides a high voltage signal, S2 provides a high voltage signal, T2 is turned on, T3 is turned off, T8 is turned on, and S3 and S4 provide a high voltage signal, T7 and T4 are turned off, and the data voltage Vdata on the data line D1 is written into N2;

At the beginning of the data writing-in phase t2, T0 is turned on to charge C through Vdata, and T8, T0, T2 and T1 that are turned on, to increase the potential of N1 until T0 is turned off, at this time, the potential of N1 is Vdata+Vth, Vth is the threshold voltage of T0;

In the light emitting phase t3, E1 provides a low voltage signal, R1 provides a high voltage signal, S1 provides a low voltage signal, S2, S3 and S4 provide a high voltage signal, T1, T2, T3, T4, T7 and T8 are turned off, and T5 and T6 are turned on, T0 is turn on to drive O1 to emit light.

In at least one embodiment of the pixel circuit shown in FIG. 50, T4 is added to provide a high voltage for N2, and the potential of N2 is initialized in the non-light emitting phase, which is beneficial to improve the stability of T0; and T7 is used to initialize the potential of the anode of O1, which facilitates the switching of the switching frequency under low-frequency flickering.

As shown in FIG. 52, based on at least one embodiment of the pixel circuit shown in FIG. 49, the first control circuit 12 includes a first transistor T1; the driving circuit 11 includes a driving transistor T0; the light emitting element is an organic light emitting diode O1;

The gate electrode of the first transistor T1 is electrically connected to the first scan line S1, the drain electrode of the first transistor T1 is electrically connected to the gate electrode of the driving transistor T0, and the source electrode of the first transistor T1 is electrically connected to the connection node NO;

The compensation control circuit 13 includes a second transistor T2;

The gate electrode of the second transistor T2 is electrically connected to the second scan line S2, the drain electrode of the second transistor T2 is electrically connected to the connection node N0, and the source electrode of the second transistor T2 is electrically connected to the drain electrode of the driving transistor T0;

The first initialization circuit 14 includes a third transistor T3;

The gate electrode of the third transistor T3 is electrically connected to the initialization control line R1, the drain electrode of the third transistor T3 is electrically connected to the first initialization voltage line, and the source electrode of the third transistor T3 is connected to the connection node N0; the first initialization voltage line is used to provide the first initialization voltage Vi1;

The reset circuit 20 includes a fourth transistor T4;

The gate electrode of the fourth transistor T4 is electrically connected to the third scan line S3, the drain electrode of the fourth transistor T4 is electrically connected to the reset voltage line DR, and the source electrode of the fourth transistor T4 is electrically connected to the source electrode of the driving transistor T0;

The light emitting control circuit includes a fifth transistor T5 and a sixth transistor T6;

The gate electrode of the fifth transistor T5 is electrically connected to the light emitting control line E1, the drain electrode of the fifth transistor T5 is electrically connected to the high voltage line, and the source electrode of the fifth transistor T5 is electrically connected to the source electrode of the driving transistor T0; the high-voltage line is used to provide a high-voltage signal VDD;

The gate electrode of the sixth transistor T6 is electrically connected to the light emitting control line E1, the drain electrode of the sixth transistor T6 is electrically connected to the drain electrode of the driving transistor T0, and the source electrode of the sixth transistor T6 is electrically connected to the anode of the organic light emitting diode O1;

The second initialization circuit 32 includes a seventh transistor T7;

The gate electrode of the seventh transistor T7 is electrically connected to the fourth scan line S4, the drain electrode of the seventh transistor T7 is electrically connected to the second initialization voltage line, and the source electrode of the seventh transistor T7 is electrically connected to the anode of the organic light emitting diode O1; the second initial voltage line is used to provide the second initial voltage Vi2;

The data writing-in circuit 41 includes an eighth transistor T8, and the energy storage circuit 42 includes a storage capacitor C;

The gate electrode of the eighth transistor T8 is electrically connected to the second scan line S2, the drain electrode of the eighth transistor T8 is electrically connected to the data line D1, and the source electrode of the eighth transistor T8 is electrically connected to the source electrode of the driving transistor T0;

The first end of the storage capacitor C is electrically connected to the gate electrode of the driving transistor T0, and the second end of the storage capacitor C is electrically connected to the high voltage line;

The cathode of O1 is electrically connected to the low voltage line, which is used to provide the low voltage VSS.

In FIG. 52, N1 is the first node, and the first node N1 is electrically connected to the gate electrode of T0; N2 is the second node, and N3 is the third node; N2 is electrically connected to the source electrode of T0, and N3 is electrically connected to the drain electrode of T0.

In at least one embodiment shown in FIG. 52, the first voltage line is a high voltage line, and the second voltage line is a low voltage line.

In at least one embodiment of the pixel circuit shown in FIG. 52, T1 and T7 may be oxide thin film transistors, T0, T2, T3, T4, T5, T6 and T8 may all be low temperature polysilicon thin film transistors, and T1 and T7 are n-type transistors, T0, T2, T3, T4, T5, T6 and T8 are p-type transistors, and T0 is a single-gate transistor, but not limited thereto.

The difference between at least one embodiment of the pixel circuit shown in FIG. 52 of the present disclosure and at least one embodiment of the pixel circuit shown in FIG. 50 of the present disclosure is that T7 is an oxide thin film transistor.

In at least one embodiment of the pixel circuit shown in FIG. 52, N1 is only directly electrically connected to T1, and N1 is not directly electrically connected to T2 and T3, so as to reduce the current leakage of N1 and stabilize the potential of the gate electrode of T0.

In at least one embodiment of the pixel circuit shown in FIG. 52, T1 and T7 are oxide thin film transistors to reduce current leakage, ensure the stability of the potential of N1, and ensure the stability of the potential of the anode of O1.

In at least one embodiment of the pixel circuit shown in FIG. 52, one fourth scan signal generation module can be used to provide the fourth scan signal to the fourth scan line, which is beneficial to the switching of switching frequency under low frequency flicker (The switching frequency is the switching frequency of the transistors included in the second initialization circuit 32). When the display panel to which the pixel circuit is applied works at a low frequency, the light emitting control circuit 31 controls to disconnect the first voltage line V1 from the second end of the driving circuit 11, and controls to disconnect the first end of the driving circuit 11 from the first electrode of the light emitting element 30, the frequency of the fourth scan signal can be increased to reduce flicker; or, The fourth scan line can be the light emitting control line, so that in the low-frequency refresh phase, the light emitting control signal provided by the light emitting control line needs to be periodically controlled, that is, the light emitting element can be reset/adjusted in brightness periodically, so as to achieve brightness balance.

As shown in FIG. 53, on the basis of at least one embodiment of the pixel circuit shown in FIG. 49, the first control circuit 12 includes a first transistor T1; the driving circuit 11 includes a driving transistor T0; the light emitting element is an organic light emitting diode O1;

The gate electrode of the first transistor T1 is electrically connected to the first scan line S1, the drain electrode of the first transistor T1 is electrically connected to the gate electrode of the driving transistor T0, and the source electrode of the first transistor T1 is electrically connected to the connection node N0;

The compensation control circuit 13 includes a second transistor T2;

The gate electrode of the second transistor T2 is electrically connected to the second scan line S2, the drain electrode of the second transistor T2 is electrically connected to the connection node N0, and the source electrode of the second transistor T2 is electrically connected to the drain electrode of the driving transistor T0;

The first initialization circuit 14 includes a third transistor T3;

The gate electrode of the third transistor T3 is electrically connected to the initialization control line R1, the drain electrode of the third transistor T3 is electrically connected to the first initialization voltage line, and the source electrode of the third transistor T3 is connected to the connection node N0; the first initialization voltage line is used to provide the first initialization voltage Vi1;

The reset circuit 20 includes a fourth transistor T4;

The gate electrode of the fourth transistor T4 is electrically connected to the third scan line S3, the drain electrode of the fourth transistor T4 is electrically connected to the high voltage line, and the source electrode of the fourth transistor T4 is electrically connected to the source electrode of the driving transistor T0; the high-voltage line is used to provide a high-voltage signal VDD;

The light emitting control circuit includes a fifth transistor T5 and a sixth transistor T6;

The gate electrode of the fifth transistor T5 is electrically connected to the light emitting control line E1, the drain electrode of the fifth transistor T5 is electrically connected to the high voltage line, and the source electrode of the fifth transistor T5 is electrically connected to the source electrode of driving transistor T0;

The gate electrode of the sixth transistor T6 is electrically connected to the light emitting control line E1, the drain electrode of the sixth transistor T6 is electrically connected to the drain electrode of the driving transistor T0, and the source electrode of the sixth transistor T6 is electrically connected to the anode of the organic light emitting diode O1;

The second initialization circuit 32 includes a seventh transistor T7;

The gate electrode of the seventh transistor T7 is electrically connected to the fourth scan line S4, the drain electrode of the seventh transistor T7 is electrically connected to the second initialization voltage line, and the source electrode of the seventh transistor T7 is electrically connected to the anode of the organic light emitting diode O1; the second initial voltage line is used to provide the second initial voltage Vi2;

The data writing-in circuit 41 includes an eighth transistor T8, and the energy storage circuit 42 includes a storage capacitor C;

The gate electrode of the eighth transistor T8 is electrically connected to the second scan line S2, the drain electrode of the eighth transistor T8 is electrically connected to the data line D1, and the source electrode of the eighth transistor T8 is electrically connected to the source electrode of the driving transistor T0;

The first end of the storage capacitor C is electrically connected to the gate electrode of the driving transistor T0, and the second end of the storage capacitor C is electrically connected to the high voltage line;

The cathode of O1 is electrically connected to the low voltage line, which is used to provide the low voltage VSS.

In FIG. 53, N1 is the first node, and the first node N1 is electrically connected to the gate electrode of T0; N2 is the second node, and N3 is the third node; N2 is electrically connected to the source electrode of T0, and N3 is electrically connected to the drain electrode of T0.

In at least one embodiment shown in FIG. 53, the first voltage line is a high voltage line, and the second voltage line is a low voltage line.

In at least one embodiment of the pixel circuit shown in FIG. 53, T1 may be an oxide thin film transistor, T0, T2, T3, T4, T5, T6, T7 and T8 may all be low temperature polysilicon thin film transistors, and T1 is an n-type The transistors, T0, T2, T3, T4, T5, T6, T7 and T8 are p-type transistors, and T0 is a single-gate transistor, but not limited thereto.

In at least one embodiment of the pixel circuit shown in FIG. 53, N1 is only directly electrically connected to T1, and N1 is not directly electrically connected to T2 and T3, so as to reduce the current leakage of N1 and stabilize the potential of the gate electrode of T0;

T1 is an oxide thin film transistor to reduce the current leakage of N1 and improve the stability of the potential of the gate electrode of T0.

The difference between at least one embodiment of the pixel circuit shown in FIG. 53 of the present disclosure and at least one embodiment of the pixel circuit shown in FIG. 50 of the present disclosure is that the reset voltage line DR is the high voltage line, which can reduce the number of signal lines.

In at least one embodiment of the pixel circuit shown in FIG. 53 of the present disclosure, the voltage value of VDD may be 4.6V, the voltage value of VDD is greater than the voltage value of Vi1, and the voltage value of VDD is greater than the voltage value of Vi2.

In at least one embodiment of the pixel circuit shown in FIG. 53 of the present disclosure, T7 can also be replaced with an oxide thin film transistor, and T0 can also be replaced with a double-gate transistor, but not limited thereto.

As shown in FIG. 54, on the basis of at least one embodiment of the pixel circuit shown in FIG. 49, the first control circuit 12 includes a first transistor T1; the driving circuit 11 includes a driving transistor T0; the light emitting element is an organic light emitting diode O1;

The gate electrode of the first transistor T1 is electrically connected to the first scan line S1, the drain electrode of the first transistor T1 is electrically connected to the first gate electrode of the driving transistor T0, and the source electrode of the first transistor T1 is electrically connected to the connection node N0;

The compensation control circuit 13 includes a second transistor T2;

The gate electrode of the second transistor T2 is electrically connected to the second scan line S2, the drain electrode of the second transistor T2 is electrically connected to the connection node N0, and the source electrode of the second transistor T2 is electrically connected to the drain electrode of the driving transistor T0;

The first initialization circuit 14 includes a third transistor T3;

The gate electrode of the third transistor T3 is electrically connected to the initialization control line R1, the drain electrode of the third transistor T3 is electrically connected to the first initialization voltage line, and the source electrode of the third transistor T3 is connected to the connection node N0; the first initialization voltage line is used to provide the first initialization voltage Vi1;

The reset circuit 20 includes a fourth transistor T4;

The gate electrode of the fourth transistor T4 is electrically connected to the third scan line S3, the drain electrode of the fourth transistor T4 is electrically connected to the reset voltage line DR, and the source electrode of the fourth transistor T4 is electrically connected to the source electrode of the driving transistor T0;

The light emitting control circuit includes a fifth transistor T5 and a sixth transistor T6;

The gate electrode of the fifth transistor T5 is electrically connected to the light emitting control line E1, the drain electrode of the fifth transistor T5 is electrically connected to the high voltage line, and the source electrode of the fifth transistor T5 is electrically connected to the source electrode of the driving transistor T0; the high-voltage line is used to provide a high-voltage signal VDD;

The gate electrode of the sixth transistor T6 is electrically connected to the light emitting control line E1, the drain electrode of the sixth transistor T6 is electrically connected to the drain electrode of the driving transistor T0, and the source electrode of the sixth transistor T6 is electrically connected to the anode of the organic light emitting diode O1;

The second initialization circuit 32 includes a seventh transistor T7;

The gate electrode of the seventh transistor T7 is electrically connected to the fourth scan line S4, the drain electrode of the seventh transistor T7 is electrically connected to the second initialization voltage line, and the source electrode of the seventh transistor T7 is electrically connected to the anode of the organic light emitting diode O1; the second initial voltage line is used to provide the second initial voltage Vi2;

The data writing-in circuit 41 includes an eighth transistor T8, and the energy storage circuit 42 includes a storage capacitor C;

The gate electrode of the eighth transistor T8 is electrically connected to the second scan line S2, the drain electrode of the eighth transistor T8 is electrically connected to the data line D1, and the source electrode of the eighth transistor T8 is electrically connected to the source electrode of the driving transistor T0;

The first end of the storage capacitor C is electrically connected to the first gate electrode of the driving transistor T0, and the second end of the storage capacitor C is electrically connected to the high voltage line;

the second gate electrode of the driving transistor T0 is electrically connected to the high voltage line;

The cathode of O1 is electrically connected to the low voltage line, which is used to provide the low voltage VSS.

In FIG. 54, N1 is the first node, the first node N1 is electrically connected to the gate electrode of T0; N2 is the second node, and N3 is the third node; N2 is electrically connected to the source electrode of T0, and N3 is electrically connected to the drain electrode of T0.

In at least one embodiment shown in FIG. 54, the first voltage line is a high voltage line, and the second voltage line is a low voltage line.

In at least one embodiment of the pixel circuit shown in FIG. 54, T1 may be an oxide thin film transistor, T0, T2, T3, T4, T5, T6, T7 and T8 may all be low temperature polysilicon thin film transistors, T1 is an n-type transistor, T0, T2, T3, T4, T5, T6, T7 and T8 are p-type transistors, and T0 is a double-gate transistor, but not limited thereto.

In at least one embodiment of the pixel circuit shown in FIG. 54, N1 is only directly electrically connected to T1, and N1 is not directly electrically connected to T2 and T3, so as to reduce the current leakage of N1 and improve the stability of the potential of the gate electrode of T0.

In at least one embodiment of the pixel circuit shown in FIG. 54, T1 is an oxide thin film transistor, which can reduce current leakage and ensure the stability of the potential of N1.

In at least one embodiment of the pixel circuit shown in FIG. 54, T0 is a dual-gate transistor, the first gate electrode of T0 is a top gate, the second gate electrode of T0 is a bottom gate, and the second gate electrode of T0 is connected to the high voltage line, so as to apply a bias voltage to the substrate of T0, which is beneficial to improve the hysteresis of T0.

The difference between at least one embodiment of the pixel circuit shown in FIG. 54 of the present disclosure and at least one embodiment of the pixel circuit shown in FIG. 50 of the present disclosure is that T0 is a dual-gate transistor.

In at least one embodiment of the pixel circuit shown in FIG. 54 of the present disclosure, T7 may be replaced with an oxide thin film transistor, and DR may be the first voltage line, but not limited thereto.

In at least one embodiment of the pixel circuit shown in FIG. 50, FIG. 52, FIG. 53, and FIG. 54 of the present disclosure, in the non-light emitting phase (the non-light emitting phase may refer to phases other than the light emitting phase included in the display period), before the data voltage Vdata is written into N2, the on time of T4 can be increased by increasing the duty cycle of the third scan signal, so that the reset effect of the potential of N2 is better.

As shown in FIG. 55, two adjacent rows of the pixel circuits may be electrically connected to the reset voltage line of the same row. In FIG. 55, DRn is the reset voltage line of the nth row (n is a positive integer); and the two pixel circuits located in adjacent columns are arranged in mirror to facilitate wiring.

As shown in FIG. 56, two adjacent columns of the pixel circuits may be electrically connected to the reset voltage line of the same column. In FIG. 56, DRm is the reset voltage line of the mth column (m is a positive integer); and the two pixel circuits located in adjacent columns are arranged in mirror to facilitate wiring.

As shown in FIG. 57, two adjacent rows of the pixel circuits can be electrically connected to the reset voltage line in the same row, the pixel circuits in two adjacent columns can be electrically connected with the reset voltage line in the same column, and the two pixel circuits in the adjacent columns are arranged in mirror, and a plurality of reset voltage lines are arranged in a grid to facilitate wiring.

In FIG. 57, DR11 is the reset voltage line of the first row, DR12 is the reset voltage line of the second row, DR21 is the reset voltage line of the first column, DR22 is the reset voltage line of the second column, DR23 is the reset voltage line of the third column.

In FIG. 58, DR11 is the reset voltage line of the first row, DR12 is the reset voltage line of the second row, DR13 is the reset voltage line of the third row, DR14 is the reset voltage line of the fourth row, DR21 is the reset voltage line of the first column, and DR22 is the reset voltage line of the second column.

As shown in FIG. 58, the first row of pixel circuits are all electrically connected to the reset voltage line DR11 of the first row, the second row of pixel circuits are electrically connected to the reset voltage line DR12 of the second row, and the third row of pixel circuits are electrically connected to the reset voltage line DR13 of the third row, and the fourth row of pixel circuits are electrically connected to the reset voltage line DR14 of the fourth row;

The reset voltage lines extended vertically are arranged, so that a plurality of reset voltage lines are arranged in a grid; and a reset voltage line can be arranged every several columns of pixel circuits to save wiring space.

During specific implementation, a reset voltage line extending vertically may be provided on one side of the red pixel circuit column.

The driving method described in the embodiment of the present disclosure is applied to the above-mentioned pixel circuit, and the display period includes an initialization phase and a data writing-in phase; the driving method includes:

In the initialization phase, controlling, by the first control circuit, to connect the control end of the driving circuit and the connection node under the control of the first scan signal, and writing, by the first initialization circuit, the first initialization voltage into the connection under the control of the initialization control signal, so that the first initialization voltage is written into the control end of the driving circuit, the driving circuit can control to connect the first end and the second end of the driving circuit at the beginning of the data writing-in phase;

In the data writing-in phase, controlling, by the first control circuit, to connect the control end of the driving circuit and the connection node under the control of the first scan signal, and controlling, by the compensation control circuit, to connect the connection node and the first end of the driving circuit under the control of the second scan signal, so that the control end of the driving circuit is connected to the first end of the driving circuit.

In the driving method described in the embodiment of the present disclosure, the first control circuit controls to connect the control end of the driving circuit and the connection node, and the first initialization circuit writes the first initialization voltage into the connection node under the control of the initialization control signal, the compensation control circuit controls to connect the connection node and the first end of the driving circuit under the control of the second scan signal, the first control circuit is directly electrically connected to the control end of the driving circuit, the first initialization circuit and the compensation control circuit are not directly electrically connected to the control end of the driving circuit, so as to reduce the current leakage path of the first node (the node electrically connected to the control end of the driving circuit), so as to ensure the stability of the voltage of the first node during low frequency operation, which is beneficial to improve display quality, improve display uniformity, and reduce flicker.

During specific implementation, the pixel circuit may further include a reset circuit; the driving method further includes:

In the initialization phase, writing, by the reset circuit, a reset voltage to the second end of the driving circuit under the control of the third scan signal.

Optionally, the pixel circuit may further include a light emitting element and a second initialization circuit; the driving method further includes:

Writing, by the second initialization circuit, a second initialization voltage into the first electrode of the light emitting element under the control of the fourth scan signal, so as to control the light emitting element not to emit light.

In a specific implementation, the pixel circuit further includes a light emitting control circuit, a data writing-in circuit and an energy storage circuit, the display period includes a light emitting phase arranged after the data writing-in phase, and the driving method further includes:

In the data writing-in phase, writing, by the data writing-in circuit, the data voltage Vdata on the data line into the second end of the driving circuit under the control of the second scan signal;

At the beginning of the data writing-in phase, controlling, by the driving circuit, to connect the first end of the driving circuit and the second end of the driving circuit, so as to charge the energy storage circuit through the data voltage Vdata, and changing the potential of the control end of the driving circuit until the potential of the control end of the driving circuit becomes Vdata+Vth, wherein Vth is the threshold voltage of the driving transistor included in the driving circuit;

In the light emitting phase, controlling, by the light emitting control circuit, to connect the first voltage line and the second end of the driving circuit under the control of the light emitting control signal, and controlling to connect the first end of the driving circuit and the first electrode of the light emitting element, and the driving circuit drives the light emitting element to emit light.

The display device according to the embodiment of the present disclosure includes the above-mentioned pixel circuit.

Optionally, the pixel circuit includes a reset circuit and a second initialization circuit, the reset circuit is electrically connected to the third scan line, and the second initialization circuit is electrically connected to the fourth scan line; the display device further includes a third scan signal generation module and a fourth scan signal generation module;

the third scan signal generation module is electrically connected to the third scan line, and is used to provide a third scan signal for the third scan line;

The fourth scan signal generation module is electrically connected to the fourth scan line, and is used to provide a fourth scan signal for the fourth scan line.

In at least one embodiment of the present disclosure, the third scan signal and the fourth scan signal may be the same scan signal, and the third scan signal generation module and the fourth scan signal generation module may be the same module.

As shown in FIG. 59, the display device according to at least one embodiment of the present disclosure includes a display panel, and the display panel includes a pixel module P0, and the pixel module P0 includes the above-mentioned pixel circuits in multiple rows and multiple columns; the pixel module P0 is arranged in a valid display area of the display panel;

The display panel further includes a light emitting control signal generation module 70, a first scan signal generation module 71, a first second scan signal generation module 721, a second second scan signal generation module 722, a third scan signal generation module 73 and a fourth scan signal generation module 74;

The light emitting control signal generation module 70 is used for providing the light emitting control signal, the first scan signal generation module 71 is used for providing the first scan signal, the first second scan signal generation module 721 and the second second scan signal generation module 722 are used to provide the second scan signal, the third scan signal generation module 73 is used to provide the third scan signal, and the fourth scan signal generation module 74 is used to provide the fourth scan signal;

The light emitting control signal generation module 70, the first scan signal generation module 71 and the first second scan signal generation module 721 are arranged on the left side of the display panel, The second second scan signal generation module 722, the third scan signal generation module 73 and the fourth scan signal generation module 74 are disposed on the right side of the display panel.

As shown in FIG. 60, the display device according to at least one embodiment of the present disclosure includes a display panel, the display panel includes a pixel module P0, and the pixel module P0 includes the above-mentioned pixel circuits in multiple rows and multiple columns; the pixel module P0 is arranged in the valid display area of the display panel;

The display panel further includes a light emitting control signal generation module 70, a first first scan signal generation module 711, a second first scan signal generation module 712, a first second scan signal generation module 721, a second second scan signal generation module 722 and a fourth scan signal generation module 74;

The light emitting control signal generation module 70 is used to provide the light emitting control signal, the first scan signal generation module 711 and the second first scan signal generation module 712 are used to provide the first scan signal, the first second scan signal generation module 721 and the second second scan signal generation module 722 are used to provide the second scan signal;

The third scan signal and the fourth scan signal are the same scan signal;

The fourth scan signal generation module 74 is used to provide the third scan signal and the fourth scan signal;

The light emitting control signal generation module 70, the first first scan signal generation module 711 and the first second scan signal generation module 721 are arranged on the left side of the display panel, The second first scan signal generation module 712, the second second scan signal generation module 722 and the fourth scan signal generation module 74 are arranged on the right side of the display panel.

In FIG. 55 and FIG. 56, the first initialization voltage is labeled Vi1, the second initialization voltage is labeled Vi2, the high voltage signal is labeled VDD, the data line is labeled D1, and the reset voltage line is labeled DR.

The display device provided by the embodiment of the present disclosure may be any product or component with a display function, such as a mobile phone, a tablet computer, a television, a monitor, a notebook computer, a digital photo frame, and a navigator.

FIGS. 61-78 are explanatory drawings of another set of exemplary embodiments of pixel driving circuits of the present disclosure.

The transistors used in all the embodiments of the present disclosure may be triodes, thin film transistors, field effect transistors, or other devices with the same characteristics. In the embodiments of the present disclosure, in order to distinguish the two electrodes of the transistor except the control electrode, one electrode is called the first electrode, and the other electrode is called the second electrode.

In actual operation, when the transistor is a thin film transistor or a field effect transistor, the first electrode may be a drain electrode, and the second electrode may be a source electrode; or, the first electrode may be a source electrode, the second electrode may be a drain electrode.

The pixel circuit described in the embodiment of the present disclosure includes a driving circuit, a first initialization circuit and a reset circuit;

The first initialization circuit is respectively electrically connected to the initialization control line, the first end of the driving circuit and the first initial voltage terminal, and is configured to write the first initial voltage provided by the first initial voltage terminal into the first end of the driving circuit under the control of the initialization control signal provided by the initialization control line;

The reset circuit is electrically connected to the second scan line and the reset voltage terminal respectively, and the reset circuit is also electrically connected to the second end of the driving circuit or the first end of the driving circuit, and is configured to write the reset voltage provided by the reset voltage terminal into the second end of the driving circuit or the first end of the driving circuit under the control of the second scan signal provided by the second scan line;

The driving circuit is configured to control to connect the first end of the driving circuit and the second end of the driving circuit under the control of the potential of the control end.

At least one embodiment of the pixel circuit described in the present disclosure includes a first initialization circuit and a reset circuit. The first initialization circuit writes a first initial voltage to the first end of the driving circuit before the data voltage is written into the second end of the driving circuit, so as to cooperate with the compensation control circuit included in the pixel circuit to write the first initial voltage into the control end of the driving circuit; under the control of the second scan signal, before the data voltage is written into the second end of the driving circuit, in the non-light emitting period, the reset circuit writes the reset voltage into the second end of the driving circuit or the first end of the driving circuit to provide a bias voltage to the driving transistor in the driving circuit (at this time, the gate potential of the driving transistor is also initialized to Vi1), the driving transistor is maintained in the reset state to improve the hysteresis of the driving transistor, which is beneficial to the FFR (first frame response time) of the display screen.

In specific implementation, the magnetic hysteresis of the driving transistor will cause the characteristic response of the driving transistor to be relatively slow. However, in at least one embodiment of the present disclosure, the gate-source voltage of the driving transistor is quickly reset before the data voltage is written, which is beneficial to increase the recovery speed of the driving transistor, improve the hysteresis of the driving transistor and improve the hysteresis recovery speed.

In at least one embodiment of the present disclosure, one second scan signal generation module may be used to provide the second scan signal to the second scan line, which facilitates resetting the potential of the second end of the driving circuit.

In at least one embodiment of the present disclosure, the reset voltage is a constant voltage, so as to provide a fixed bias voltage for the driving transistor and improve the hysteresis phenomenon.

Optionally, the first initial voltage is a low potential constant voltage, and the voltage value of the first initial voltage is greater than or equal to −6V and less than or equal to −2V; for example, the voltage value of the first initialization voltage may be −6V, −5V, −4V, −3V or −2V, but not limited thereto.

In a specific implementation, the reset voltage can be a high potential constant voltage to ensure that the driving transistor in the driving circuit can be quickly turned on at the beginning of the data writing-in phase; the reset voltage is greater than or equal to 4V and less than or equal to 10V; or, The reset voltage may be a low potential constant voltage, and the reset voltage is greater than or equal to −6V and less than or equal to −2V.

Optionally, when the reset voltage is a high potential constant voltage, the reset voltage may be, for example, 4V, 5V, 6V, 7V, 8V, 9V or 10V, but not limited thereto;

When the reset voltage is a low potential constant voltage, the reset voltage may be, for example, −6V, −5V, −4V, −3V or −2V, but not limited thereto.

In at least one embodiment of the present disclosure, when the reset voltage is a low potential constant voltage, the voltage value of the reset voltage is approximately the same as the voltage value of the first initial voltage, so that when the reset circuit writes the reset voltage into the second end of the driving circuit and the first initialization circuit writes the first initial voltage into the first end of the driving circuit, the driving transistor in the driving circuit will not in fault.

When the voltage value of the reset voltage is approximately the same as the voltage value of the first initial voltage, it means that the absolute value of the difference between the voltage value of the reset voltage and the voltage value of the first initial voltage is less than a predetermined voltage difference. For example, the predetermined voltage difference may be 0.1V or 0.05V, but not limited thereto.

In at least one embodiment of the present disclosure, the threshold voltage Vth of the driving transistor in the driving circuit may be greater than or equal to −5V and less than or equal to −2V, and Vth may be greater than or equal to −4V and less than or equal to −2.5V; for example, Vth can be −4V, −3.5V, −3V or −2.5V, but not limited thereto.

Optionally, the driving circuit includes a driving transistor, and the absolute value of the voltage value of the reset voltage is greater than 1.5 times of the absolute value of the threshold voltage, so as to ensure that the bias effect can be quickly achieved in a relatively short period of time. The threshold voltage is the threshold voltage of the driving transistor. For example, the absolute value of the voltage value of the reset voltage may be greater than 2 times, 2.5 times or 3 times of the absolute value of the threshold voltage, but not limited thereto.

As shown in FIG. 61, the pixel circuit according to the embodiment of the present disclosure includes a driving circuit 11, a first initialization circuit 13 and a reset circuit 20;

The first initialization circuit 13 is respectively electrically connected to the initialization control line R1, the first end of the driving circuit 11 and the first initial voltage terminal, and is configured to write the first initial voltage Vi1 provided by the first initial voltage terminal into the first end of the driving circuit 11 under the control of the initialization control signal provided by the initialization control line R1;

The reset circuit 20 is electrically connected to the second scan line S2 and the reset voltage terminal DR respectively, and the reset circuit 20 is also electrically connected to the second end of the driving circuit 11, is configured to write the reset voltage provided by the reset voltage terminal DR into the second end of the driving circuit 11 under the control of the second scan signal provided by the second scan line S2;

The driving circuit 11 is configured to control to connect the first end of the driving circuit 11 and the second end of the driving circuit 12 under the control of the potential of the control end of the driving circuit.

In FIG. 61, N1 is the first node, and the first node N1 is electrically connected to the control end of the driving circuit 11.

When at least one embodiment of the pixel circuit shown in FIG. 61 of the present disclosure is in operation, the display period may include an initialization phase and a reset phase;

In the initialization phase, the first initialization circuit 13 writes the first initial voltage Vi1 into the first end of the driving circuit 11 under the control of the initialization control signal;

In the reset phase, the reset circuit 20 writes the reset voltage into the second end of the driving circuit 11 under the control of the second scan signal.

As shown in FIG. 62, the pixel circuit described in at least one embodiment of the present disclosure may include a driving circuit 11, a first initialization circuit 13 and a reset circuit 20;

The first initialization circuit 13 is respectively electrically connected to the initialization control line R1, the first end of the driving circuit 11 and the first initial voltage terminal, and is configured to write the first initial voltage Vi1 provided by the first initial voltage terminal into the first end of the driving circuit 11 under the control of the initialization control signal provided by the initialization control line R1;

The reset circuit 20 is electrically connected to the second scan line S2 and the reset voltage terminal DR respectively, and the reset circuit 20 is also electrically connected to the first end of the driving circuit 11, is configured to write the reset voltage provided by the reset voltage terminal DR into the first end of the driving circuit 11 under the control of the second scan signal provided by the second scan line S2.

When at least one embodiment of the pixel circuit shown in FIG. 62 of the present disclosure is in operation, the display period may include an initialization phase and a reset phase;

In the initialization phase, the first initialization circuit 13 writes the first initial voltage Vi1 into the first end of the driving circuit 11 under the control of the initialization control signal;

In the reset phase, the reset circuit 20 writes the reset voltage to the first end of the driving circuit 11 under the control of the second scan signal.

Optionally, the first initialization circuit includes a second transistor;

The control electrode of the second transistor is electrically connected to the initialization control line, the first electrode of the second transistor is electrically connected to the first initial voltage terminal, and the second electrode of the second transistor is electrically connected to the first end of the driving circuit.

In at least one embodiment of the present disclosure, the second transistor may be a low temperature polysilicon thin film transistor, but not limited thereto.

Optionally, the reset circuit includes a third transistor;

The control electrode of the third transistor is electrically connected to the second scan line, the first electrode of the third transistor is electrically connected to the reset voltage terminal, and the second electrode of the third transistor is electrically connected to the second end of the driving circuit or the first end of the driving circuit.

In at least one embodiment of the present disclosure, the pixel circuit may include a compensation control circuit;

The compensation control circuit is respectively electrically connected to the first scan line, the control end of the driving circuit and the first end of the driving circuit, and is configured to control to connect the control end of the driving circuit and the first end of the driving circuit under the control of the first scan signal provided by the first scan line.

When the pixel circuit described in at least one embodiment of the present disclosure is in operation, the display period may include an initialization phase; in the initialization phase, the first initialization circuit writes the first initial voltage into the first end of the driving circuit under the control of the initialization control signal. The compensation control circuit controls to connect the control end of the driving circuit and the first end of the driving circuit under the control of the first scan signal, so as to write the first initial voltage into the control end of the driving circuit, so that at the beginning of the data writing-in phase, the driving circuit can control to connect the first end of the driving circuit and the second end of the driving transistor under the control of the potential of the control end.

In the pixel circuit described in at least one embodiment of the present disclosure, the control end of the driving circuit is only directly electrically connected to the compensation control circuit, and the first initialization circuit is directly electrically connected to the first end of the driving circuit, so as to initialize the potential of the control end of the driving circuit through the compensation control circuit and the first initialization circuit, reduce the current leakage path of the control end of the driving circuit, and ensure the stability of the voltage of the first node without increasing the design complexity of the pixel circuit, which is beneficial to improve display quality, improve display uniformity, and reduce flicker.

Optionally, the compensation control circuit includes a first transistor;

The control electrode of the first transistor is electrically connected to the first scan line, the first electrode of the first transistor is electrically connected to the control end of the driving circuit, and the second electrode of the first transistor is electrically connected to the first end of the driving circuit;

The first transistor is an oxide thin film transistor.

In the embodiment of the present disclosure, the compensation control circuit may include a first transistor, and the first transistor is an oxide thin film transistor. Oxide transistors have good hysteresis characteristics, low current leakage, and low mobility. Therefore, in at least one embodiment of the present disclosure, the first transistor is set as an oxide thin film transistor, so as to achieve low current leakage and ensure the stability of the potential of the control end of the driving circuit.

As shown in FIG. 63, on the basis of at least one embodiment of the pixel circuit shown in FIG. 61, the pixel circuit described in at least one embodiment of the present disclosure may further include a compensation control circuit 12;

The compensation control circuit 12 is electrically connected to the first scan line S1, the control end of the driving circuit 11 and the first end of the driving circuit 11, respectively, and is configured to control to connect the control end of the driving circuit 11 and the first end of the driving circuit 11 under the control of the first scan signal provided by the first scan line S1.

During operation of at least one embodiment of the pixel circuit shown in FIG. 63 of the present disclosure, the display period may include an initialization phase. In the initialization phase, the compensation control circuit 12 controls to connect the control end of the driving circuit 11 and the first end of the driving circuit 11 under the control of the first scan signal.

As shown in FIG. 64, on the basis of at least one embodiment of the pixel circuit shown in FIG. 62, the pixel circuit described in at least one embodiment of the present disclosure may further include a compensation control circuit 12;

The compensation control circuit 12 is electrically connected to the first scan line S1, the control end of the driving circuit 11 and the first end of the driving circuit 11, respectively, and is configured to control to connect the control end of the driving circuit 11 and the first end of the driving circuit 11 under the control of the first scan signal provided by the first scan line S1.

During operation of at least one embodiment of the pixel circuit shown in FIG. 64 of the present disclosure, the display period may include an initialization phase. In the initialization phase, the compensation control circuit 12 controls to connect the control end of the driving circuit 11 and the first end of the driving circuit 11 under the control of the first scan signal.

In at least one embodiment of the present disclosure, the pixel circuit may further include a light emitting element, an energy storage circuit, a second initialization circuit, a data writing-in circuit, and a light emitting control circuit;

the energy storage circuit is electrically connected to the control end of the driving circuit for storing electrical energy;

The second initialization circuit is respectively electrically connected to the third scan line, the second initial voltage terminal and the first electrode of the light emitting element, and is configured to write the second initial voltage provided by the second initial voltage terminal into the first electrode of the light emitting element under the control of the third scan signal provided by the third scan line;

The data writing-in circuit is electrically connected to the fourth scan line, the data line and the second end of the driving circuit, respectively, and is configured to write the data voltage provided by the line into the second end of the driving circuit under the control of the fourth scan signal provided by the fourth scan line;

The light emitting control circuit is respectively electrically connected with the light emitting control line, the first voltage terminal, the second end of the driving circuit, the first end of the driving circuit and the first electrode of the light emitting element, and is configured to, under the control of the light emitting control signal provided by the light emitting control line, control to connect the first voltage terminal and the second end of the driving circuit, and connect the first end of the driving circuit and the first electrode of the light emitting element;

The second electrode of the light emitting element is electrically connected to the second voltage terminal.

In at least one embodiment of the present disclosure, the pixel circuit may further include a light emitting element, an energy storage circuit, a second initialization circuit, a data writing-in circuit, and a light emitting control circuit, wherein the second initialization circuit initializes the first electrode of the light emitting element, the data writing-in circuit writes the data voltage into the second end of the driving circuit, and the light emitting control circuit controls to connect the first voltage end and the second end of the driving circuit under the control of the light emitting control signal, and controls to connect first end of the driving circuit and the first electrode of the light emitting element.

Optionally, the light emitting element may be an organic light emitting diode, the first electrode of the light emitting element may be the anode of the organic light emitting diode, and the second electrode of the light emitting element may be the cathode of the organic light emitting diode;

The first voltage terminal may be a high voltage terminal, and the second voltage terminal may be a low voltage terminal, but is not limited to this.

As shown in FIG. 65, on the basis of at least one embodiment of the pixel circuit shown in FIG. 63, the pixel circuit described in at least one embodiment of the present disclosure may further include a light emitting element 40, an energy storage circuit 41, a second initialization circuit 42, a data writing-in circuit 43 and a light emitting control circuit 44;

The energy storage circuit 41 is electrically connected to the control end of the driving circuit 11 for storing electrical energy;

The second initialization circuit 42 is respectively electrically connected to the third scan line S3, the second initial voltage terminal and the first electrode of the light emitting element 40, and is configured to write the second initial voltage Vi2 provided by the second initial voltage terminal into the first electrode of the light emitting element 40 under the control of the third scan signal provided by the third scan line S3;

The data writing-in circuit 43 is electrically connected to the fourth scan line S4, the data line D1 and the second end of the driving circuit 11 respectively, and is configured to write the data voltage provided by the data line D1 into the second end of the driving circuit 11 under the control of the fourth scan signal provided by the fourth scan line S4;

The light emitting control circuit 44 is respectively electrically connected to the first voltage terminal V1 of the light emitting control line E1, the second end of the driving circuit 11, the first end of the driving circuit 11 and the first electrode of the light emitting element 40, configured to control to connect the first voltage terminal V1 and the second end of the driving circuit 11 under the control of the light emitting control signal provided by the light emitting control line E1, and control to connect the first end of the driving circuit 11 and the first electrode of the light emitting element 40;

The second electrode of the light emitting element 40 is electrically connected to the second voltage terminal V2.

When at least one embodiment of the pixel circuit shown in FIG. 65 of the present disclosure is in operation, the display period further includes a data writing-in phase and a light emitting phase arranged after the initialization phase;

In the data writing-in phase, the data writing-in circuit 43 writes the data voltage Vdata provided by the data line D1 into the second end of the driving circuit 11 under the control of the fourth scan signal; the compensation control circuit 12 controls to connect the control end of the driving circuit 11 and the first end of the driving circuit 11 under the control of the first scan signal;

At the beginning of the data writing-in phase, the driving circuit 11 controls to connect the first end of the driving circuit 11 and the second end of the driving circuit 11 under the control of the control end thereof, to charge the energy storage circuit 41 through the data voltage Vdata, thereby changing the potential of the control end of the driving circuit 11 until the potential of the control end of the driving circuit 11 becomes Vdata+Vth, wherein Vth is the threshold voltage of the driving transistor included in the driving circuit 11;

In the light emitting phase, under the control of the light emitting control signal, the light emitting control circuit 44 controls to connect the first voltage terminal V1 and the second end of the driving circuit 11, and controls to connect the first end of the driving circuit 11 and the first electrode of the light emitting element 40, and the driving circuit 11 drives the light emitting element 40 to emit light.

In a specific implementation, the reset phase may be set between the initialization phase and the data writing-in phase, but is not limited thereto.

As shown in FIG. 66, on the basis of at least one embodiment of the pixel circuit shown in FIG. 64, the pixel circuit described in at least one embodiment of the present disclosure may further include a light emitting element 40, an energy storage circuit 41, and a second initialization circuit 42, a data writing-in circuit 43 and a light emitting control circuit 44;

The energy storage circuit 41 is electrically connected to the control end of the driving circuit 11 for storing electrical energy;

The second initialization circuit 42 is respectively electrically connected to the third scan line S3, the second initial voltage terminal and the first electrode of the light emitting element 40, and is configured to write the second initial voltage Vi2 provided by the second initial voltage terminal into the first electrode of the light emitting element 40 under the control of the third scan signal provided by the third scan line S3.

The data writing-in circuit 43 is electrically connected to the fourth scan line S4, the data line D1 and the second end of the driving circuit 11 respectively, and is configured to write the data voltage provided by the data line D1 into the second end of the driving circuit 11 under the control of the fourth scan signal provided by the fourth scan line S4;

The light emitting control circuit 44 is respectively electrically connected to the light emitting control line E1, the first voltage terminal V1, the second end of the driving circuit 11, the first end of the driving circuit 11 and the first electrode of the light emitting element 40, is configured to control to connect the first voltage terminal V1 and the second end of the driving circuit 11 under the control of the light emitting control signal provided by the light emitting control line E1, and control to connect the first end of the driving circuit 11 and the first electrode of the light emitting element 40;

The second electrode of the light emitting element 40 is electrically connected to the second voltage terminal V2.

When at least one embodiment of the pixel circuit shown in FIG. 66 of the present disclosure is in operation, the display period further includes a data writing-in phase and a light emitting phase arranged after the initialization phase;

In the data writing-in phase, the data writing-in circuit 43 writes the data voltage Vdata provided by the data line D1 into the second end of the driving circuit 11 under the control of the fourth scan signal; the compensation control circuit 12 controls to connect the control end of the driving circuit 11 and the first end of the driving circuit 11 under the control of the first scan signal;

At the beginning of the data writing-in phase, the driving circuit 11 controls to connect the first end of the driving circuit 11 and the second end of the driving circuit 11 under the control of the control end thereof, to charge the energy storage circuit 41 through the data voltage Vdata, thereby changing the potential of the control end of the driving circuit 11 until the potential of the control end of the driving circuit 11 becomes Vdata+Vth, wherein Vth is the threshold voltage of the driving transistor included in the driving circuit 11.

In the light emitting phase, under the control of the light emitting control signal, the light emitting control circuit 44 controls to connect the first voltage terminal V1 and the second end of the driving circuit 11, and controls to connect the first end of the driving circuit 11 and the first electrode of the light emitting element 40, and the driving circuit 11 drives the light emitting element 40 to emit light.

As shown in FIG. 67, the pixel circuit described in at least one embodiment of the present disclosure may include a driving circuit 11, a compensation control circuit 12, a first initialization circuit 13, a light emitting element 40, an energy storage circuit 41, a second initialization circuit 42, a data writing-in circuit 43 and a light emitting control circuit 44;

The compensation control circuit 12 is electrically connected to the first scan line S1, the control end of the driving circuit 11 and the first end of the driving circuit 11, respectively, and is configured to control to connect the control end of the driving circuit 11 and the first end of the driving circuit under the control of the first scan signal provided by the first scan line S1.

The first initialization circuit 13 is respectively electrically connected to the initialization control line R1, the first end of the driving circuit 11 and the first initial voltage terminal, and is configured to write the first initial voltage Vi1 provided by the first initial voltage terminal into the first end of the driving circuit 11 under the control of the initialization control signal provided by the initialization control line R1;

The driving circuit 11 is used to control to connect the first end of the driving circuit 11 and the second end of the driving circuit 12 under the control of the potential of the control end;

The energy storage circuit 41 is electrically connected to the control end of the driving circuit 11 for storing electrical energy;

The second initialization circuit 42 is respectively electrically connected to the third scan line S3, the second initial voltage terminal and the first electrode of the light emitting element 40, and is configured to write the second initial voltage Vi2 provided by the second initial voltage terminal into the first electrode of the light emitting element 40 under the control of the third scan signal provided by the third scan line S3;

The data writing-in circuit 43 is electrically connected to the fourth scan line S4, the data line D1 and the second end of the driving circuit 11 respectively, and is configured to write the data voltage provided by the data line D1 into the second end of the driving circuit 11 under the control of the fourth scan signal provided by the fourth scan line S4;

The light emitting control circuit 44 is respectively electrically connected to the light emitting control line E1, the first voltage terminal V1, the second end of the driving circuit 11, the first end of the driving circuit 11 and the first electrode of the light emitting element 40, is configured to control to connect the first voltage terminal V1 and the second end of the driving circuit 11 under the control of the light emitting control signal provided by the light emitting control line E1, and control to connect the first end of the driving circuit 11 and the first electrode of the light emitting element 40;

The second electrode of the light emitting element 40 is electrically connected to the second voltage terminal V2.

During operation of at least one embodiment of the pixel circuit shown in FIG. 67 of the present disclosure, the display period includes an initialization phase, a data writing-in phase, and a light emitting phase that are set in sequence;

In the initialization phase, the first initialization circuit 13 writes the first initial voltage Vi1 into the first end of the driving circuit 11 under the control of the initialization control signal, and the compensation control circuit 12 controls to connect the control end of the driving circuit 11 and the first end of the driving circuit 11 under the control of the first scan signal, so as to write the first initial voltage Vi1 into the control end of the driving circuit 11, so that at the beginning of the data writing-in phase, the driving circuit 11 controls to connect the first end of the driving circuit 11 and the second end of the driving transistor 11 under the control of the potential of the control end;

In the data writing-in phase, the data writing-in circuit 43 writes the data voltage Vdata provided by the data line D1 into the second end of the driving circuit 11 under the control of the fourth scan signal; the compensation control circuit 12 controls to connect the control end of the driving circuit 11 and the first end of the driving circuit 11 under the control of the first scan signal;

At the beginning of the data writing-in phase, the driving circuit 11, under the control of the control end thereof, controls to connect the first end of the driving circuit 11 and the second end of the driving circuit 11 to charge the energy storage circuit 41 through the data voltage Vdata, thereby changing the potential of the control end of the driving circuit 11 until the potential of the control end of the driving circuit 11 becomes Vdata+Vth, wherein Vth is the threshold voltage of the driving transistor included in the driving circuit 11;

In the light emitting phase, under the control of the light emitting control signal, the light emitting control circuit 44 controls to connect the first voltage terminal V1 and the second end of the driving circuit 11, and controls to connect the first end of the driving circuit 11 and the first electrode of the light emitting element 40, and the driving circuit 11 drives the light emitting element 40 to emit light.

In at least one embodiment of the pixel circuit shown in FIG. 65, FIG. 66, and FIG. 67, one third scan signal generation module can be used to provide the third scan signal to the third scan line S3, which is beneficial for switching of the switching frequency (the switching frequency is the switching frequency of the transistor included in the second initialization circuit) under low-frequency flickering, but not limited thereto. During specific implementation, the third scan signal and the fourth scan signal may also be the same scan signal.

When the display panel to which the pixel circuit is applied is in operation at a low frequency, the light emitting control circuit 44 controls to disconnect the first voltage terminal V1 from the second end of the driving circuit 11, and controls to disconnect the first end of the driving circuit 11 from the first electrode of the light emitting element 40, at this time, the frequency of the third scan signal can be increased to reduce flicker.

In at least one embodiment of the present disclosure, the second scan signal and the third scan signal may be the same scan signal, and the second scan signal generation module and the third scan signal generation module may be the same modules, but not limited to this. During specific implementation, the second scan signal may also be a different scan signal from the third scan signal.

When at least one embodiment of the pixel circuit shown in FIGS. 65, 66, and 67 of the present disclosure is in operation, in the non-light emitting phase, before the data voltage is written to the second end of the driving circuit 11, the second initialization circuit 42 writes the second initial voltage Vi2 provided by the second initial voltage terminal into the first electrode of the light emitting element 40 under the control of the third scan signal provided by the third scan line S3, to control the light emitting element 40 not to emit light, and the residual charge of the first electrode of the light emitting element 40 is cleared.

In at least one embodiment of the present disclosure, the time interval between the initialization phase and the data writing-in phase is greater than a predetermined time interval, so as to improve the hysteresis of the driving transistor by initializing the gate potential of the driving transistor in advance, reduce the high and low frequency flicker of the pixel circuit.

During specific implementation, the predetermined time interval may be selected according to actual conditions.

In at least one embodiment of the pixel circuit shown in FIG. 65, FIG. 66, and FIG. 67 of the present disclosure, the initialization control signal provided by the initialization control line R1 and the fourth scan signal may be generated by the same fourth scan signal generation module, the fourth scan signal may be the Nth stage of fourth scan signal generated by the fourth scan signal generation module, and the initialization control signal may be the (N-M)th stage of fourth scan signal generated by the fourth scan signal generation module, to initialize the potential of the gate electrode of the driving transistor in advance; N is a positive integer, M can be a positive integer greater than 6, for example, M can be 14, but not limited thereto.

Optionally, the data writing-in circuit includes a fourth transistor;

The control electrode of the fourth transistor is electrically connected to the fourth scan line, the first electrode of the fourth transistor is electrically connected to the data line, and the second electrode of the fourth transistor is electrically connected to the second end of the driving circuit;

the light emitting control circuit includes a fifth transistor and a sixth transistor;

The control electrode of the fifth transistor is electrically connected to the light emitting control line, the first electrode of the fifth transistor is electrically connected to the first voltage terminal, and the second electrode of the fifth transistor is electrically connected to the second end of the driving circuit;

The control electrode of the sixth transistor is electrically connected to the light emitting control line, the first electrode of the sixth transistor is electrically connected to the first end of the driving circuit, and the second electrode of the sixth transistor is electrically connected to the first electrode of the light emitting element;

the second initialization circuit includes a seventh transistor;

The control electrode of the seventh transistor is electrically connected to the third scan line, the first electrode of the seventh transistor is electrically connected to the second initial voltage terminal, and the second electrode of the seventh transistor is electrically connected to the first electrode of the light emitting element;

The driving circuit includes a driving transistor; the control electrode of the driving transistor is electrically connected to the control end of the driving circuit, the first electrode of the driving transistor is electrically connected to the first end of the driving circuit, and the second electrode of the driving transistor is electrically connected to the second end of the driving circuit;

The energy storage circuit includes a storage capacitor; a first end of the storage capacitor is electrically connected to a control end of the driving circuit, and a second end of the storage capacitor is connected to the first voltage terminal.

As shown in FIG. 68, based on at least one embodiment of the pixel circuit shown in FIG. 65, the light emitting element is an organic light emitting diode O1; the compensation control circuit 12 includes a first transistor T1; the driving circuit 11 includes the driving transistor T0;

The gate electrode of the first transistor T1 is electrically connected to the first scan line S1, the drain electrode of the first transistor T1 is electrically connected to the gate electrode of the driving transistor T0, and the source electrode of the first transistor T1 is electrically connected to the drain electrode of the driving transistor T1;

The first initialization circuit 13 includes a second transistor T2;

The gate electrode of the second transistor T2 is electrically connected to the initialization control line R1, the drain electrode of the second transistor T2 is electrically connected to the first initial voltage terminal, and the source electrode of the second transistor T2 is electrically connected to the drain electrode of the driving transistor T0; the first initial voltage terminal is used to provide the first initial voltage Vi1;

The reset circuit 20 includes a third transistor T3;

The gate electrode of the third transistor T3 is electrically connected to the second scan line S2, the drain electrode of the third transistor T3 is electrically connected to the reset voltage terminal DR, and the source electrode of the third transistor T3 is electrically connected to the source electrode of the driving transistor T0;

The data writing-in circuit 43 includes a fourth transistor T4;

The gate electrode of the fourth transistor T4 is electrically connected to the fourth scan line S4, the drain electrode of the fourth transistor T4 is electrically connected to the data line D1, and the source electrode of the fourth transistor T4 is electrically connected to the source electrode of driving transistor T0;

The light emitting control circuit includes a fifth transistor T5 and a sixth transistor T6;

The gate electrode of the fifth transistor T5 is electrically connected to the light emitting control line E1, the drain electrode of the fifth transistor T5 is electrically connected to the high voltage terminal, and the source electrode of the fifth transistor T5 is electrically connected to the source electrode of the driving transistor T0; the high voltage terminal is used to provide a high voltage signal VDD;

The gate electrode of the sixth transistor T6 is electrically connected to the light emitting control line E1, the drain electrode of the sixth transistor T6 is electrically connected to the drain electrode of the driving transistor T0, and the source electrode of the sixth transistor T6 is electrically connected to the anode of the organic light emitting diode O1; the cathode of O1 is electrically connected to the low-voltage terminal, and the low-voltage terminal is used for providing the low-voltage signal VSS;

The second initialization circuit 42 includes a seventh transistor T7;

The gate electrode of the seventh transistor T7 is electrically connected to the third scan line S3, the drain electrode of the seventh transistor T7 is electrically connected to the second initial voltage terminal, and the source electrode of the seventh transistor T7 is electrically connected to the anode of the organic light emitting diode O1; the second initial voltage terminal is used to provide the second initial voltage Vi2;

The energy storage circuit 41 includes a storage capacitor C; the first end of the storage capacitor C is electrically connected to the gate electrode of the driving transistor T0, and the second end of the storage capacitor C is connected to the high voltage terminal.

In at least one embodiment of the pixel circuit shown in FIG. 68, T1 is an oxide thin film transistor, T2, T3, T4, T5, T6 and T7 are low temperature polysilicon thin film transistors, T1 is an n-type transistor, T2, T3, T4, T5, T6 and T7 are p-type transistors.

In at least one embodiment of the pixel circuit shown in FIG. 68, N1 is the first node electrically connected to the gate electrode of T0, N2 is the second node electrically connected to the source electrode of T0, and N3 is third node electrically connected to the drain electrode of T0.

In at least one embodiment of the pixel circuit shown in FIG. 68, the initialization control signal and the fourth scan signal may be provided by the same fourth scan signal generation module.

In the specific implementation, when the reset voltage provided by the DR is a high voltage, the reset phase and the initialization phase are different phases to avoid the short circuit between the gate electrode and the source electrode of T0; when the reset voltage provided by the DR is a low voltage, the reset phase and the initialization phase are the same phase.

As shown in FIG. 69, when at least one embodiment of the pixel circuit shown in FIG. 68 of the present disclosure is in operation, when the reset voltage provided by the DR is a high voltage, the display period may include an initialization phase t1, a reset phase t2, a data writing-in phase t3 and a light emitting phase t4 that are set in sequence;

In the initialization phase t1, E1 provides a high voltage signal, R1 provides a low voltage signal, S4 provides a high voltage signal, S1 provides a high voltage signal, both S2 and S3 provide a high voltage signal, T1 and T2 are turned on to write Vi1 into N1, the potential of the gate electrode of T0 is initialized, so that at the beginning of the data writing-in phase t3, T0 can be turned on;

In the reset phase t2, E1 provides a high voltage signal, R1 provides a high voltage signal, S4 provides a high voltage signal, S1 provides a low voltage signal, both S2 and S3 provide a low voltage signal, and T3 and T7 are turned on to initialize the potential of N2 through the high voltage provided by DR, so as to reset the gate-source voltage of T0, which is beneficial to increase the recovery speed of T0, improve the hysteresis phenomenon of T0 and improve the hysteresis recovery speed; Vi2 is written into the anode of O1, so that O1 does not emit light and clear the residual charge of the anode of O1;

In the data writing-in phase t3, E1 provides a high voltage signal, R1 provides a high voltage signal, S4 provides a low voltage signal, S1 provides a high voltage signal, S2 and S3 both provide a high voltage signal, T1 is turned on, and T4 is turned on;

At the beginning of the data writing-in phase t3, T0 is turned on, and C is charged by the data voltage Vdata provided by D1, to increase the potential of N1 until T0 is turned off, the potential of N1 is Vdata+Vth, wherein Vth is the threshold voltage of T0;

In the light emitting phase, E1 provides a low voltage signal, R1 provides a high voltage signal, S4 provides a high voltage signal, S1 provides a low voltage signal, S2 and S3 both provide a high voltage signal, T5, T0 and T6 are turned on, and T0 drives O1 to emit light.

As shown in FIG. 70, during operation of at least one embodiment of the pixel circuit shown in FIG. 68 of the present disclosure, when the reset voltage provided by the DR is a low voltage, the display period may include an initialization phase t1, a data writing-in phase t3, and a light emitting phase t4 that are set in sequence;

In the initialization phase t1, E1 provides a high voltage signal, R1 provides a low voltage signal, S4 provides a high voltage signal, S1 provides a high voltage signal, both S2 and S3 provide a low voltage signal, T1 and T2 are turned on to write Vi1 into N1, so that at the beginning of the data writing-in phase t3, T0 can be turned on; T3 and T7 are turned on, the reset voltage provided by DR is written into N2, and Vi2 is written into the anode of O1 to reset the gate-source voltage of T0, which is beneficial to increase the recovery speed of T0, improve the hysteresis phenomenon of T0 and improve the hysteresis recovery speed; Vi2 is written into the anode of O1, so that O1 does not emit light and clear the residual charge of the anode of O1;

In the data writing-in phase t3, E1 provides a high voltage signal, R1 provides a high voltage signal, S4 provides a low voltage signal, S1 provides a high voltage signal, S2 and S3 both provide a high voltage signal, T1 is turned on, and T4 is turned on;

At the beginning of the data writing-in phase t3, T0 is turned on, and the data voltage Vdata provided by D1 charges C to increase the potential of N1 until T0 is turned off, the potential of N1 is Vdata+Vth, wherein Vth is the threshold voltage of T0;

In the light emitting phase, E1 provides a low voltage signal, R1 provides a high voltage signal, S4 provides a high voltage signal, S1 provides a low voltage signal, S2 and S3 both provide a high voltage signal, T5, T0 and T6 are turned on, and T0 drives O1 to emit light.

As shown in FIG. 71, when at least one embodiment of the pixel circuit shown in FIG. 68 of the present disclosure is in operation, when the initialization control signal provided by R1 is the (N−14)th stage of fourth scan signal of, and the fourth scan signal provided by S4 is the Nth stage of fourth scan signal, the display period may include an initialization phase t1, a reset phase t2, a data writing-in phase t3 and a light emitting phase t4 that are set in sequence; in the initialization phase t1, E1 provides a high voltage signal, and S1 provides a high voltage signal, R1 provides a low voltage signal, S2 and S3 both provide a high voltage signal, S4 provides a high voltage signal, T1 and T2 are turned on to write Vi1 into N1, so that at the beginning of the data writing-in phase t3, T0 can be turned on;

In the reset phase t2, E1 provides a high voltage signal, S1 provides a high voltage signal, R1 provides a high voltage signal, both S2 and S3 provide a low voltage signal, S4 provides a high voltage signal, and T3 and T7 are turned on to initialize the potential of N2 through the high voltage provided by DR, to reset the gate-source voltage of T0, which is beneficial to increase the recovery speed of T0, improve the hysteresis phenomenon of T0 and improve the hysteresis recovery speed; Vi2 is written into the anode of O1, so that O1 does not emit light, and the residual charge of the anode of O1 is cleared; T1 is turned on, T2 is turned off, and T5 and T6 are turned off;

In the data writing-in phase t3, E1 provides a high voltage signal, S1 provides a high voltage signal, R1 provides a high voltage signal, both S2 and S3 provide a high voltage signal, S4 provides a low voltage signal, and T1 and T4 are turned on to write Vdata into N2, and connect N1 and N3 to charge C through the data voltage Vdata on D1, the potential of N1 is increased until T0 is turned off, at this time the potential of the gate electrode of T0 is Vdata+Vth;

In the light emitting phase t4, E1 provides a low voltage signal, S1 provides a low voltage signal, R1 provides a high voltage signal, S2 and S3 both provide a high voltage signal, S4 provides a high voltage signal, T5, T6 and T0 are turned on, and T0 drives O1 to emit light.

In at least one embodiment of the pixel circuit shown in FIG. 68, the reset voltage provided by DR may be VDD, or, DR and E1 may be the same signal terminal; or, the reset voltage provided by D4 may be the third initialization voltage; but not limited to this.

As shown in FIG. 72, based on at least one embodiment of the pixel circuit shown in FIG. 67, the light emitting element is an organic light emitting diode O1; the compensation control circuit 12 includes a first transistor T1; the driving circuit 11 includes the driving transistor T0;

The gate electrode of the first transistor T1 is electrically connected to the first scan line S1, the drain electrode of the first transistor T1 is electrically connected to the gate electrode of the driving transistor T0, and the source electrode of the first transistor T1 is electrically connected to the drain electrode of the driving transistor T1;

The first initialization circuit 13 includes a second transistor T2;

The gate electrode of the second transistor T2 is electrically connected to the initialization control line R1, the drain electrode of the second transistor T2 is electrically connected to the first initial voltage terminal, and the source electrode of the second transistor T2 is electrically connected to the drain electrode of the driving transistor T0; the first initial voltage terminal is used to provide the first initial voltage Vi1;

The data writing-in circuit 43 includes a fourth transistor T4;

The gate electrode of the fourth transistor T4 is electrically connected to the fourth scan line S4, the drain electrode of the fourth transistor T4 is electrically connected to the data line D1, and the source electrode of the fourth transistor T4 is electrically connected to the source electrode of the driving transistor T0;

The light emitting control circuit includes a fifth transistor T5 and a sixth transistor T6;

The gate electrode of the fifth transistor T5 is electrically connected to the light emitting control line E1, the drain electrode of the fifth transistor T5 is electrically connected to the high voltage terminal, and the source electrode of the fifth transistor T5 is electrically connected to the source electrode of the driving transistor T0; the high voltage terminal is used to provide a high voltage signal VDD;

The gate electrode of the sixth transistor T6 is electrically connected to the light emitting control line E1, the drain electrode of the sixth transistor T6 is electrically connected to the drain electrode of the driving transistor T0, and the source electrode of the sixth transistor T6 is electrically connected to the anode of the organic light emitting diode O1; the cathode of O1 is electrically connected to the low-voltage terminal, and the low-voltage terminal is used for providing the low-voltage signal VSS;

The second initialization circuit 42 includes a seventh transistor T7;

The gate electrode of the seventh transistor T7 is electrically connected to the third scan line S3, the drain electrode of the seventh transistor T7 is electrically connected to the second initial voltage terminal, and the source electrode of the seventh transistor T7 is electrically connected to the anode of the organic light emitting diode O1; the second initial voltage terminal is used to provide the second initial voltage Vi2;

The energy storage circuit 41 includes a storage capacitor C; the first end of the storage capacitor C is electrically connected to the gate electrode of the driving transistor T0, and the second end of the storage capacitor C is connected to the high voltage terminal.

In at least one embodiment of the pixel circuit shown in FIG. 72, T1 is an oxide thin film transistor, T2, T4, T5, T6 and T7 are low temperature polysilicon thin film transistors, T1 is an n-type transistor, T2, T4, T5, T6 and T7 are p-type transistors.

In at least one embodiment of the pixel circuit shown in FIG. 72, N1 is the first node electrically connected to the gate electrode of T0, N2 is the second node electrically connected to the source electrode of T0, and N3 is the third node electrically connected to the drain electrode of T0.

In at least one embodiment of the pixel circuit shown in FIG. 72, the third scan signal and the fourth scan signal are the same scan signal, but not limited thereto.

As shown in FIG. 73, when at least one embodiment of the pixel circuit shown in FIG. 72 of the present disclosure is in operation, the display period may include an initialization phase t1, a data writing-in phase t3 and a light emitting phase t4 that are set in sequence;

In the initialization phase t1, E1 provides a high voltage signal, R1 provides a low voltage signal, both S3 and S4 provide a high voltage signal, S1 provides a high voltage signal, and T1 and T2 are turned on to write Vi1 into N1, so that at the beginning of the data writing-in phase t3, T0 can be turned on;

In the data writing-in phase t3, E1 provides a high voltage signal, R1 provides a high voltage signal, both S3 and S4 provide a low voltage signal, S1 provides a high voltage signal, T7 is turned on to write Vi2 to the anode of O1, T1 and T4 are turned on, to write the data voltage Vdata on D1 into N2, and connect N1 and N3;

At the beginning of the data writing-in phase t3, T0 is turned on, and C is charged through Vdata to increase the potential of the gate electrode of T0 until the potential of the gate electrode of T0 becomes Vdata+Vth, Vth is the threshold voltage of T0, and T0 is turned off;

In the light emitting phase t4, E1 provides a low voltage signal, R1 provides a high voltage signal, S3 and S4 both provide a high voltage signal, S1 provides a low voltage signal, T5, T6 and T0 are turned on, and T0 drives O1 to emit light.

As shown in FIG. 74, when at least one embodiment of the pixel circuit shown in FIG. 72 of the present disclosure is in operation, when the initialization control signal provided by R1 is the (N−14)th stage of fourth scan signal, and the fourth scan signal provided by S4 is the Nth stage of fourth scan signal, the display period may include an initialization phase t1, a data writing-in phase t3 and a light emitting phase t4 that are set in sequence;

In the initialization phase t1, E1 provides a high voltage signal, R1 provides a low voltage signal, both S3 and S4 provide a high voltage signal, S1 provides a high voltage signal, and T1 and T2 are turned on to write Vi1 into N1, so that at the beginning of the data writing-in phase t3, T0 can be turned on;

In the data writing-in phase t3, E1 provides a high voltage signal, R1 provides a high voltage signal, both S3 and S4 provide a low voltage signal, S1 provides a high voltage signal, T7 is turned on to write Vi2 to the anode of O1, T1 and T4 are turned on, to write the data voltage Vdata on D1 into N2, and connect N1 and N3;

At the beginning of the data writing-in phase t3, T0 is turned on, and C is charged through Vdata to increase the potential of the gate electrode of T0 until the potential of the gate electrode of T0 becomes Vdata+Vth, Vth is the threshold voltage of T0, and T0 is turned off;

In the light emitting phase t4, E1 provides a low voltage signal, R1 provides a high voltage signal, S3 and S4 both provide a high voltage signal, S1 provides a low voltage signal, T5, T6 and T0 are turned on, and T0 drives O1 to emit light.

As shown in FIG. 74, the time interval between the initialization phase t1 and the data writing-in phase t3 is relatively large, so that the potential of N1 can be reset in advance, which is beneficial to improve the hysteresis phenomenon of T0.

As shown in FIG. 75, based on at least one embodiment of the pixel circuit shown in FIG. 66, the light emitting element is an organic light emitting diode O1; the compensation control circuit 12 includes a first transistor T1; the driving circuit 11 Including the driving transistor T0;

The gate electrode of the first transistor T1 is electrically connected to the first scan line S1, the drain electrode of the first transistor T1 is electrically connected to the gate electrode of the driving transistor T0, and the source electrode of the first transistor T1 is electrically connected to the drain electrode of the driving transistor T1;

The first initialization circuit 13 includes a second transistor T2;

The gate electrode of the second transistor T2 is electrically connected to the initialization control line R1, the drain electrode of the second transistor T2 is electrically connected to the first initial voltage terminal, and the source electrode of the second transistor T2 is electrically connected to the first electrode of the driving transistor T0; the first initial voltage terminal is used to provide the first initial voltage Vi1;

The reset circuit 20 includes a third transistor T3;

The gate electrode of the third transistor T3 is electrically connected to the second scan line S2, the drain electrode of the third transistor T3 is electrically connected to the reset voltage terminal DR, and the source electrode of the third transistor T3 is electrically connected to the second electrode of the driving transistor T0;

The data writing-in circuit 43 includes a fourth transistor T4;

The gate electrode of the fourth transistor T4 is electrically connected to the fourth scan line S4, the drain electrode of the fourth transistor T4 is electrically connected to the data line D1, and the source electrode of the fourth transistor T4 is electrically connected to the second electrode of the driving transistor T0;

The light emitting control circuit 44 includes a fifth transistor T5 and a sixth transistor T6;

The gate electrode of the fifth transistor T5 is electrically connected to the light emitting control line E1, the drain electrode of the fifth transistor T5 is electrically connected to the high voltage terminal, and the source electrode of the fifth transistor T5 is electrically connected to the second electrode of the driving transistor T0; the high voltage terminal is used to provide a high voltage signal VDD;

The gate electrode of the sixth transistor T6 is electrically connected to the light emitting control line E1, the drain electrode of the sixth transistor T6 is electrically connected to the first electrode of the driving transistor T0, and the source electrode of the sixth transistor T6 is electrically connected to the anode of the organic light emitting diode O1; the cathode of O1 is electrically connected to the low-voltage terminal, and the low-voltage terminal is used to provide the low-voltage signal VSS;

The second initialization circuit 42 includes a seventh transistor T7;

The gate electrode of the seventh transistor T7 is electrically connected to the third scan line S3, the drain electrode of the seventh transistor T7 is electrically connected to the second initial voltage terminal, and the source electrode of the seventh transistor T7 is electrically connected to the anode of the organic light emitting diode O1; the second initial voltage terminal is used to provide the second initial voltage Vi2;

The energy storage circuit 41 includes a storage capacitor C; the first end of the storage capacitor C is electrically connected to the gate electrode of the driving transistor T0, and the second end of the storage capacitor C is connected to the high voltage terminal.

In at least one embodiment of the pixel circuit shown in FIG. 75, T1 is an oxide thin film transistor, T2, T3, T4, T5, T6 and T7 are low temperature polysilicon thin film transistors, T1 is an n-type transistor, T2, T3, T4, T5, T6 and T7 are p-type transistors.

In at least one embodiment of the pixel circuit shown in FIG. 75, N1 is the first node electrically connected to the gate electrode of T0, N2 is the second node electrically connected to the second electrode of T0, and N3 is the third node electrically connected to the first electrode of T0.

In at least one embodiment of the pixel circuit shown in FIG. 75, the first electrode of T0 may be the drain electrode, and the second electrode of T0 may be the source electrode; or, the first electrode of T0 may be the source electrode, and the second electrode of T0 may be the drain electrode.

In at least one embodiment of the pixel circuit shown in FIG. 75 of the present disclosure, the initialization control signal provided by R1 may be the (N−14)th stage of fourth scan signal, and the fourth scan signal provided by S4 may be the Nth stage of fourth scan signal, but not limited thereto.

As shown in FIG. 76, when at least one embodiment of the pixel circuit shown in FIG. 75 of the present disclosure is in operation, the display period may include an initialization phase t1, a reset phase t2, a data writing-in phase t3, and a light emitting phase t4 that are set in sequence;

In the initialization phase t1, E1 provides a high voltage signal, S1 provides a high voltage signal, R1 provides a low voltage signal, both S2 and S3 provide a high voltage signal, S4 provides a high voltage signal, T1 and T2 are turned on to write Vi1 to N1, so that T0 can be turned on at the beginning of the data writing-in phase t3;

In the reset phase t2, E1 provides a high voltage signal, S1 provides a high voltage signal, R1 provides a high voltage signal, both S2 and S3 provide a low voltage signal, S4 provides a high voltage signal, and T3 and T7 are turned on to initialize the potential of N2 through the high voltage provided by DR, to reset the gate-source voltage of T0, which is beneficial to increase the recovery speed of T0, improve the hysteresis phenomenon of T0 and improve the hysteresis recovery speed; Vi2 is written into the anode of O1, so that O1 does not emit light, and the residual charge of the anode of O1 is cleared; T1 is turned on, T2 is turned off, and T5 and T6 are turned off;

In the data writing-in phase t3, E1 provides a high voltage signal, S1 provides a high voltage signal, R1 provides a high voltage signal, both S2 and S3 provide a high voltage signal, S4 provides a low voltage signal, and T1 and T4 are turned on to write Vdata into N2, connects N1 and N3 to charge C through the data voltage Vdata on D1, the potential of N1 is increased until T0 is turned off, at this time the potential of the gate electrode of T0 is Vdata+Vth;

In the light emitting phase t4, E1 provides a low voltage signal, S1 provides a low voltage signal, R1 provides a high voltage signal, S2 and S3 both provide a high voltage signal, S4 provides a high voltage signal, T5, T6 and T0 are turned on, and T0 drives O1 to emit light.

The driving method described in at least one embodiment of the present disclosure is applied to the above-mentioned pixel circuit, and the display period includes an initialization phase and a reset phase; the driving method includes:

In the initialization phase, writing, by the first initialization circuit, the first initial voltage to the first end of the driving circuit under the control of the initialization control signal;

In the reset phase, writing, by the reset circuit, a reset voltage to the second end of the driving circuit or the first end of the driving circuit under the control of the second scan signal.

In at least one embodiment of the driving method described in the present disclosure, under the control of the second scan signal, before the data voltage is written to the second end of the driving circuit, in the non-light emitting period, the reset circuit writes the reset voltage into the second end of the driving circuit or the first end of the driving circuit, to provide a bias voltage to the driving transistor in the driving circuit (the gate potential of the driving transistor is also initialized to Vi1 at this time), so that the driving transistor remains in the reset state to improve the hysteresis of the driving transistor, which is beneficial to the display FFR (first frame response time).

In at least one embodiment of the present disclosure, when the reset circuit writes a reset voltage to the second end of the driving circuit under the control of the second scan signal in the reset phase, The reset voltage is a high potential constant voltage, the first initial voltage is a low potential constant voltage, and the initialization phase and the reset phase are different time periods; or, The reset voltage and the first initial voltage are a low potential constant voltage, and the initialization phase and the reset phase are the same time period or different time periods.

Optionally, in the reset phase, when the reset circuit writes the reset voltage to the first end of the driving circuit under the control of the second scan signal, the reset phase and the initialization phase are different time periods, so that the first initialization voltage is written into the first end of the driving circuit in the initialization phase, and the reset voltage is written into the first end of the driving circuit in the reset phase.

During specific implementation, the pixel circuit may further include a compensation control circuit, and the driving method may further include:

In the initialization phase, controlling, by the compensation control circuit, to connect the control end of the driving circuit and the first end of the driving circuit under the control of the first scan signal, so as to write the first initial voltage into the control end of the driving circuit.

In the driving method described in the embodiment of the present disclosure, under the control of the first scan signal, the compensation control circuit controls to connect the control end of the driving circuit and the first end of the driving circuit, and the control end of the driving circuit is only directly electrically connected to the compensation control circuit. The first initialization circuit writes the first initial voltage into the first end of the driving circuit under the control of the initialization control signal, and the first initialization circuit is directly electrically connected to the first end of the driving circuit, to initialize the potential of the control end of the driving circuit by compensating control circuit and the first initialization circuit, reduce the current leakage path to the control end of the driving circuit, and ensure the stability of the voltage of the first node under the condition that the design complexity of the pixel circuit does not increase significantly, it is beneficial to improve the display quality, improve the display uniformity, and reduce the flicker.

In a specific implementation, the pixel circuit further includes a data writing-in circuit and an energy storage circuit; the display period further includes a data writing-in phase arranged after the initialization phase; the driving method further includes:

In the data writing-in phase, writing, by the data writing-in circuit, the data voltage Vdata provided by the data line into the second end of the driving circuit under the control of the fourth scan signal; controlling, by the compensation control circuit, to connect the control end of the driving circuit and the first end of the driving circuit under the control of the first scan signal;

At the beginning of the data writing-in phase, the driving circuit, under the control of its control end, connects the first end of the driving circuit and the second end of the driving circuit to charge the energy storage circuit through the data voltage Vdata, so as to change the potential of the control end of the driving circuit until the potential of the control end of the driving circuit becomes Vdata+Vth, wherein Vth is the threshold voltage of the driving transistor included in the driving circuit.

In a specific implementation, the data writing-in phase may be set after the reset phase.

Optionally, the time interval between the initialization phase and the data writing-in phase is greater than a predetermined time interval, so as to improve the hysteresis phenomenon of the driving transistor and reduce the high and low frequency flicker of the pixel circuit by initializing the gate potential of the driving transistor in advance.

In at least one embodiment of the present disclosure, the pixel circuit further includes a light emitting control circuit, and the display period further includes a light emitting phase set after the data writing-in phase; the driving method includes:

In the light emitting phase, controlling, by the light emitting control circuit, to connect the first voltage terminal and the second end of the driving circuit under the control of the light emitting control signal, and control to connect the first end of the driving circuit and the first electrode of the light emitting element, and the driving circuit drives the light emitting element to emit light.

The display device according to at least one embodiment of the present disclosure includes the above-mentioned pixel circuit.

Optionally, the pixel circuit includes a reset circuit and a second initialization circuit; the display device further includes a second scan signal generation module and a third scan signal generation module;

the reset circuit is electrically connected to the second scan line, and the second initialization circuit is electrically connected to the third scan line;

the second scan signal generation module is electrically connected to the second scan line for providing a second scan signal to the second scan line;

The third scan signal generation module is electrically connected to the third scan line for providing a third scan signal to the third scan line.

Optionally, the second scan signal and the third scan signal are the same control signal;

The second scan signal generation module and the third scan signal generation module are the same module.

As shown in FIG. 77, the display device according to at least one embodiment of the present disclosure includes a display panel, and the display panel includes a pixel module P0, and the pixel module P0 includes the above-mentioned pixel circuits in multiple rows and multiple columns; the pixel module P0 is arranged in the valid display area of the display panel;

The display panel further includes a light emitting control signal generation module 70, a first scan signal generation module 71, a first fourth scan signal generation module 721, a second fourth scan signal generation module 722, a second scan signal generation module 73, and a third scan signal generation module 74;

The light emitting control signal generation module 70 is used for providing the light emitting control signal, the first scan signal generation module 71 is used for providing the first scan signal, the first fourth scan signal generation module 721 and the second fourth scan signal generation module 722 are used to provide the fourth scan signal, the second scan signal generation module 73 is used to provide the second scan signal, and the third scan signal generation module 74 is used to provide the third scan signal;

The light emitting control signal generation module 70, the first scan signal generation module 71 and the first fourth scan signal generation module 721 are arranged on the left side of the display panel, The second fourth scan signal generation module 722, the second scan signal generation module 73 and the third scan signal generation module 74 are disposed on the right side of the display panel.

As shown in FIG. 78, the display device according to at least one embodiment of the present disclosure includes a display panel, and the display panel includes a pixel module P0, and the pixel module P0 includes the above-mentioned pixel circuits in multiple rows and multiple columns; the pixel module P0 is arranged in the valid display area of the display panel;

The display panel further includes a light emitting control signal generation module 70, a first first scan signal generation module 711, a second first scan signal generation module 712, a first fourth scan signal generation module 721, a second fourth scan signal generation module 722 and the third scan signal generation module 74;

The light emitting control signal generation module 70 is used for providing the light emitting control signal, the first scan signal generation module 71 is used for providing the first scan signal, the first fourth scan signal generation module 721 and the second fourth scan signal generation module 722 are used for providing the fourth scan signal, and the third scan signal generation module 74 is used for providing the second scan signal and the third scan signal;

The light emitting control signal generation module 70, the first first scan signal generation module 711 and the first fourth scan signal generation module 721 are arranged on the left side of the display panel, The second fourth scan signal generation module 722, the second first scan signal generation module 712 and the third scan signal generation module 74 are disposed on the right side of the display panel.

In FIGS. 77 and 78, the first initialization voltage is labeled Vi1, the second initialization voltage is labeled Vi2, the high voltage signal is labeled VDD, the data line is labeled D1, and the reset voltage terminal is labeled DR.

In the embodiment of the present disclosure, referring to FIG. 6, FIG. 7, FIG. 12, FIG. 14, etc., the width-to-length ratio W/L of the eighth transistor T8 may be approximately equal to the width-to-length ratio W/L of the seventh transistor T7; the width-to-length ratio W/L of the eighth transistor T8 may be greater than the width-to-length ratio W/L of the seventh transistor T7, that is, the width-to-length ratio W/L of T8 may be slightly larger, so that the N2 node can be quickly reset.

In the embodiment of the present disclosure, referring to FIG. 6, FIG. 7, FIG. 12, FIG. 14, etc., the channel width W of the eighth transistor T8 is 1.5-3.5, such as 1.6, 1.8, 1.9, 2.0, 2.2, 2.5, 3.0, etc.; the channel length L is 2.0-4.5; for example, it can be 2.5, 2.7, 3.0, 3.2, 3.5, 4.0, etc.; the channel width W of the seventh transistor T7 is 1.5-3.5, such as 1.6, 1.8, 1.9, 2.0, 2.2, 2.5, 3.0, etc.; the channel length L is 2.0-4.5 such as 2.5, 2.7, 3.0, 3.2, 3.5, 4.0 etc.;

It should be noted that, referring to FIG. 38*a*, FIG. 50, etc., the design of the above-mentioned transistors is also applicable to the seventh transistor T7 and the first transistor T1 in the embodiments shown in FIG. 38*a*, and the transistor T4 and the seventh transistor T7 in the embodiments shown in FIG. 50.

In the embodiment of the present disclosure, referring to FIG. 6, FIG. 7, FIG. 12, FIG. 14, etc., the width-to-length ratio W/L of the eighth transistor T8 may be approximately equal to the width-to-length ratio W/L of the first transistor T1; the width-to-length ratio W/L of the eight transistors T8 may be smaller than the width-to-length ratio W/L of the first transistor T1, so that the reset capability of the N1 node and the N2 node can be balanced.

In the embodiment of the present disclosure, referring to FIG. 6, FIG. 7, FIG. 12, FIG. 14, etc., the width-to-length ratio W/L of the eighth transistor T8 may be greater than the width-to-length ratio W/L of the first transistor T1, so that the reset capability of N2 node can be improved.

In the embodiment of the present disclosure, referring to FIG. 6, FIG. 7, FIG. 12, FIG. 14, etc., the channel width W of the eighth transistor T8 is 1.5-3.5, such as 1.6, 1.8, 1.9, 2.0, 2.2, 2.5, 3.0, etc.; the channel length L is 2.0-4.5; for example, it can be 2.5, 2.7, 3.0, 3.2, 3.5, 4.0, etc.; the channel width W of the first transistor T1 is 1.5-3.5, such as 1.6, 1.8, 1.9, 2.0, 2.2, 2.5, 3.0, etc.; the channel length L is 2.0-4.5, such as 2.5, 2.7, 3.0, 3.2, 3.5, 4.0, etc.;

It should be noted that, referring to FIG. 50, the design of the above-mentioned transistors is also applicable to the fourth transistor T4 and the third transistor T3 in the embodiments of FIG. 50.

The display device provided by the embodiment of the present disclosure may be any product or component with a display function, such as a mobile phone, a tablet computer, a television, a monitor, a notebook computer, a digital photo frame, and a navigator.

It should be noted that, in all the embodiments shown in FIG. 1 to FIG. 78, the names and reference number of the functional modules/electrical devices do not limit the specific functions of the functional modules/electrical devices. For example, the driving circuit 1 in FIGS. 3-26, the driving sub-circuit in FIGS. 27-45, the driving circuit 11 in FIGS. 46-60, and the driving circuit 11 in FIGS. 61-48 all have the same function. For another example, the second reset circuit 3 in FIGS. 3-26, the second reset sub-circuit in FIGS. 27-45, the reset circuit 20 in FIGS. 46-60, and the reset circuit 20 in FIGS. 61-48 all have the same function. For example, the third reset circuit 4 in FIGS. 3-26, the first reset sub-circuit in FIGS. 27-45, the second initialization circuit 32 in FIGS. 46-60, and the second initialization circuit 42 in FIGS. 60-78 are all have the same function; for another example, the threshold compensation circuit 8 in FIGS. 3-26, the second transistor T2 in FIGS. 27-45, the compensation control circuit 13 and the compensation control circuit 12 in FIGS. 46-60 all have the same function. For another example, the data writing-in circuit 7 in FIGS. 3-26, the writing-in sub-circuit in FIGS. 27-45, the data writing-in circuit 41 in FIGS. 46-60, the data writing-in circuit 43 in FIGS. 60-78 all have the same function; for another example, the control circuit 5 in FIGS. 3-26, the first light emitting control sub-circuit and the second light emitting control sub-circuit in FIGS. 27-45, the light emitting control circuit 31 in FIGS. 46-60, the light emitting control circuits 44 in FIGS. 61-78 all have the same function; for another example, the coupling circuit 6 in FIGS. 3-26, the first capacitor C1 in FIGS. 27-45, the energy storage circuit 42 in FIGS. 46-60, and the energy storage circuit 41 in FIGS. 61-78 all have the same function; for another example, the driving transistor T3 in FIGS. 3-26, the driving transistor T3 in FIGS. 27-45, the driving transistor T0 in FIGS. 61-78 all have the same function. The above-mentioned functional modules/electrical devices with the same function can be replaced with each other to form a new embodiment, wherein, the replacement of the functional modules/electrical devices may include the replacement of the structure of the functional modules/electrical devices, and the replacement of the voltage state of the signal terminals of the functional modules/electrical devices.

Other embodiments of the present disclosure will readily suggest themselves to those skilled in the art upon consideration of the specification and practice of the present disclosure. The present disclosure is intended to cover any variations, uses, or adaptations of the present disclosure that follow the general principles of the present disclosure and include common knowledge or techniques in the technical field not disclosed by the present disclosure. The specification and examples are to be regarded as exemplary only, the scope and spirit of the present disclosure are indicated by the claims.

It is to be understood that the present disclosure is not limited to the precise structures described above and illustrated in the accompanying drawings, and various modifications and changes may be made without departing from the scope of the present disclosure. The scope of the present disclosure is limited only by the appended claims.

What is claimed is:

1. A pixel circuit, comprising a driving circuit, a first initialization circuit and a reset circuit, wherein the first initialization circuit is respectively electrically connected to an initialization control line, a first end of the driving circuit and a first initial voltage terminal, and is configured to write a first initial voltage provided by the first initial voltage terminal into the first end of the driving circuit under the control of an initialization control signal provided by the initialization control line;

the reset circuit is electrically connected to a second scan line and a reset voltage terminal respectively, and the reset circuit is also electrically connected to a second end of the driving circuit or the first end of the driving circuit, and is configured to write a reset voltage provided by the reset voltage terminal into the second end of the driving circuit or the first end of the driving circuit under the control of a second scan signal provided by the second scan line;

the driving circuit is configured to control a driving current to be transmitted to an anode of a light emitting diode under the control of a potential of a control end of the driving circuit;

wherein the pixel circuit further comprises a second initialization circuit connected to the anode of the light emitting diode, the reset circuit comprises a third transistor, and the second initialization circuit comprises a seventh transistor;

a width-to-length ratio of the third transistor is greater than or equal to a width-to-length ratio of the seventh transistor;

wherein the reset voltage is a low potential constant voltage, and a voltage value of the reset voltage is greater than or equal to −6V and less than or equal to −2V.

2. The pixel circuit according to claim 1, wherein the first initial voltage is a low potential constant voltage, and the voltage value of the first initial voltage is greater than or equal to −6V and less than or equal to −2V.

3. The pixel circuit according to claim 1, wherein an absolute value of a difference between the voltage value of the reset voltage and a voltage value of the first initial voltage is less than a predetermined voltage difference value.

4. The pixel circuit according to claim 1, wherein the reset voltage is a high potential constant voltage, and the voltage value of the reset voltage is greater than or equal to 4V and less than or equal to 10V.

5. The pixel circuit according to claim 1, wherein the driving circuit comprises a driving transistor, and an absolute value of a voltage value of the reset voltage is greater than 1.5 times of an absolute value of a threshold voltage, the threshold voltage is the threshold voltage of the driving transistor.

6. The pixel circuit according to claim 1, wherein the first initialization circuit comprises a second transistor;

a control electrode of the second transistor is electrically connected to the initialization control line, a first electrode of the second transistor is electrically connected to the first initial voltage terminal, and a second electrode of the second transistor is electrically connected to the first end of the driving circuit.

7. The pixel circuit according to claim 6, further comprising a data writing-in circuit, wherein the data writing-in circuit includes a fourth transistor, a width-to-length ratio of the fourth transistor is smaller than or equal to a width-to-length ratio of the second transistor.

8. The pixel circuit according to claim 1, wherein a control electrode of the third transistor is electrically connected to the second scan line, a first electrode of the third transistor is electrically connected to the reset voltage terminal, and a second electrode of the third transistor is electrically connected to the second end of the driving circuit or the first end of the driving circuit.

9. The pixel circuit according to claim 1, further comprising a compensation control circuit; wherein the compensation control circuit is respectively electrically connected to the first scan line, the control end of the driving circuit and the first end of the driving circuit, and is configured to connect the control end of the driving circuit and the first end of the driving circuit under the control of the first scan signal provided by the first scan line.

10. The pixel circuit according to claim 9, wherein the compensation control circuit comprises a first transistor;

a control electrode of the first transistor is electrically connected to the first scan line, a first electrode of the first transistor is electrically connected to the control end of the driving circuit, and a second electrode of the first transistor is electrically connected to the first end of the driving circuit;

the first transistor is an oxide thin film transistor.

11. The pixel circuit according to claim 10, further comprising a data writing-in circuit, wherein the data writing-in circuit includes a fourth transistor, a width-to-length ratio of the fourth transistor is smaller than or equal to a width-to-length ratio of the first transistor.

12. The pixel circuit according to claim 1, further comprising a light emitting element, an energy storage circuit, a data writing-in circuit, and a light emitting control circuit, wherein the energy storage circuit is electrically connected to the control end of the driving circuit and configured to store electrical energy;

the second initialization circuit is respectively electrically connected to a third scan line, a second initial voltage terminal and a first electrode of the light emitting element, and is configured to write a second initial voltage provided by the second initial voltage terminal into the first electrode of the light emitting element under the control of a third scan signal provided by the third scan line;

the data writing-in circuit is electrically connected to a fourth scan line, a data line and the second end of the driving circuit, respectively, and is configured to write a data voltage provided by the data line into the second end of the driving circuit under the control of a fourth scan signal provided by the fourth scan line;

the light emitting control circuit is respectively electrically connected to a light emitting control line, the first voltage terminal, the second end of the driving circuit, the first end of the driving circuit and the first electrode of the light emitting element, and is configured to, under the control of a light emitting control signal provided by the light emitting control line, connect the first voltage terminal and the second end of the driving circuit, and connect the first end of the driving circuit and the first electrode of the light emitting element;

a second electrode of the light emitting element is electrically connected to the second voltage terminal.

13. The pixel circuit according to claim 12, wherein the second initial voltage is a low potential constant voltage, and a voltage value of the second initial voltage is greater than or equal to −6V and less than or equal to −2V.

14. The pixel circuit according to claim 12, wherein, the data writing-in circuit includes a fourth transistor;

a control electrode of the fourth transistor is electrically connected to a fourth scan line, a first electrode of the fourth transistor is electrically connected to the data line, and a second electrode of the fourth transistor is electrically connected to the second end of the driving circuit;

the light emitting control circuit includes a fifth transistor and a sixth transistor;

a control electrode of the fifth transistor is electrically connected to the light emitting control line, a first electrode of the fifth transistor is electrically connected to the first voltage terminal, and a second electrode of the fifth transistor is electrically connected to the second end of the driving circuit;

a control electrode of the sixth transistor is electrically connected to the light emitting control line, a first electrode of the sixth transistor is electrically connected to the first end of the driving circuit, and a second electrode of the sixth transistor is electrically connected to the first electrode of the light emitting element;

the second initialization circuit includes a seventh transistor;

a control electrode of the seventh transistor is electrically connected to the third scan line, a first electrode of the seventh transistor is electrically connected to the second initial voltage terminal, and a second electrode of the seventh transistor is electrically connected to the first electrode of the light emitting element;

the driving circuit includes a driving transistor; a control electrode of the driving transistor is electrically connected to the control end of the driving circuit, a first electrode of the driving transistor is electrically connected to the first end of the driving circuit, and a second electrode of the driving transistor is electrically connected to the second end of the driving circuit;

the energy storage circuit includes a storage capacitor; a first end of the storage capacitor is electrically connected to the control end of the driving circuit, and a second end of the storage capacitor is connected to the first voltage terminal.

15. The pixel circuit according to claim 14, a channel width of the fourth transistor is 1.5 um-3.5 um, a channel length of the fourth transistor is 2.0 um-4.5 um.

16. A driving method, applied to a pixel circuit, wherein a display period includes an initialization phase and a reset phase; the pixel circuit comprises a driving circuit, a first initialization circuit and a reset circuit, wherein the first initialization circuit is respectively electrically connected to an initialization control line, a first end of the driving circuit and a first initial voltage terminal;

the reset circuit is electrically connected to a second scan line and a reset voltage terminal respectively, and the reset circuit is also electrically connected to a second end of the driving circuit or the first end of the driving circuit;

the driving circuit is configured to control a driving current to be transmitted to an anode of a light emitting diode under the control of a potential of a control end of the driving circuit;

wherein the pixel circuit further comprises a second initialization circuit connected to the anode of the light emitting diode, the reset circuit comprises a third transistor, and the second initialization circuit comprises a seventh transistor;

a width-to-length ratio of the third transistor is greater than or equal to a width-to-length ratio of the seventh transistor;

wherein the reset voltage is a low potential constant voltage, and a voltage value of the reset voltage is greater than or equal to −6V and less than or equal to −2V;

the driving method comprises:

in the initialization phase, writing, by the first initialization circuit, the first initial voltage to the first end of the driving circuit under the control of the initialization control signal;

in the reset phase, writing, by the reset circuit, the reset voltage to the second end of the driving circuit or the first end of the driving circuit under the control of the second scan signal.

17. The driving method according to claim 16, wherein, in the reset phase, when the reset circuit writes the reset voltage into the second end of the driving circuit under the control of the second scan signal, the reset voltage is a high potential constant voltage, the first initial voltage is a low potential constant voltage, and the initialization phase and the reset phase are different phases; or, the reset voltage and the first initial voltage are the low potential constant voltage, and the initialization phase and the reset phase are a same phase or different phases.

18. The driving method according to claim 16, wherein, in the reset phase, when the reset circuit writes the reset voltage into the first end of the driving circuit under the control of the second scan signal, the reset phase and the initialization phase are different phases.

19. A display device comprising a pixel circuit, wherein the pixel circuit comprises a driving circuit, a first initialization circuit and a reset circuit, wherein the first initialization circuit is respectively electrically connected to an initialization control line, a first end of the driving circuit and a first initial voltage terminal, and is configured to write a first initial voltage provided by the first initial voltage terminal into the first end of the driving circuit under the control of an initialization control signal provided by the initialization control line;

the reset circuit is electrically connected to a second scan line and a reset voltage terminal respectively, and the reset circuit is also electrically connected to a second end of the driving circuit or the first end of the driving circuit, and is configured to write a reset voltage provided by the reset voltage terminal into the second end of the driving circuit or the first end of the driving circuit under the control of a second scan signal provided by the second scan line;

the driving circuit is configured to control a driving current to be transmitted to an anode of a light emitting diode under the control of a potential of a control end of the driving circuit;

wherein the pixel circuit further comprises a second initialization circuit connected to the anode of the light emitting diode, the reset circuit comprises a third transistor, and the second initialization circuit comprises a seventh transistor;

a width-to-length ratio of the third transistor is greater than or equal to a width-to-length ratio of the seventh transistor;

wherein the reset voltage is a low potential constant voltage, and a voltage value of the reset voltage is greater than or equal to −6V and less than or equal to −2V.

* * * * *